(12) United States Patent
Liaw

(10) Patent No.: US 12,707,683 B2
(45) Date of Patent: Aug. 11, 2026

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 816 days.

(21) Appl. No.: 17/880,025

(22) Filed: Aug. 3, 2022

(65) Prior Publication Data

US 2024/0047522 A1 Feb. 8, 2024

(51) Int. Cl.

| | |
|---|---|
| ***H10D 62/10*** | (2025.01) |
| ***H10D 64/01*** | (2025.01) |
| ***H10D 84/01*** | (2026.01) |
| ***H10D 84/03*** | (2025.01) |

(Continued)

(52) U.S. Cl.

CPC ......... *H10D 62/116* (2025.01); *H10D 64/017* (2025.01); *H10D 84/0149* (2025.01); *H10D 84/0151* (2025.01); *H10D 84/038* (2025.01); *H10D 84/85* (2025.01);

(Continued)

(58) Field of Classification Search

CPC ............... H10D 62/116; H10D 64/017; H10D 84/0149; H10D 84/0151; H10D 84/038; H10D 84/907; H10D 84/931; H10D 84/966; H10D 30/014; H10D 30/43; H10D 30/6735; H10D 30/6757; H10D 62/121; H10D 89/10; H10D 84/017; H10D 84/0186; H10D 84/0188; H10D 84/8311; H10D 84/8312; H10D 84/83135; H10D 84/83138; H10D 84/8314; H10D 84/8316; H10D 84/02; H10D 84/032; H10D 84/035; H10D 84/05; H10D 84/07; H10D 84/08; H10D 84/0153; H10D 30/0273; H10D 84/01; H10D 84/851–852; H10D 84/0165–0179; H10D 84/85–859

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Chad M Dicke
*Assistant Examiner* — Gary Abel
(74) *Attorney, Agent, or Firm* — Cooper Legal Group, LLC

(57) ABSTRACT

A method includes doping a substrate to form a first well region and a second well region having a different conductivity type than the first well region; forming a first fin structure upwardly extending above the first well region and a second fin structure upwardly extending above the second well region; forming a first gate electrode surrounding the first fin structure and a second gate electrode surrounding the second fin structure; forming first source/drain regions adjoining the first fin structure and on opposite sides of the first gate electrode and second source/drain regions adjoining the second fin structure on opposite sides of the second gate electrode; forming an isolation line interposing the first and second gate electrodes and laterally between a first one of the first source/drain regions and a first one of the second source/drain regions.

20 Claims, 48 Drawing Sheets

(51) Int. Cl.
*H10D 84/85* (2025.01)
*H10D 84/90* (2025.01)

(52) U.S. Cl.
CPC ......... *H10D 84/907* (2025.01); *H10D 84/931* (2025.01); *H10D 84/966* (2025.01)

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,478,542 | B1 * | 10/2016 | Ito | H10D 30/62 |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,613,953 | B2 | 4/2017 | Liaw | |
| 9,793,273 | B2 | 10/2017 | Liaw | |
| 9,805,985 | B2 | 10/2017 | Liaw | |
| 9,899,267 | B1 * | 2/2018 | Liou | H10D 84/038 |
| 9,911,738 | B1 * | 3/2018 | Niimi | H10D 30/025 |
| 9,991,268 | B1 | 6/2018 | Liaw | |
| 10,090,325 | B1 | 10/2018 | Liaw | |
| 10,522,546 | B2 | 12/2019 | Liaw | |
| 11,004,974 | B1 * | 5/2021 | Takimoto | H10D 30/60 |
| 2011/0133822 | A1 * | 6/2011 | Mazure | H10D 86/201<br>257/365 |
| 2017/0140812 | A1 * | 5/2017 | Yamamoto | G11C 11/412 |
| 2018/0033626 | A1 * | 2/2018 | Liao | H01L 21/76224 |
| 2019/0198491 | A1 * | 6/2019 | Do | G11C 5/063 |
| 2019/0363085 | A1 * | 11/2019 | Oh | H10D 64/017 |
| 2020/0111920 | A1 * | 4/2020 | Sills | H10D 30/6728 |
| 2020/0161439 | A1 * | 5/2020 | You | H10D 30/024 |
| 2020/0365691 | A1 * | 11/2020 | Liaw | H10B 10/12 |
| 2020/0373395 | A1 * | 11/2020 | Ho | H01L 21/765 |

* cited by examiner

C5-C5'

SEMICONDUCTOR STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
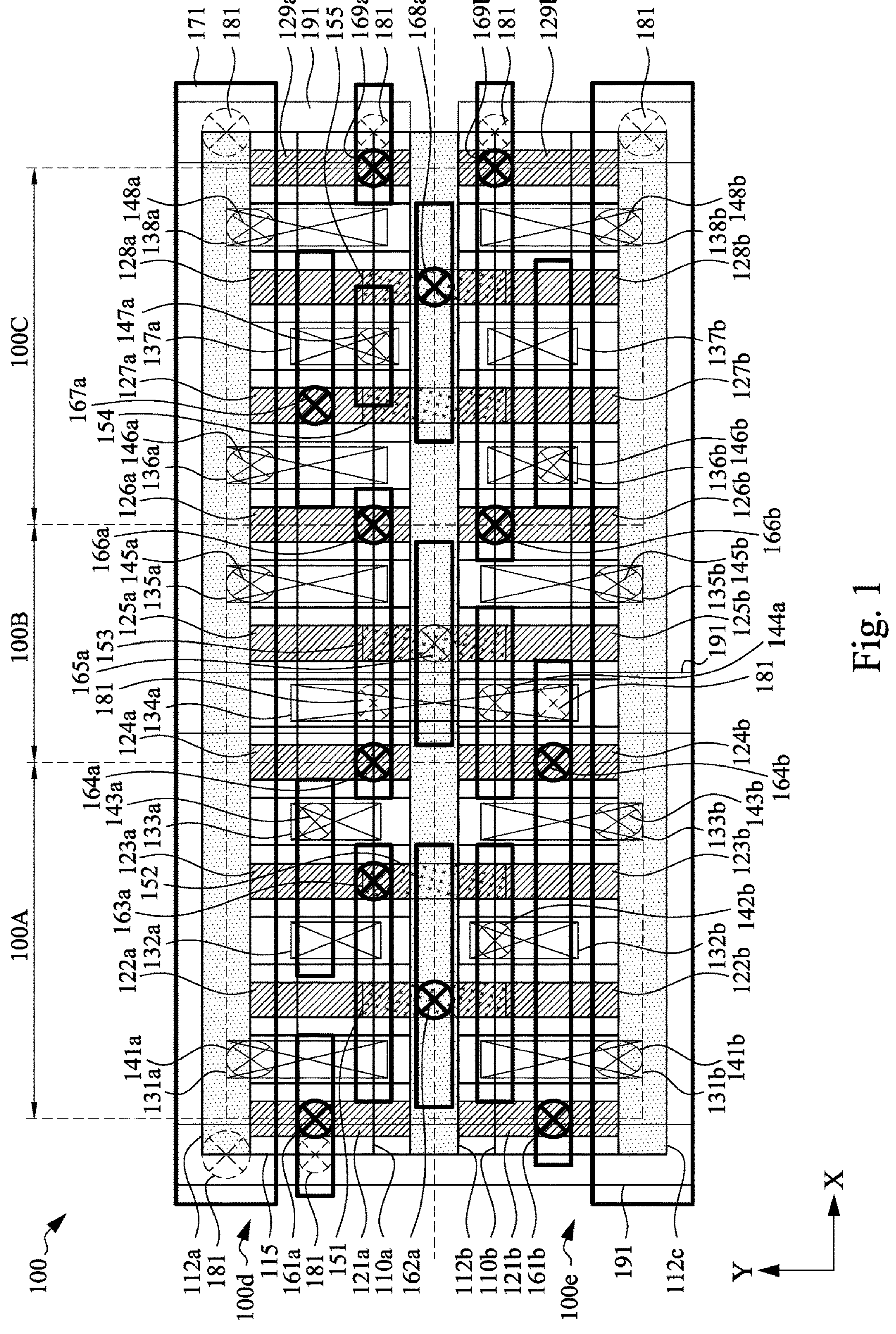
FIGS. 1, 2A, 3A, 4A, and 5A illustrate cell array layout diagrams of logic circuits of semiconductor structures, respectively, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, fork-sheets, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. In some approaches, gate electrodes corresponding to the gate terminals which are coupled together are directly formed by a one-piece gate electrode. For example, in these approaches, the gate electrodes may be formed with one gate strip. However, under this condition, non-regular patterns, such that the uniformity and/or the matching of the gate electrodes on an integrated circuit are reduced to lower the performance of the integrated circuit.

Therefore, the present disclosure in various embodiments provides a layout with all the gate electrodes are spaced apart by an isolation line. In some embodiments, the isolation line is able to be formed based on a layout pattern having a rectangle shape. Accordingly, the non-regular patterns are able to be omitted. As a result, the uniformity and/or the matching of the gate electrodes are improved.

Reference is made to FIG. 1. FIG. 1 illustrates a cell array layout diagram of a logic circuit 100 of a semiconductor structure, respectively, according to some embodiments of the present disclosure. As shown in FIG. 1, a first logic cell 100A, a second logic cell 100B, and a third logic cell 100C in the logic circuit 100 are arranged in the same row. The second logic cell 100B is arranged between the second and third logic cells 100A and 100C. The outer boundary of each of the first, second, and third logic cells 100A, 100B, and 100C is illustrated using dashed lines. By way of example but not limiting the present disclosure, the first logic cell 100A may be an NAND, the second logic cell 100B may be an inverter, and the third logic cell 100C may be an NOR. In some embodiments, the first, second, and third logic cells 100A, 100B, and 100C may have the same cell height. In some embodiments, the cell width of the first logic cell 100A may be wider than the cell width of the second logic cell 100B. In some embodiments, the cell width of the third logic cell 100C may be wider than the cell width of the second logic cell 100B. In FIG. 1, it should be noted that the configuration of the first, second, and third logic cells 100A, 100B, and 100C in the logic circuit 100 is used as an illustration, and not to limit the disclosure. In some embodiments, the row in the cell array of the logic circuit 100 may include more logic cells or fewer logic cells than the layout shown in FIG. 1. In some embodiments, the cell array of the logic circuit 100 may include more rows or fewer rows and more columns or fewer columns than the layout shown in FIG. 1. Each logic cell provides a circuit or portion thereof, exemplary functionality provided by the cells includes, but are not limited to NAND, NOR, AND, OR, XOR, XNOR, SCAN, inverter, Flip-Flop, latch, and/or other suitable logic or storage functions.

In some embodiments, the logic circuit 100 may include transistors in a first conductivity type device region **100*d* and transistors in a second conductivity type device region 100*e*. The first and second conductivity type device regions 100*d* and 100*e* may be formed on a substrate (not shown) and are spaced apart. In some embodiments, the first and second conductivity type device regions 100*d* and 100*e* may be different conductivity type regions. By way of example but not limiting the present disclosure, the first conductivity type device region 100*d* may be an N-type well region, and the second conductivity type device region 100*e* may be a P-type well region. The first and second conductivity type device regions 100*d* and 100*e* are disposed in the Y-direction and elongated the in X-direction, in order to form the first-type transistors and the second-type transistors, respectively. In some embodiments, the transistors in the first conductivity type device region 100*d* may be NMOS transistors with silicon channel regions, and the transistor in the second conductivity type device region 100*e* may be PMOS transistors with silicon channel regions. In some embodiments, the transistors may be GAA FETs. The silicon channel regions of the NMOS and PMOS transistors are formed by semiconductor sheets 110*a* and 110*b*. The semiconductor sheets 110*a* and 110*b* each are stacked along the Z-direction (not shown) and are wrapped by the gate electrode, and the Z-direction is perpendicular to the plane formed by the X-direction and Y-direction. The semiconductor sheets 110*a* are formed on the first conductivity type device region 100*d* and elongated in X-direction. The semiconductor sheets 110*b* are formed on the second conductivity type device region 100*e* and elongated in X-direction. In some embodiments, the semiconductor sheets 110*a* and 110*b* are arranged to operate as S/D regions of the first and second-type transistors. For illustration, portions of the semiconductor sheets 110*a* extend from the gate electrode 121*a* to the gate electrode 122*a* are arranged as an S/D region of the first-type transistor. Portions of the semiconductor sheets 110*a* extend from the gate electrode 122*a* to the gate electrode 123*a* are arranged as an S/D region of the second-type transistor. With the same analogy, the arrangements of portions of the semiconductor sheets 110*a* and 110*b*, which correspond to the SID terminals of the first-type and second-type transistors can be understood with reference to FIG. 1**.

Isolation lines **112*a*, 112*b*, and 112*c* are respectively continuously extend across the first, second, and third logic cells 100A, 100B, and 100C along the Y-direction. The isolation lines 112*a* and 112*c* are located on boundaries of the logic circuit 100, respectively. The semiconductor sheets 110*a* are between the isolation lines 112*a* and 112*b*, and the semiconductor sheets 110*b* are between the isolation lines 112*b* and 112*c*. The first and second conductivity type device regions 100*d* and 100*e* are spaced apart from each other by the isolation line 112*b*. Each of the isolation lines 112*a*, 112*b*, and 112*c* is a gate-cut structure for the gate structure corresponding to the gate electrodes 121*a* through 129*b*, and the gate-cut structure is formed by a cut metal gate (CMG) process. In some embodiments, the isolation lines 112*a***, 112*b*, and 112*c* can be interchangeably referred to dielectric line, gate end dielectrics, isolation structure or isolation strip, dielectric strip, or dielectric regions in the logic circuit 100.

Specifically, the opposite ends the gate electrodes 121*a* through 129*b* are removed to form gate trenches with the gate spacers 115 as their sidewalls. The ends of the gate electrodes 121*a* through 129*b* may be removed by dry etching, wet etching, or a combination of dry and wet etching. For example, a wet etching process may include exposure to a hydroxide containing solution (e.g., ammonium hydroxide), deionized water, and/or other suitable etchant solutions. Subsequently, a dielectric material is deposited into the gate trenches, followed by a planarization process to remove excess portions of the dielectric material. The remaining dielectric material forms the isolation lines 112*a*, 112*b*, and 112*c*.

In some embodiments, the deposition of the dielectric material of the isolation lines 112*a*, 112*b*, and 112*c* is performed using a conformal deposition process such as ALD, which may be PEALD, thermal ALD, or the like. The dielectric material may be formed of or comprise $SiO_2$, SiOC, SiOCN, or the like, or combinations thereof. In some embodiments, the isolation lines 112*a*, 112*b*, and 112*c* may be made of a nitride-based material, such as $Si_3N_4$, or a carbon-based material, such as SiOCN, or combinations thereof. In some embodiments, the isolation lines 111*a*, 112*b*, and 112*c* may be made of a metal oxide material. In some embodiments, the isolation lines 112*a*, 112*b*, and 112*c* may be made of a material having a dielectric constant greater than about 9 (e.g., high dielectric constant (high-k) material). For example, the isolation lines 112*a*, 112*b*, and 112*c* may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The isolation lines 112*a*, 112*b*, and 112*c* may be formed of a homogenous material, or may have a composite structure including more than one layer. The isolation lines 112*a*, 112*b*, and 112*c* may include dielectric liners, which may be formed of; for example, silicon oxide. In some embodiments, the dielectric material of the isolation lines 112*a*, 112*b*, and 112*c* comprises SiN, and the deposition is performed using process gases including dichlorosilane and ammonia. Hydrogen ($H_2$) may or may not be added.

As shown in FIG. 1, the first logic cell 100A includes gate electrodes 121*a*, 122*a*, 123*a*, 124*a*, 121*b*, 122*b*, 123*b*, and 124*b* extending in the Y-direction. The second logic cell 100B includes the gate electrodes 124*a*, 125*a*, 126*a*, 124*b*, 125*b*, 126*b* extending in the Y-direction. The third logic cell 100C includes the gate electrodes 126*a*, 127*a*, 128*a*, 129*a*, 126*b*, 127*b*, 128*b*, and 129*b* extending in the Y-direction. The gate electrodes 121*a*, 122*a*, 123*a*, 124*a*, 125*a*, 126*a*, 127*a*, 128*a*, and 129*a* are formed on the first conductivity type device region 100*d* and formed to wrap around the semiconductor sheets 110*a*. The gate electrodes 121*b*, 122*b*, 123*b*, 124*b*, 125*b*, 126*b*, 127*b*, 128*b*, and 129*b* are formed on the second conductivity type device region 100*d* and formed to wrap around the semiconductor sheets 110*b*. In some embodiments, the gate electrodes 121*a* through 129*b* can be interchangeably referred to as gate conductors. The gate spacers 115 are formed on sidewalls of the gate electrodes 121*a* through 129*b*.

In some embodiments, the gate electrodes 121*a*, 122*a*, 123*a*, 124*a*, 125*a*, 126*a*, 127*a*, 128*a*, and 129*a* are disposed with respect to the gate electrodes 121*b*, 122*b*, 123*b*, 124*b*, 125*b*, 126*b*, 127*b*, 128*b*, and 129*b*, respectively. In some embodiments, the gate electrodes 121*a*, 122*a*, 123*a*, 124*a*, 125*a*, 126*a*, 127*a*, 128*a*, and 129*a* and/or the gate electrodes 121*b*, 122*b*, 123*b*, 124*b*, 125*b*, 126*b*, 127*b*, 128*b*, and 129*b* are spaced apart. By way of example but not limiting the present disclosure, the gate electrode 122*a* is disposed with respect to the gate electrode 122*b*, such that the gate electrodes 122*a* and 122*b* are aligned with each other. Accordingly, the gate electrodes 122*a* and 122*b* are able to be formed with the same mask. Moreover, a predetermined distance is present between the gate electrodes 122*a* and 122*b*. The gate electrodes 122*a* and 122*b* are physically separated from each other. In some embodiments, the predetermined distance is formed according to a mask corresponding to a "gate cut layer," such as the isolation line 112*b*. By way of example but not limiting the present disclosure, the gate electrode 122*a* is spaced apart from the gate electrode 122*b* by a distance in a range from about 5 nm to about 20 nm. In other words, the isolation line 112*b* may have a width in a range from about 5 nm to about 20 nm. In some embodiments, the arrangements between the gate electrodes 122*a* and 122*b*, as discussed above, are also applied to the gates electrodes 121*a*, 123*a*, 124*a*, 125*a*, 126*a*, 127*a*, 128*a*, and 129*a* and the gates electrodes 121*b*, 123*b*, 124*b*, 125*b*, 126*b*, 127*b*, 128*b*, and 129*b*. In some embodiments, the gates electrodes 121*a* through 129*a* each may have a gate length in a range from about 4 nm to about 25 nm, such as 4, 5, 10, 15, 20, or 25 nm, along the Y direction from the top view.

In some embodiments, each of the first, second, and third logic cells 100A, 100B, and 100C may include at least one isolation transistor, and the at least one isolation transistor is arranged at an adjacent circuit cell. Taking the logic cell 100A as an example, the gate electrodes 121*a* and 124*a* and 121*b* and 124*b* are located in the cell boundary. The gate electrodes 121*a* and 121*b* are disposed with respect to each other, and the gate electrodes 124*a* and 124*b* are disposed with respect to each other. The gate electrodes 121*a* and 124*a* are formed on the first conductivity type device region 100*d* and intersect the semiconductor sheets 110*a*. The gate electrodes 121*a* and 124*a* and the adjacent portions of the semiconductor sheets 110*a* are arranged as first-type isolation transistors, such as N-type isolation transistors. The gate electrodes 121*b* and 124*b* are formed on the N-type well region 201 and intersect the semiconductor sheets 110*b*. The gate electrodes 121*b* and 124*b* and the adjacent portions of the semiconductor sheets 110*b* are arranged as second-type isolation transistors, such as P-type isolation transistors. With the same analogy, the arrangements of the rest gate electrodes 126*a* and 129*a* and 126*b* and 129*b* and the corresponding isolation transistors can be understood with reference to FIG. 1.

As illustratively shown in FIG. 1, the isolation transistors corresponding to the gate electrodes 124*a* and 124*b* are included by the first and second logic cells 100A and 100B. The isolation transistors corresponding to the gate electrodes 126*a* and 126*b* are included by the second and third logic cells 100B and 100C. In some embodiments, the isolation transistors are arranged to electrically isolate two corresponding circuit cells from each other. For illustration, the isolation transistors corresponding to the gate electrodes 126*a* and 126*b* are disposed between the first and second logic cells 100A and 100B, in order to separate and isolated the first and second logic cells 100A and 100B from each other. In some embodiments, in order to provide better isolation, the gate electrodes 121*a*, 124*a*, 126*a*, and 129*a* are configured to receive the first predetermined voltage V1

(e.g., VDD), and the gate electrodes 121*b*, 124*b*, 126*b*, and 129*b* are configured to receive the second predetermined voltage V2 (e.g., VSS or ground voltage).

In some embodiments, the gate electrodes 121*a* and 121*b* may be collectively referred to as a first gate strip, the gate electrodes 122*a* and 122*b* may be collectively referred to as a second gate strip, the gate electrodes 123*a* and 123*b* may be collectively referred to as a third gate strip, the gate electrodes 124*a* and 124*b* may be collectively referred to as a fourth gate strip, the gate electrodes 125*a* and 125*b* may be collectively referred to as a fifth gate strip, the gate electrodes 126*a* and 126*b* may be collectively referred to as a sixth gate strip, the gate electrodes 127*a* and 127*b* may be collectively referred to as a seventh gate strip, the gate electrodes 128*a* and 128*b* may be collectively referred to as a eighth gate strip, and the gate electrodes 129*a* and 129*b* may be collectively referred to as a ninth gate strip. In some embodiments, the isolation line 112*b* interposes the gate electrodes 121*a* and 121*b*, interposes the gate electrodes 122*a* and 122*b*, interposes the gate electrodes 123*a* and 123*b*, interposes the gate electrodes 124*a* and 124*b*, interposes the gate electrodes 125*a* and 125*b*, interposes the gate electrodes 126*a* and 126*b*, interposes the gate electrodes 127*a* and 127*b*, interposes the gate electrodes 128*a* and 128*b*, and interposes the gate electrodes 129*a* and 129*b*. In some embodiments, the isolation line 112*b* continuously extends across the first, second, third, fourth, fifth, sixth, seventh, eighth, ninth gate strips. In some embodiments, the isolation line 112*b* is in contact with longitudinal ends of the gate spacers 115.

In some embodiments, each of the isolation lines 112*a*, 112*b*, and 112*c* may have a rectangle profile extending along the X direction from the top view. The formation of the isolation lines 112*a*, 112*b*, and 112*c* can result in a narrow gate end space which in turn improves the gate CD uniformity. In addition, the regular and uniform long gate cutting layer (e.g. the isolation lines 112*a*, 112*b*, or 112*c*) can help on the gate patterning and provide better uniformity on both gate CD and gate end space, such that the strain effect on the integral circuit can be reduced achieve a higher circuit density as well as PMOSFET LOD effect mitigation.

As shown in FIG. 1, the gate electrodes 121*a* and 121*b* in the first logic cell 100A are connected to an overlying level (e.g., conductive lines 171) through gate vias 161*a* and 161*b*, respectively. The gate electrodes 122*a* and 122*b* in the first logic cell 100A are connected to an overlying level (e.g., conductive lines 171) through a gate contact 151 and a gate via 162*a*. The gate electrodes 123*a* and 123*b* in the first logic cell 100A are connected to an overlying level (e.g., conductive lines 171) through a gate contact 152 and a gate via 163*a*. The gate electrodes 124*a* and 124*b* in the first logic cell 100A are connected to an overlying level (e.g., conductive lines 171) through gate vias 164*a* and 164*b*, respectively. The gate electrodes 125*a* and 125*b* in the second logic cell 100B are connected to an overlying level (e.g., conductive lines 171) through a gate contact 153 and a gate via 165*a*. The gate electrodes 126*a* and 126*b* in the third logic cell 100C are connected to an overlying level (e.g., conductive lines 171) through gate via 167*a*. The gate electrodes 127*a* and 127*b* in the third logic cell 100C are connected to an overlying level (e.g., conductive lines 171) through a gate contact 154 and a gate via 167*a*, in which the gate contact 154 non-overlaps with the gate via 167*a*. The gate electrodes 128*a* and 128*b* in the third logic cell 100C are connected to an overlying level (e.g., conductive lines 171) through a gate contact 155 and a gate via 168*a*, in which the gate contact 155 overlaps with the gate via 168*a*. The gate electrodes 129*a* and 129*b* in the third logic cell 100C are connected to an overlying level (e.g., conductive lines 171) through gate vias 169*a* and 169*b*, respectively.

In some embodiments, the gate electrodes 122*a*, 123*a*, 125*a*, 127*a*, 128*a*, 122*b*, 123*b*, 125*b*, 127*b*, 128*b* are coupled to each other by a corresponding gate contact. For illustration, the gate electrode 122*a* corresponds to a gate terminal of the first-type transistor, and the gate electrode 122*b* corresponds to another gate terminal of the second-type transistor 1, in which the gate terminals correspond to the input terminal of the first logic cell 100A. Thus, the gate contact 151 is formed on the gate electrodes 122*a* and 122*b*, in order to couple the gate electrodes 122*a* and 122*b* with each other. With the same analogy, the corresponding arrangements of the gate electrodes 123*a*, 125*a*, 127*a*, 128*a*, 123*b*, 125*b*, 127*b*, 128*b* can be understood with reference to FIG. 1.

In some embodiments, each of the gate contacts 151, 152, 153, 154, and 155 has a rectangle shape. In some embodiments, a ratio of the length to the width of each of the gate contacts 151, 152, 153, 154, and 155 is equal to or more than about two. In some embodiments, the gate contacts 151, 152, 153, 154, and 155 are formed by filling a conductive material in openings at corresponding locations of the corresponding gate electrodes 122*a*, 123*a*, 125*a*, 127*a*, 128*a*, 122*b*, 123*b*, 125*b*, 127*b*, 128*b*. In some embodiments, the conductive material includes tungsten, aluminum, copper, or other suitable materials. The formation of the gate contacts 151, 152, 153, 154, and 155 and the conductive material are given for illustrative purposes only. Various processes and materials to form the gate contacts 151, 152, 153, 154, and 155 are within the contemplated scope of the present disclosure. In some embodiments, the gate contacts 151, 152, 153, 154, and 155 can be interchangeably referred to as local connection lines electrically connected both n-type gate electrode and p-type gate electrode together.

In some approaches, gate electrodes corresponding to the gate terminals which are coupled together are directly formed by a one-piece gate electrode. For example, in these approaches, the gate electrodes 122*a* and 122*b* may be formed with one gate electrode. Under this condition, non-regular patterns, which include, for example, the space between the gate electrodes 121*a* and 121*b* would be present. Accordingly, the uniformity and/or the matching of the gate electrodes are reduced. As a result, the performance of the circuit cells is reduced. Compared with the approaches discussed above, in some embodiments, all of the gate electrodes are spaced apart by an area, such as the isolation line 112*b*. In some embodiments, the isolation line 112*b* is able to be formed based on a layout pattern having a rectangle shape. Accordingly, the non-regular patterns are able to be omitted. As a result, the uniformity and/or the matching of the gate electrodes are improved. In some embodiments, the gate contacts 151, 152, 153, 154, and 155 respectively extend across the isolation line 112*b*. The gate via 162*a* on the gate contact 151 overlaps the isolation line 112*b*, the gate via 165*a* on the gate contact 153 overlaps the isolation line 112*b*, and the gate via 168*a* on the gate contact 155 overlaps the isolation line 112*b*. In some embodiments, gate vias 161*a*, 161*b*, 163*a*, 164*a*, 164*b*, 166*a*, 166*b*, 167*a*, 169*a*, and 169*b* non-overlap the isolation lines 112*a*, 112*b*, and 112*c*.

A source/drain region between the gate electrodes 121*a* and 122*a* in the first logic cell 100A is coupled to an overlying level (e.g., conductive line 171) through a source/drain contact 131*a* and a source/drain via 141*a*. A source/drain region between the gate electrodes 121*b* and 122*b* in the first logic cell 100A is coupled to an overlying level (e.g., conductive line 171) through a source/drain contact 131*b* and a source/drain via 141*b*. A source/drain region between the gate electrodes 122*b* and 123*b* in the first logic cell 100A is coupled to an overlying level (e.g., conductive line 171) through a source/drain contact 132*b* and a source/drain via 142*b*. A source/drain region between the gate electrodes 123*a* and 124*a* in the first logic cell 100A is coupled to an overlying level (e.g., conductive line 171) through a source/drain contact 133*a* and a source/drain via 143*a*. A source/drain region between the gate electrodes 123*b* and 124*b* in the first logic cell 100A is coupled to an overlying level (e.g., conductive line 171) through a source/drain contact 133*b* and a source/drain via 143*b*.

A source/drain region between the gate electrodes 124*a* and 125*a* in the second logic cell 100B is coupled to an overlying level (e.g., conductive line 171) through a share source/drain contact 134*a* and a share source/drain via 144*a* and extends to a location between the gate electrodes 124*b* and 125*b*. A source/drain region between the gate electrodes 125*a* and 126*a* in the second logic cell 100B is coupled to an overlying level (e.g., conductive line 171) through a source/drain contact 135*a* and a source/drain via 145*a*. A source/drain region between the gate electrodes 125*b* and 126*b* in the second logic cell 100B is coupled to an overlying level (e.g., conductive line 171) through a source/drain contact 135*b* and a source/drain via 145*b*. In some embodiments, the source contact 134*a* extends across the isolation line 112*b*. In some embodiments, the source contacts 131*a*, 135*a*, 136*a*, and 138*a* and the source vias 141*a*, 145*a*, 146*a*, and 148*a* overlap the isolation line 112*a*. In some embodiments, the source contacts 131*b*, 133*b*, 135*b*, and 138*b* and the source vias 141*b*, 143*b*, 145*b*, and 148*b* overlap the isolation line 112*c*. In some embodiments, the source contacts 132*a*, 132*b*, 133*a*, 136*b*, 137*a*, and 137*b* and the source vias 142*b*, 143*a*, 144*a*, 146*b*, and 147*a* non-overlap the isolation lines 112*a*, 112*b*, and 112*c*.

A source/drain region between the gate electrodes 126*a* and 127*a* in the third logic cell 100C is coupled to an overlying level (e.g., conductive line 171) through a source/drain contact 136*a* and a source/drain via 146*a*. A source/drain region between the gate electrodes 126*b* and 127*b* in the third logic cell 100C is coupled to an overlying level (e.g., conductive line 171) through a source/drain contact 136*b* and a source/drain via 146*b*. A source/drain region between the gate electrodes 127*a* and 128*a* in the third logic cell 100C is coupled to an overlying level (e.g., conductive line 171) through a source/drain contact 137*a* and a source/drain via 147*a*. A source/drain region between the gate electrodes 128*a* and 129*a* in the third logic cell 100C is coupled to an overlying level (e.g., conductive line 171) through a source/drain contact 138*a* and a source/drain via 148*a*. A source/drain region between the gate electrodes 128*b* and 129*b* in the third logic cell 100C is coupled to an overlying level (e.g., conductive line 171) through a source/drain contact 138*b* and a source/drain via 148*b*. The isolation line 112*b* is located between a corresponding one of the n-type source/drain regions and a corresponding one of the p-type source/drain regions.

In some embodiments, the source/drain regions in the second conductivity type device region 100*e* may include boron-doped SiGe, boron-doped SiGeC, boron-doped Ge, boron-doped Si, or combinations thereof. In some embodiments, the boron atomic concentration of the source/drain regions in the second conductivity type device region 100*e* may be within a range of 1E19/cm$^3$ to about 6E20/cm$^3$. In some embodiments, the Ge atomic concentration of the source/drain regions in the second conductivity type device region 100*e* may be within a range of about 36% to about 85%. In some embodiments, the source/drain regions in the first conductivity type device region 100*d* may include SiP, SiC, SiPC, SiAs, Si, or a combination thereof. In some embodiments, the phosphorus atomic concentration (or arsenic, or both) of the source/drain regions in the first conductivity type device region 100*d* may be within a range of 2E19/cm$^3$ to about 3E21/cm$^3$.

In FIG. 1, the logic circuit 100 of the semiconductor structure further includes conductive lines 171 extending in the X direction. In some embodiments, the conductive lines 171 extend in a direction in parallel with longitudinal axes of the semiconductor sheets 110*a* and 110*b*. In some embodiments, the conductive lines 171 are in a first interconnection layer of the logic circuit 100, such as a first metal layer of the semiconductor structure. In some embodiments, the conductive line 171 connected to the source/drain via 141*a*, 145*a*, 146*a*, and 148*a* can be interchangeably referred to a Vss conductor. In some embodiments, the conductive line 171 connected to the source/drain via 141*b*, 143*b*, 145*b*, and 148*a* can be interchangeably referred to a Vdd conductor. The logic circuit 100 of the semiconductor structure further includes conductive vias 181. In some embodiments, the conductive vias 181 are sandwiched between the first interconnection layer and a second interconnection layer over the first interconnection layer. In some embodiments, the isolation lines 112*a*, 112*b*, and 112*c* overlap corresponding ones of the conductive lines 171 and the conductive vias 181.

The logic circuit 110 of the semiconductor structure further includes conductive lines 191 extending in the Y direction. In some embodiments, the conductive lines 191 extend in a direction in parallel with longitudinal axes of the gate electrodes 121*a* to 129*b*. In some embodiments, the conductive lines 191 extend in a direction perpendicular to longitudinal axes of the conductive lines 171. In some embodiments, the conductive lines 191 are in a second interconnection layer of the logic circuit 100, such as a second metal layer over the first metal layer of the semiconductor structure. The conductive lines 191 are electrically connected to the corresponding underlying conductive lines 171 through the conductive vias 181, respectively. In some embodiments, materials of the conductive lines 171 and 191 and conductive vias 181 of the semiconductor structure may include Cu, Co, Ru, Pt, Al, W, Ti, TaN, TiN, or any combinations thereof. In some embodiments, the conductive lines 191 each extend across the isolation lines 112*a*, 112*b*, and 112*c*.

In some embodiments, the layout as shown in FIG. 1 is represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 2A:
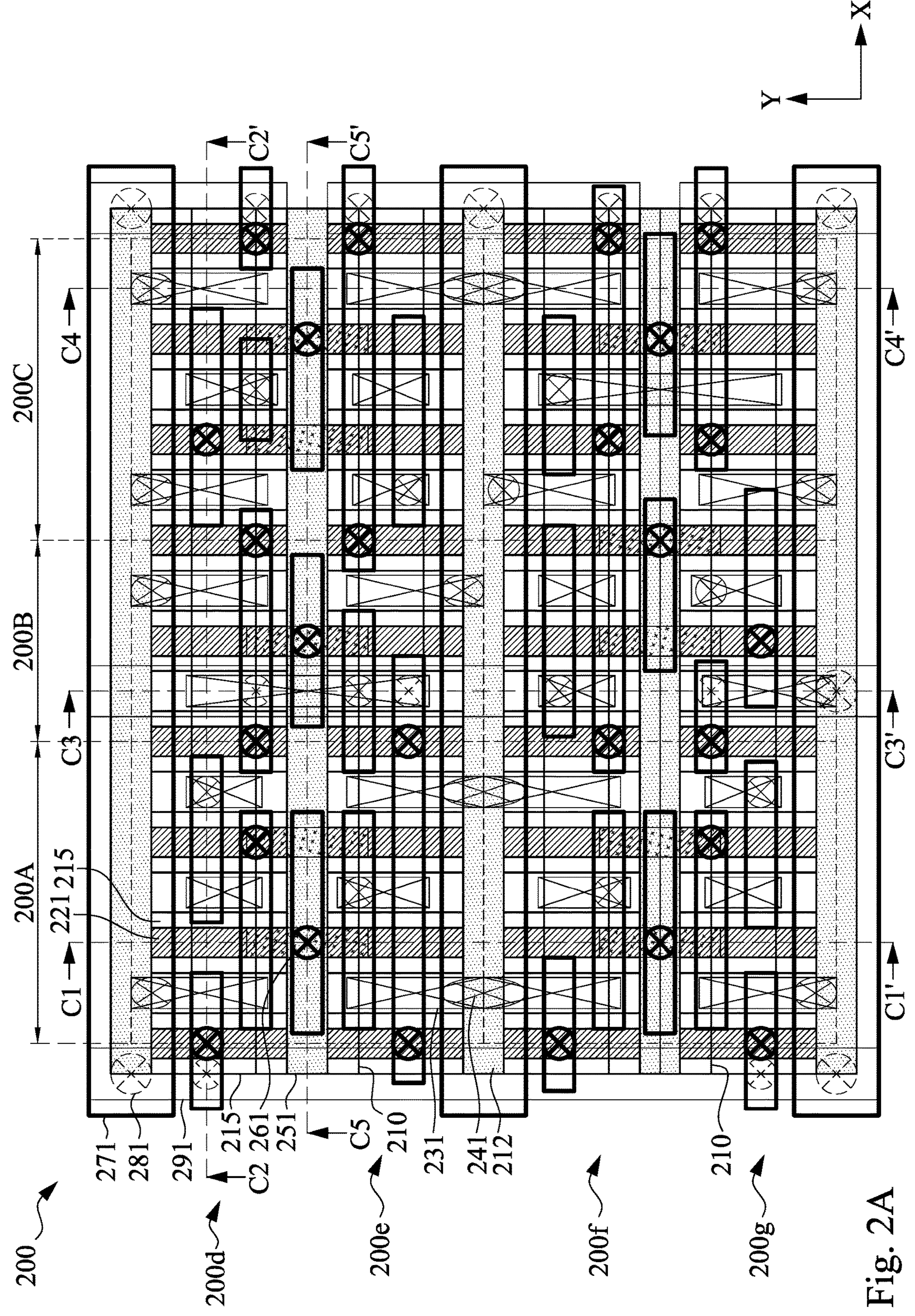

While FIG. 2A shows another embodiment of a cell array layout diagram of a logic circuit 200 of a semiconductor structure having more logic cells than the layout shown in FIG. 1. In some embodiments, material and manufacturing method of first, second, third logic cells 200A, 200B, and 200C, first and second conductivity type device regions 200*d* and 200*e*, semiconductor sheets 210, isolation lines 212, gate electrodes 221, gate spacers 215, gate contacts 251, gate vias 261, source/drain contacts 231, source/drain vias 241, conductive lines 271 and 291, and the conductive vias 281 are substantially the same as those of the corresponding first, second, third logic cells 100A, 100B, and 100C, the corresponding first and second conductivity type device regions 100*d* and 100*e*, the corresponding semiconductor sheets 110*a* and 110*b*, the isolation lines 112*a*, 112*b*, and 112*c*, the corresponding gate electrodes 121*a*, 122*a*, 123*a*, 124*a*, 125*a*, 126*a*, 127*a*, 128*a*, 129*a*, 121*b*, 122*b*, 123*b*, 124*b*, 125*b*, 126*b*, 127*b*, 128*b*, and 129*b*, the corresponding gate spacers 115, the corresponding gate contacts 151, 152, 153, 154, and 155, the corresponding gate vias 161*a*, 161*b*, 162*a*, 163*a*, 164*a*, 164*b*, 165*a*, 167*a*, 168*a*, 169*a*, and 169*b*, the corresponding source/drain contacts 131*a*, 131*b*, 132*a*, 132*b*, 133*a*, 133*b*, 134*a*, 135*a*, 135*b*, 136*a*, 136*b*, 137*a*, 137*b*, 138*a*, and 138*b*, the corresponding source/drain vias 141*a*, 141*b*, 142*b*, 143*a*, 143*b*, 144*a*, 145*a*, 145*b*, 146*a*, 146*b*, 147*a*, 148*a*, and 148*b*, the corresponding conductive lines 171 and 191, and the corresponding conductive vias 181 as shown in FIG. 1, and the related detailed descriptions may refer to the foregoing paragraphs, and are not described again herein. In addition, the present disclosure may repeat reference numerals and/or letters. This repetition is for the purpose of simplicity and clarity and does not in itself dictate a relationship between the various embodiments and/or configurations discussed.

The difference between the embodiment in FIG. 1 and the embodiment in FIG. 2A is that the cell array layout diagram of the logic circuit 200 of a semiconductor structure further includes device regions 200*f* and 200*g*, and the first, second, and third logic cells 200A, 200B, and 200C further extend to the device regions 200*f* and 200*g*. In some embodiments, the first, second, and third logic cells 200A, 200B, and 200C may have the same cell height. In some embodiments, the cell width of the first logic cell 200A may be wider than the cell width of the second logic cell 200B. In some embodiments, the cell width of the third logic cell 200C may be wider than the cell width of the second logic cell 200B. In FIG. 2A, it should be noted that the configuration of the first, second, and third logic cells 200A, 200B, and 200C in the logic circuit 200 is used as an illustration, and not to limit the disclosure. In some embodiments, the row in the cell array of the logic circuit 200 may include more logic cells or fewer logic cells than the layout shown in FIG. 2A. In some embodiments, the cell array of the logic circuit 200 may include more rows or fewer rows and more columns or fewer columns than the layout shown in FIG. 2A. Each logic cell provides a circuit or portion thereof, exemplary functionality provided by the cells includes, but are not limited to NAND, NOR, AND, XOR, XNOR, SACN, inverter, Flip-Flop, latch, and/or other suitable logic or storage functions.

In some embodiments, the device regions 200*f* and 200*g* may be different conductivity type regions. In some embodiments, the device regions 200*f* may be a same conductivity type regions as the device regions 200*e*. By way of example but not limiting the present disclosure, the device region 200*f* may be a P-type well region, and the device region 200*g* may be an N-type well region. The first and second conductivity type device regions 200*f* and 200*g* are disposed in the Y-direction and elongated the in X-direction, in order to form the first-type transistors and the second-type transistors, respectively. In some embodiments, the transistors in the first conductivity type device region 200*f* may be PMOS transistors with silicon channel regions, and the transistor in the second conductivity type device region 200*g* may be NMOS transistors with silicon channel regions. In some embodiments, the transistors may be GAA FETs.

With the same analogy, the corresponding arrangements of the semiconductor sheets 210, isolation lines 212, gate electrodes 221, gate spacers 215, gate contacts 251, gate vias 261, source/drain contacts 231, source/drain vias 241, conductive lines 271 and 291, and the conductive vias 281 in the device regions 200*f* and 200*g* in can be understood with reference to FIG. 1. In FIG. 2A, the corresponding source/drain contact 231 extends from the device region 200*e* to the device region 200*f* and across the isolation line 212 to have a greater area than the other source/drain contacts 131*b*, 133*b*, 135*b*, and 138*b* as shown in FIG. 1 from the top view. In some embodiments, one of the conductive lines 271 in the device region 200*g* connected to the source/drain via 241 can be interchangeably referred to a Vss conductor.

Figure 2B:
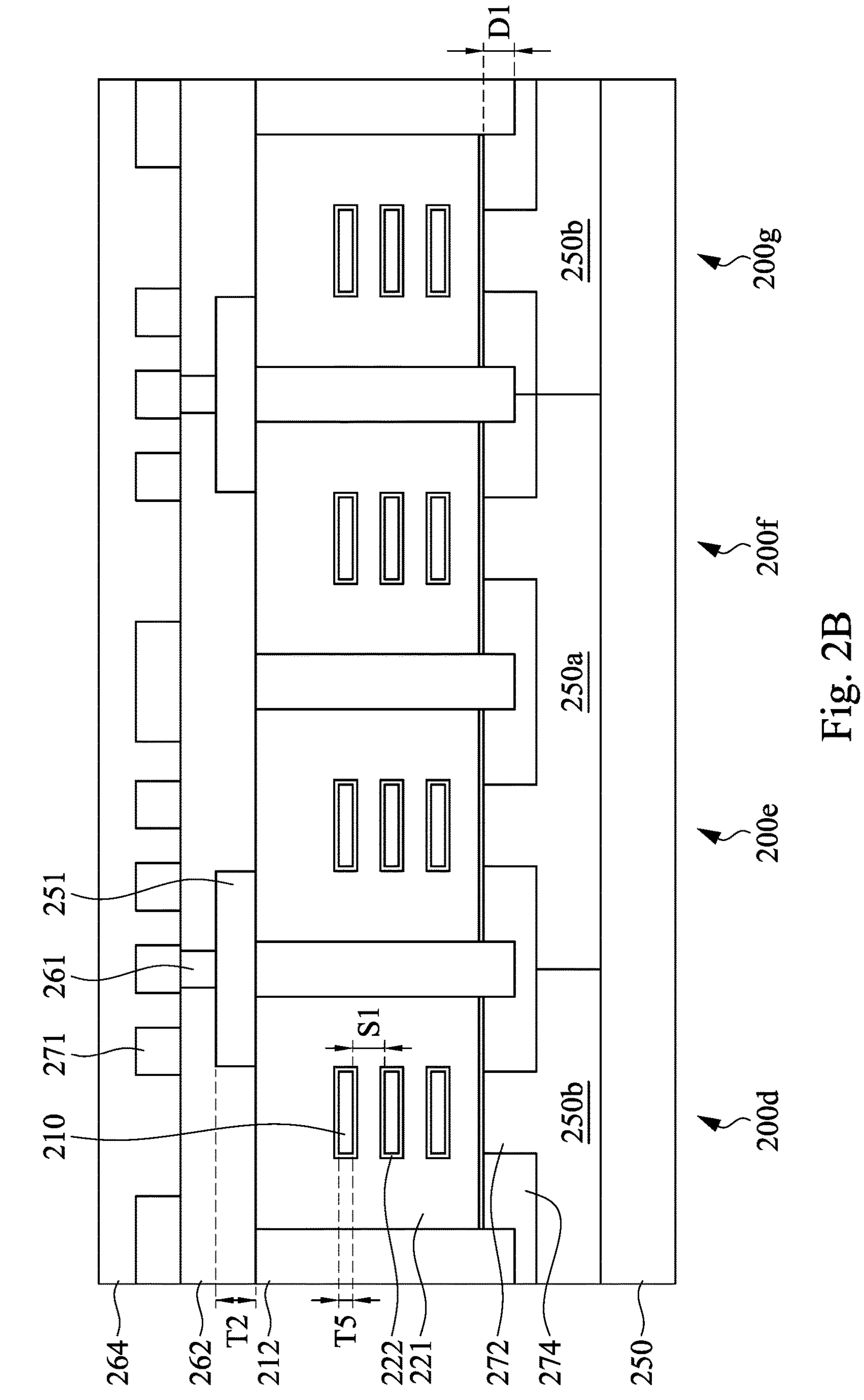
FIGS. 2B, 2E, 2F, 2G, and 2H illustrate cross-sectional views obtained from reference cross-sections C1-C1', C2-C2', C3-C3', C4-C4', and C5-C5' in FIG. 2A, respectively.
Figure 2C:
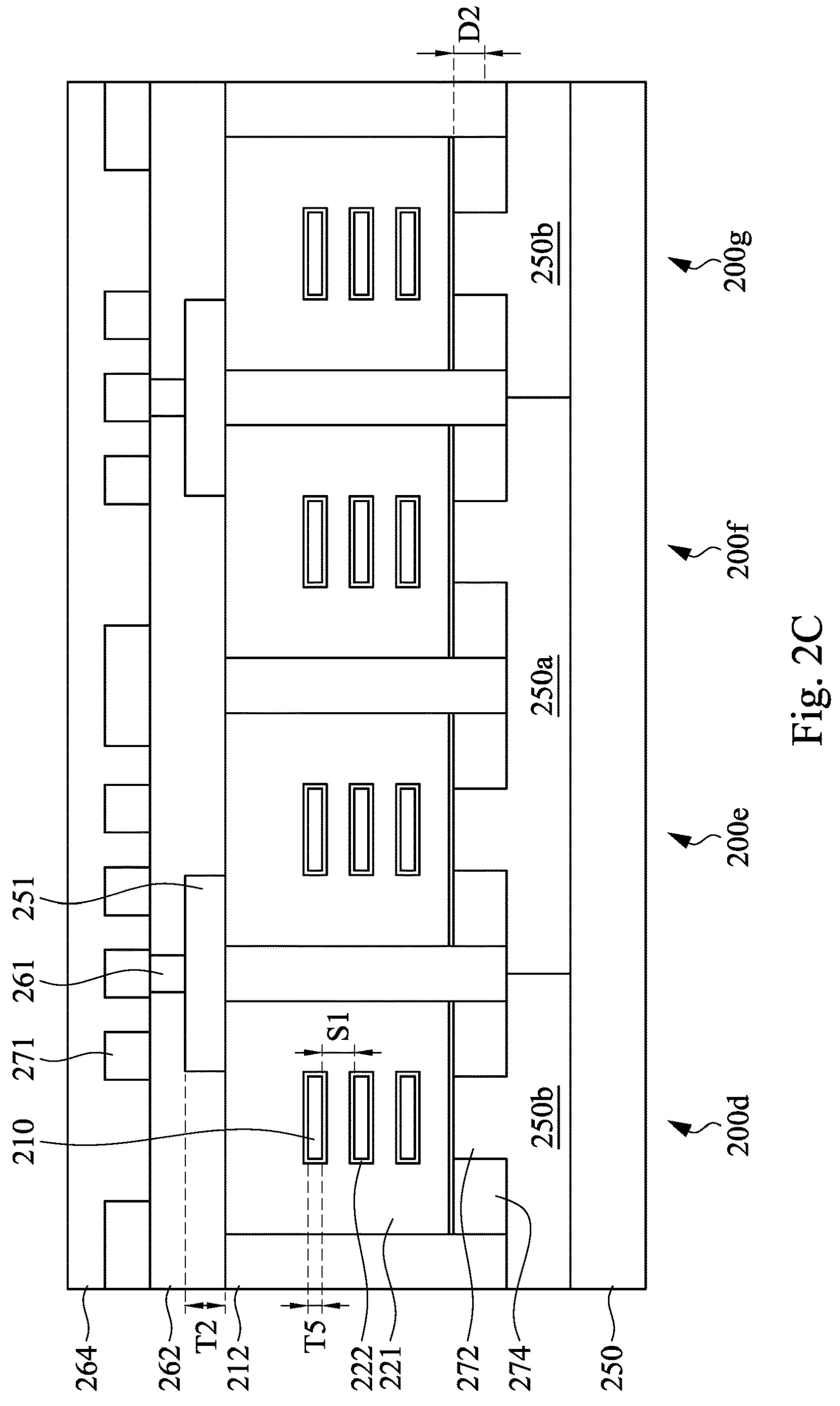
FIGS. 2C and 2D illustrate cross-sectional views of different semiconductor structures corresponding to FIG. 2B in accordance with some embodiments of the present disclosure.
Figure 2D:
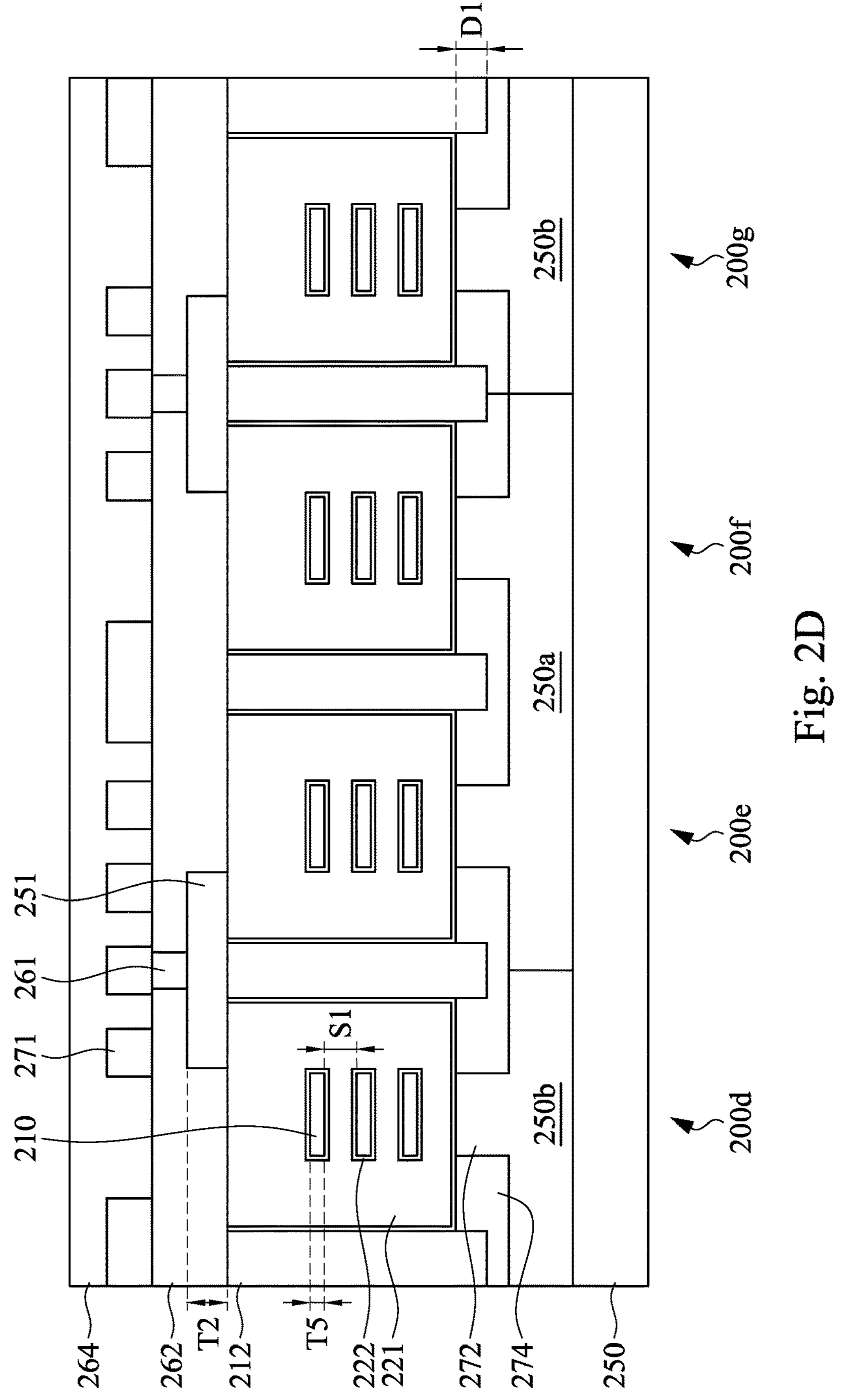

Reference is made to FIGS. 2B, 2C, 2D, 2E, 2F, 2G, and 2H. FIGS. 2B, 2E, 2F, 2G, and 2H illustrate cross-sectional views obtained from reference cross-sections C1-C1', C2-C2', C3-C3', C4-C4', and C5-C5' in FIG. 2A, respectively, where some features, such as conductive vias 181 and conductive lines 191, of the logic circuit 200 are omitted for illustration clarity. FIGS. 2C and 2D illustrate cross-sectional views of different semiconductor structures corresponding to FIG. 2B in accordance with some embodiments of the present disclosure. Reference is made to FIG. 2B. The semiconductor sheets 210 are formed to be stacked along the Z-direction over fins 272 on a substrate 250 and are surrounded by the gate structure including the gate electrode 221 and the gate dielectric layer 222. The substrate 250 may have different conductivity type regions 250*a* and 250*b*. In some embodiments, the first conductivity type region 250*a* is an n-type region, and the second conductivity type region 250*b* is a p-type region. The n-type region can be for forming p-type devices, such as PMOS transistors, e.g., p-type nano-FETs, and the n-type region can be for forming n-type devices, such as NMOS transistors, e.g., n-type nano-FETs. In some embodiments, each semiconductor sheet 210 may be a Si sheet that forms a Si channel region for the corresponding NMOS transistor or PMOS transistor. In some embodiments, the semiconductor sheet 210 can be interchangeably referred to as a nanostructure or a semiconductor sheet. In some embodiments, semiconductor sheet 210 may have a width in a range from about 4 nm to about 7 nm when viewed in X-direction. In some embodiments, the number of stacked semiconductor sheets 210 may be between about 2 to about 10, such as 2, 3, 4, 5, 6, 7, 8, 9, or 10. By way of example but not limiting the present disclosure, the semiconductor sheets 210 may have a thickness T5 in a range from about 4 nm to about 10 nm, such as 4, 5, 6, 7, 8, 9, or 10 nm. By way of example but not limiting the present disclosure, adjacent two of the semiconductor sheets 210 may have a space Si having a vertical dimension in a range from about 6 nm to about 20 nm, such as 6, 8, 10, 12, 14, 16, 18, or 20 nm. By way of example but not limiting the present disclosure, a combination of the thickness T5 and the space S1 may be in a range from about 10 nm to about 30 nm, such as 10, 12, 14, 16, 18, 20, 22, 24, 26, 28, or 30 nm.

Isolation regions 274, such as shallow trench isolation (STI) regions, are disposed between adjacent fins 272, which may protrude above and from between adjacent isolation regions 274. Although the isolation regions 274 are described/illustrated as being separate from the substrate 250, as used herein, the term "substrate" may refer to the semiconductor substrate alone or a combination of the semiconductor substrate and the isolation regions. Additionally, although a bottom portion of the fins 272 are illustrated as being single, continuous materials with the substrate 250, the bottom portion of the fins 272 and/or the substrate 250 may include a single material or a plurality of materials. In this context, the fins 272 refer to the portion extending above and from between the adjacent isolation regions 274.

In some embodiments, the gate electrode 221 may be made of conductive material, such as aluminum (Al), copper (Cu), tungsten (W), titanium (Ti), tantalum (Ta), or other applicable materials. In some embodiments, the gate electrode 221 may include multiple material structure selected from a group consisting of poly gate/SiON structure, metals/high-K dielectric structure, Al/refractory metals/high-K dielectric structure, silicide/high-K dielectric structure, or combination. In some embodiments, the gate electrode 221 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, the gate dielectric layer 222 is made of silicon oxide ($SiO_x$), silicon nitride ($Si_xN_y$), silicon oxynitride (SiON), dielectric material(s) with high dielectric constant (high-k), or a combination thereof. In some embodiments, the gate dielectric layer 222 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 222 includes Lanthanum (La) dopant. In some embodiments, one or more work-function layers (not shown) are formed between the gate dielectric layer 222 and the gate electrode 221. In some embodiments, the work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The isolation lines 212 are formed on opposite ends of the corresponding gate electrodes 221. As described above, the gate electrode 221 extends in the Y-direction (see FIG. 2A) between the corresponding two isolation lines 212. In some embodiments, each isolation lines 212 is a gate-cut structure for the gate structure corresponding to the gate electrode 221, and the gate-cut structure is formed by a cut metal gate (CMG) process. The isolation line 212 may include a bottom end inlaid in the isolation region 274 and have a vertical dimension D1 in a range from about 5 nm to about 60 nm, such as 5, 10, 20, 30, 40, 50, or 60, by way of example but not limiting the present disclosure.

An inter-layer dielectric (ILD) layer 262 and an inter-metal dielectric (IMD) layer 264 are deposited over the gate electrode 221, gate dielectric layer 222, and isolation lines 212 in sequence. In some embodiments, the ILD layer 262 or 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The gate electrodes 221 are electrically connected to an overlying level (e.g., conductive lines 271) through the gate contact 251 and the gate via 261. In some embodiments, the gate contact 251 is formed in the ILD layer 262 and on the adjacent two gate electrodes 221, in order to couple the adjacent two gate electrodes 221 with each other. The gate contacts 221 can extend across the isolation lines 212. The gate via 261 is formed in the ILD layer 262 and on the gate contacts 251. The gate via 261 may overlap the isolation lines 212. The conductive lines 271 are formed in IMD layer 264. In some embodiments, the gate contact 251 may have a thickness T2, by way of example but not limiting the present disclosure. In some embodiments, the gate contact 251 and/or the gate via 26 may include a metal-containing material such as titanium, titanium nitride, titanium oxide, tungsten, cobalt, ruthenium, rhodium, aluminum, copper, platinum combinations thereof, multi-layers thereof, or the like.

Reference is made to FIGS. 2C and 2D. FIGS. 2C and 2D illustrate cross-sectional views of different semiconductor structures corresponding to FIG. 2B in accordance with some embodiments of the present disclosure. While FIG. 2C shows an embodiment of the logic circuit with isolation lines having different cross-sectional profiles than the isolation lines 212 in FIG. 2B, and FIG. 2D shows and embodiment of the logic circuit with gate dielectric layers having different cross-sectional profiles than the gate dielectric layer 222 in FIG. 2B. In addition, the present disclosure may repeat reference numerals and/or letters in the various examples. This repetition is for the purpose of simplicity and clarity and does not in itself dictate a relationship between the various embodiments and/or configurations discussed. As shown in FIG. 2C, the isolation lines 212 penetrate through the isolation regions 274 and further extend to the substrate 250 and a bottom end thereof in the in the isolation region 274 may have a vertical dimension D2 in a range from about 20 nm to about 60 nm, such as 20, 30, 40, or 60, by way of example but not limiting the present disclosure. As shown in FIG. 2D, because the isolation lines 212 are formed prior to the formation of the gate structure including the gate electrode 221 and the gate dielectric layer 222, the gate dielectric layer 222 will be formed on sidewalls of the isolation lines 212.

Figure 2E:
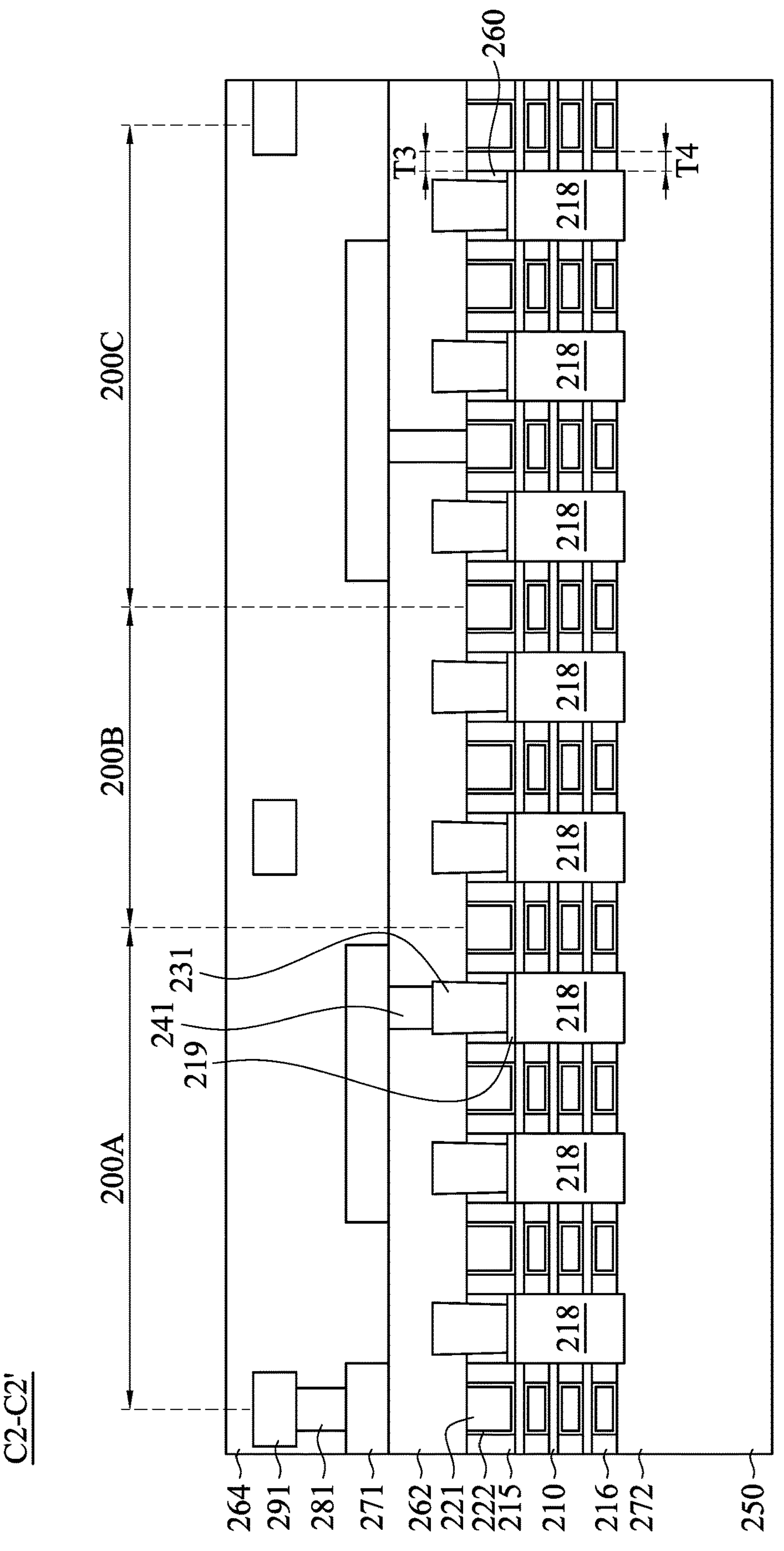

Reference is made to FIG. 2E. Corresponding two source/drain regions 218 are on opposite sides of the semiconductor sheet 210. In some embodiments, the source/drain regions 218 in the first conductivity type region 150*a* are doped with dopants having an opposite conductivity type from the source/drain regions 218 in the second conductivity type region 150*b*. For example, the source/drain regions 218 in the first conductivity type region 150*a* are doped with N-type dopants, and the source/drain regions 218 in the second conductivity type region 150*b* are doped with P-type dopants. In some embodiments, the source/drain regions 218 in the first conductivity type region 150*a* may include materials and/or dopants that achieve desired tensile stress and/or compressive stress in the channel region. In some embodiments, the source/drain regions 218 in the first conductivity type region 150*a* may include Si with Boron (e.g., $B_{11}$) content. For example, the source/drain regions 218 may be formed by epitaxially growing Boron in Si material. In some embodiments, the source/drain regions 218 can be interchangeably referred to epitaxial structures or source/drain patterns.

In some embodiments, the source/drain regions 218 may be deeper than the gate electrodes 221, such that portion of the source/drain regions 218 are in the substrate 150. The source/drain contacts 231 are formed on the source/drain regions 218. In some embodiments, the source/drain contacts 231 may have top ends higher than the gate electrodes 221. Source/drain silicide regions 219 are formed on the source/drain regions 218. The source/drain contacts 218 are formed on the source/drain silicide regions 219. The gate spacers 215 are formed on the sidewalls of the gate electrodes 221. Inner spacers 216 are formed on sidewalls of the semiconductor sheet 210. The ILD layers 260 are formed between the gate electrodes 221 and over the source/drain regions 218. The ILD layer 262 and the IMD layer 264 are formed over the ILD layers 260 in sequence. The conductive vias 281 and the conductive lines 291 are formed in the IMD layer 264. The conductive lines 291 are over the gate electrodes 221 and the source/drain regions 218. The source/drain region 218 is electrically connected to an overlying level (e.g., conductive line 271) through the source/drain contact 231 and the source/drain via 241. The conductive lines 271 are electrically connected to an overlying level (e.g., conductive lines 291) through a conductive via 281. In some embodiments, isolation lines **112*a*, 112*b*, and 112*c* may be made of a different material than the ILD layer 260, the ILD layer 262, and/or the IMD layer 264. By way of example but not limiting the present disclosure, the gate spacer 215 may have a thickness T3 in a range from about 4 to about 12 nm, such as 4, 5, 6, 7, 8, 9, 10, 11, or 12 nm. By way of example but not limiting the present disclosure, the inner spacer 216** may have a thickness T4 in a range from about 4 to about 12 nm, such as 4, 5, 6, 7, 8, 9, 10, 11, or 12 nm.

Figure 2F:
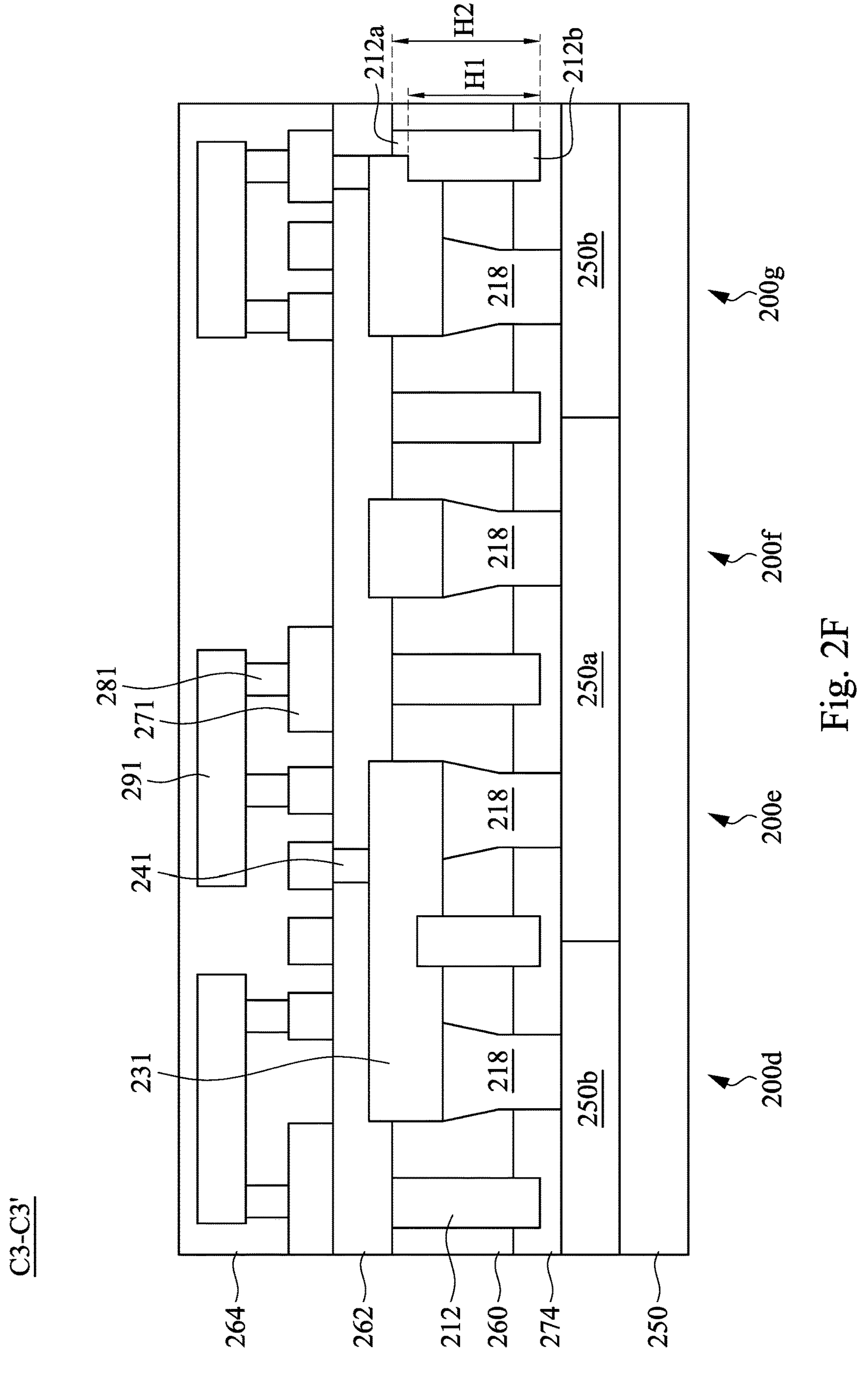
Figure 2G:
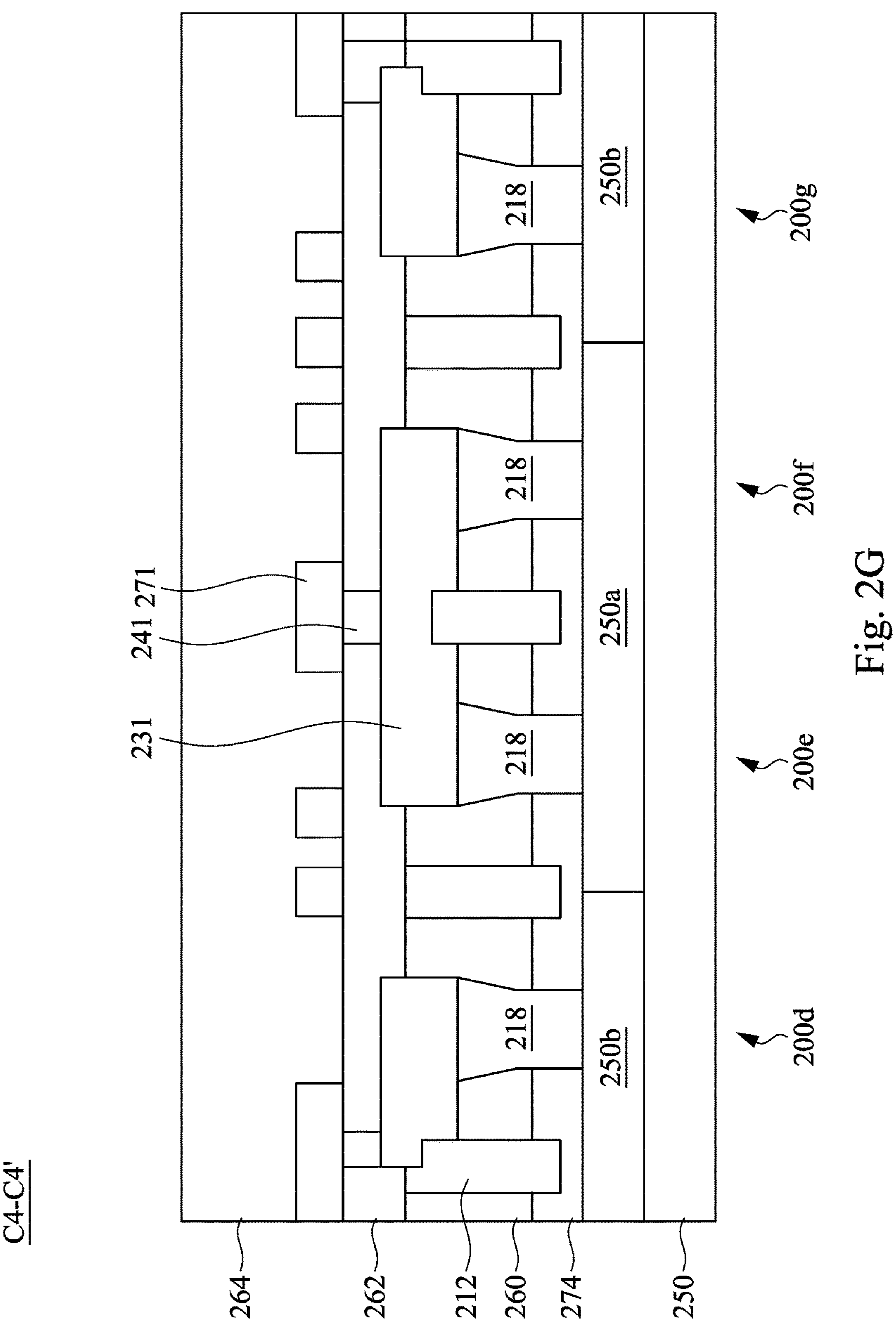
Figure 2H:
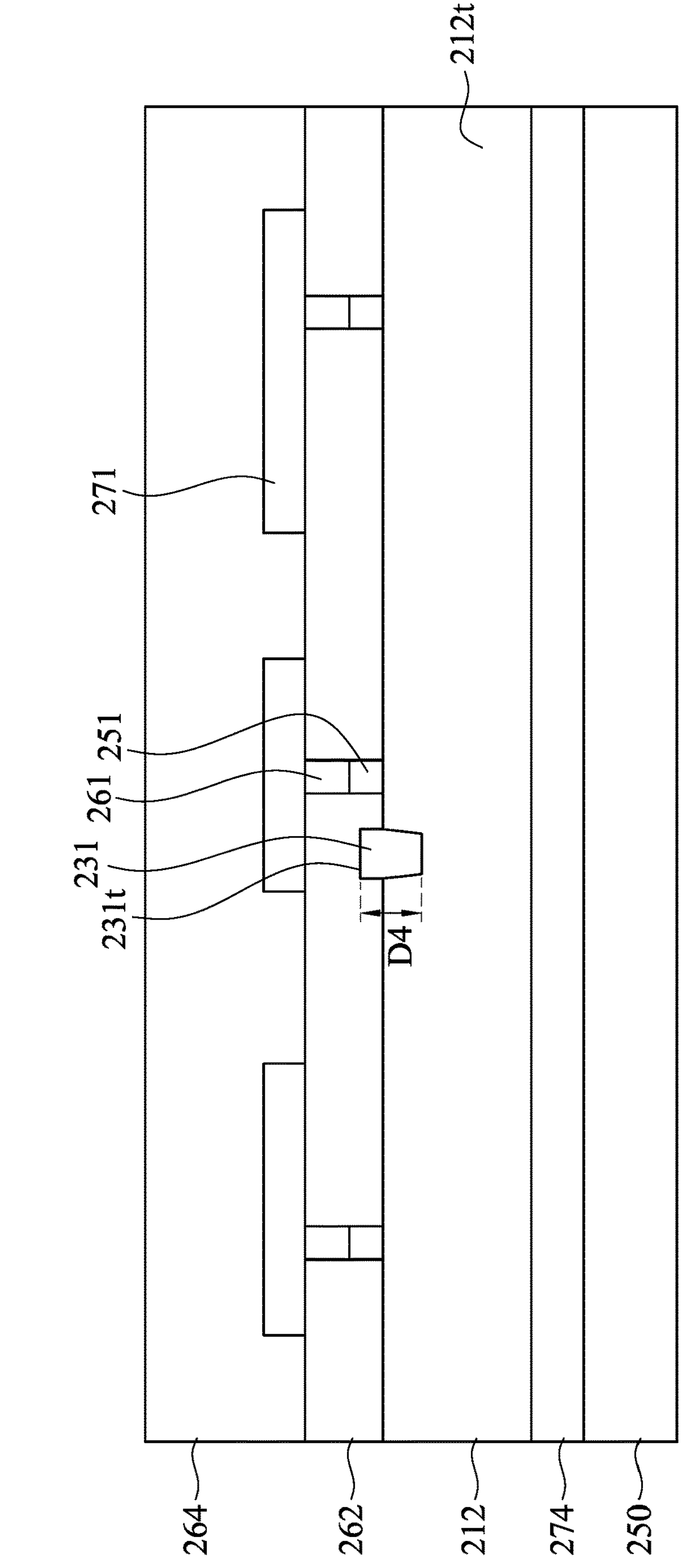

Reference is made to FIGS. 2F, 2G, and 2H. As shown in FIGS. 2F and 2G, lower portions of the source/drain regions 218 are laterally surrounded by the isolation regions 274. The corresponding source/drain contact 231 extends from the device region **200*e* to the device region 200*f* and across the isolation line 212. Portions of the isolation line 212 underlying the source/drain contact 231 may have less vertical dimension H1 than those exposed from the source/drain contact 231. In some embodiments, the isolation line 212 may have a etch loss due to the formation of the source/drain contact 231. By way of example but not limiting the present disclosure, the portion 212*a* of the isolation line 212 exposed from the source/drain contact 231 may have a vertical dimension H2 being from about 5 nm to about 50 nm, such as 5, 10, 30, 40, or 50 nm, greater than the vertical dimension H1 of the portion 212*b* underlying the source/drain contact 231. As shown in FIG. 2H, the corresponding source/drain contact 231 is inlaid in the isolation line 212. The source/drain contact 231 has a top surface 231*t* higher than a top surface 212*t* of the isolation line 212. The source/drain contact 231 may have a portion inlaid in the isolation line 212** and having a vertical dimension D4 in a range from about 5 nm to about 50 nm, such as 5, 10, 20, 30, 40, or 50 nm, by way of example but not limiting the present disclosure.

Figure 3A:
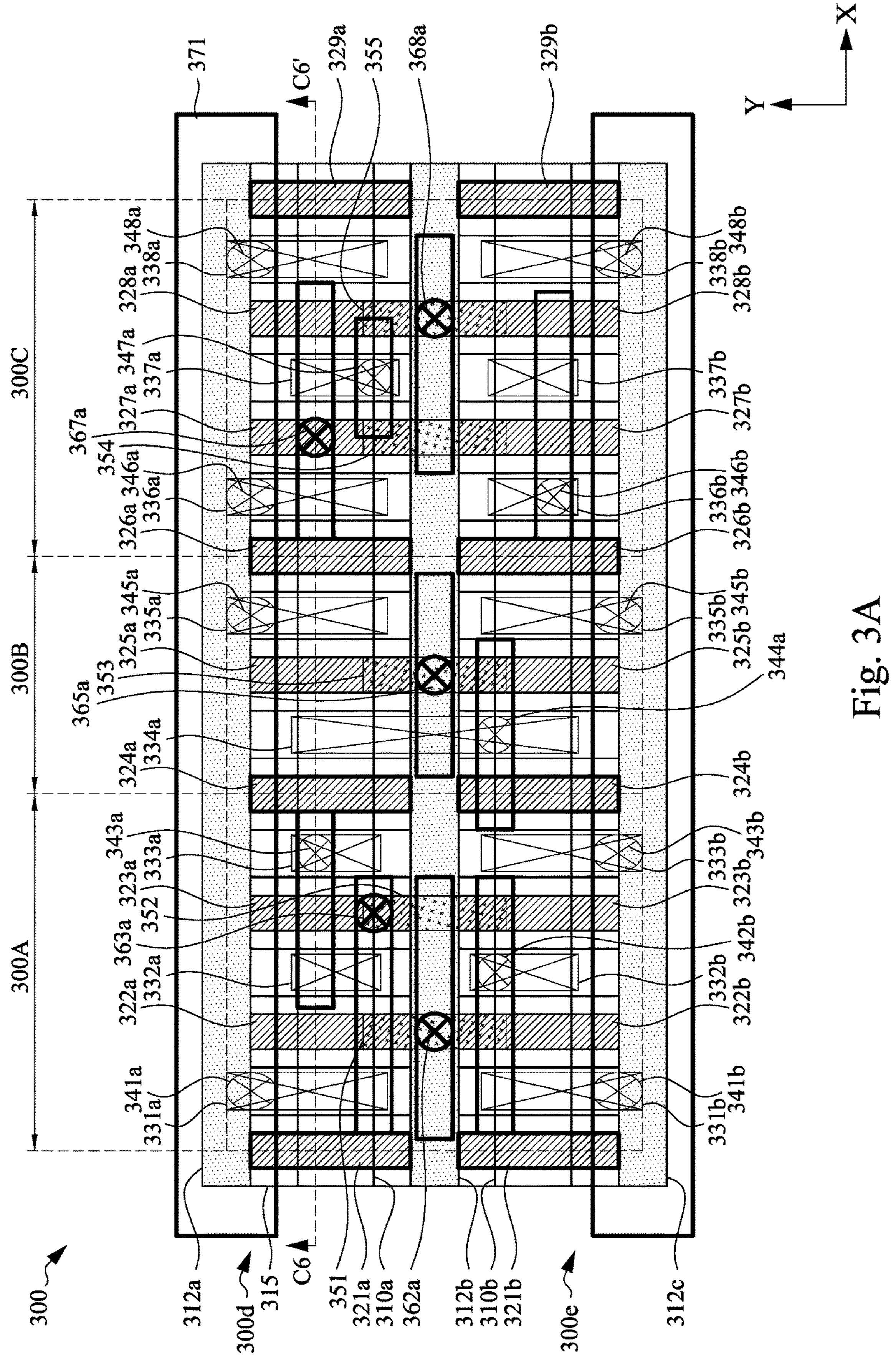
Figure 3B:
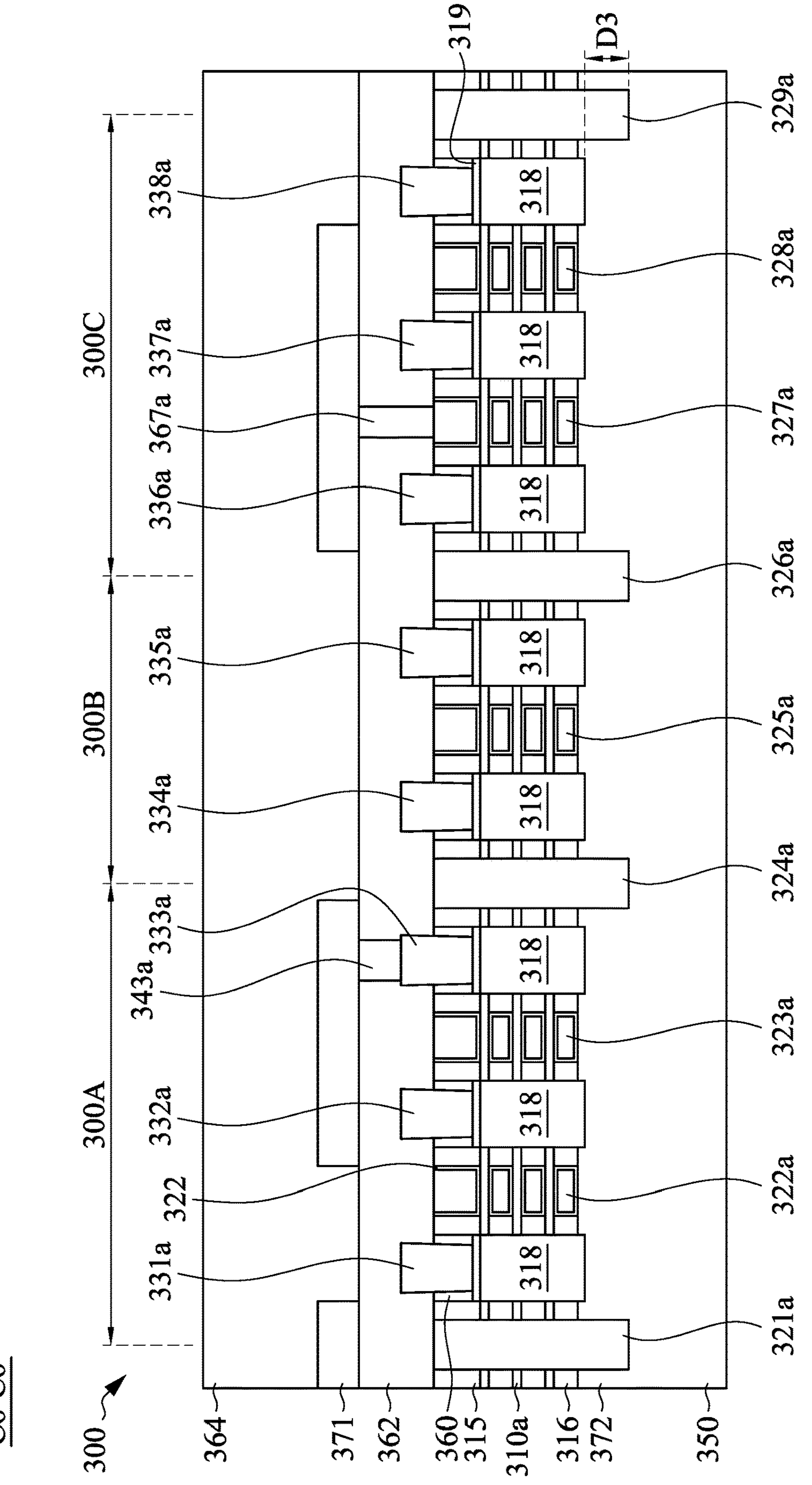
FIGS. 3B, 4B, and 5B illustrate cross-sectional views obtained from reference cross-sections C6-C6', C7-C7', and C7-C8' in FIGS. 3A, 4A, and 5A, respectively.

Reference is made to FIGS. 3A and 3B. FIG. 3A illustrates a cell array layout diagram of a logic circuit 300 of a semiconductor structures according to some embodiments of the present disclosure. FIG. 3B illustrates a cross-sectional view obtained from a reference cross-section C6-C6' in FIG. 3A. In some embodiments, material and manufacturing method of first, second, third logic cells 300A, 300B, and 300C, first and second conductivity type device regions **300*d* and 300*e*, semiconductor sheets 310*a* and 310*b*, isolation lines 312*a*, 312*b*, and 312*c*, gate electrodes 322*a*, 323*a*, 325*a*, 327*a*, 328*a*, 322*b*, 323*b*, 325*b*, 327*b*, and 328*b*, gate spacers 315, gate contacts 351, 352, 353, 354, and 355, gate vias 362*a*, 363*a*, 365*a*, 367*a*, and 368*a*, source/drain contacts 331*a*, 331*b*, 332*a*, 332*b*, 333*a*, 333*b*, 334*a*, 335*a*, 335*b*, 336*a*, 336*b*, 337*a*, 337*b*, 338*a*, and 338*b*, source/drain vias 341*a*, 341*b*, 342*b*, 343*a*, 343*b*, 344*a*, 345*a*, 345*b*, 346*a*, 346*b*, 347*a*, 348*a*, and 348*b*, and the conductive lines 371 are substantially the same as those of the first, second, third logic cells 100A, 100B, and 100C, the first and second conductivity type device regions 100*d* and 100*e*, the semiconductor sheets 110*a* and 110*b*, the isolation lines 112*a*, 112*b*, and 112*c*, the gate electrodes 122*a*, 123*a*, 125*a*, 127*a*, 128*a*, 122*b*, 123*b*, 125*b*, 127*b*, and 128*b*, the gate spacers 115, the gate contacts 151, 152, 153, 154, and 155, the gate vias 162*a*, 163*a*, 165*a*, 167*a*, and 168*a*, the source/drain contacts 131*a*, 131*b*, 132*a*, 132*b*, 133*a*, 133*b*, 134*a*, 135*a*, 135*b*, 136*a*, 136*b*, 137*a*, 137*b*, 138*a*, and 138*b*, the source/drain vias 141*a*, 141*b*, 142*b*, 143*a*, 143*b*, 144*a*, 145*a*, 145*b*, 146*a*, 146*b*, 147*a*, 148*a*, and 148*b*, and the conductive lines 171 as shown in FIG. 1**, and the related detailed descriptions may refer to the foregoing paragraphs, and are not described again herein.

The difference between the embodiment in FIG. 1 and the embodiment in FIGS. 3A and 3B is that the gate electrodes **121*a*, 121*b*, 124*a*, 124*b*, 126*a*, 126*b*, 129*a*, and 129*b* are replaced by the dielectric-base dummy gates 321*a*, 321*b*, 324*a*, 324*b*, 326*a*, 326*b*, 329*a*, and 329*b*, and the gate vias 161*a*, 161*b*, 164*a*, 164*b*, 166*a*, 166*b*, 169*a*, and 169*b* as shown in FIG. 1 are removed. Specifically, the gate electrodes 121*a*, 121*b*, 124*a*, 124*b*, 126*a*, 126*b*, 129*a*, and 129*b* and the gate dielectric layers warping the gate electrodes 121*a*, 121*b*, 124*a*, 124*b*, 126*a*, 126*b*, 129*a*, and 129*b* are removed to form an isolation region separating the source/drain regions of neighboring semiconductor devices from each other and separate different semiconductor devices. The isolation region may be formed by using an etching process. In the etching process, the gate electrodes 121*a*, 121*b*, 124*a*, 124*b*, 126*a*, 126*b*, 129*a*, and 129*b* and the gate dielectric layers warping the gate electrodes 121*a*, 121*b*, 124*a*, 124*b*, 126*a*, 126*b*, 129*a*, and 129*b* are etched anisotropically, until underlying fins 372 (e.g., fins 272 as shown in FIG. 2E are exposed). In some embodiments, the etching may be stopped on the isolation regions (e.g., fins 272 as shown in FIGS. 2B, 2C, and 2D are exposed). In some embodiments, the fins are then etched, and the etching continues down into the underlying substrate 350**.

Subsequently, a dielectric material is filled in the isolation region (i.e., spaces originally occupied by the gate electrode **121*a*, 121*b*, 124*a*, 124*b*, 126*a*, 126*b*, 129*a*, and 129*b* and the gate dielectric layers warping the gate electrodes 121*a*, 121*b*, 124*a*, 124*b*, 126*a*, 126*b*, 129*a*, and 129*b* to form the dielectric-base dummy gates 321*a*, 321*b*, 324*a*, 324*b*, 326*a*, 326*b*, 329*a*, and 329*b*. As shown in FIGS. 3A and 3B, the dielectric-base gates 321*a*, 321*b*, 324*a*, 324*b*, 326*a*, 326*b*, 329*a*, and 329*b* extend in the Y-direction and being dummy gates. The gate electrodes 220*a* and 220*b* are arranged between the dielectric-base dummy gates 225*a* and 225*b*. The gate electrode 322*a*, 323*a*, 325*a*, 327*a*, 328*a*, 322*b*, 323*b*, 325*b*, 327*b*, and 328*b* are arranged between the dielectric-base dummy gates 321*a*, 321*b*, 324*a*, 324*b*, 326*a*, 326*b*, 329*a*, and 329*b*. In other words, the dielectric-base dummy gates 321*a*, 321*b*, 324*a*, and 324*b* are formed in the boundary of the first logic cell 300A. The dielectric-base dummy gates 324*a*, 324*b*, 326*a*, and 326*b* are arranged in the boundary of the second logic cell 300B. The dielectric-base dummy gates 326*a*, 326*b*, 329*a*, and 329*b* are arranged in the boundary of the second logic cell 300**C.

The dielectric-base dummy gates **324*a*, 324*b*, 326*a*, and 326*b* each may include a bottom end lower than the source/drain regions 318. By way of example but not limiting the present disclosure, a distance from the bottom ends of the dielectric-base dummy gates 324*a*, 324*b*, 326*a*, and 326*b* to the source/drain regions 318** may be a vertical dimension D3 in a range about 10 nm to about 150 nm, such as 10, 15, 20, 30, 40, 50, 60, 70, 80, 90, 100, 110, 120, 130, 140, or 150 nm. In some embodiments, the dielectric-base dummy gates 324*a*, 324*b*, 326*a*, and 326*b* may have a same gate length as the gate electrode 321*a*, 321*b*, 324*a*, 324*b*, 326*a*, 326*b*, 329*a*, and 329*b* along the Y direction. By way of example but not limiting the present disclosure, a gate length difference between the dielectric-base dummy gates 324*a*, 324*b*, 326*a*, and 326*b* and the gate electrode 321*a*, 321*b*, 324*a*, 324*b*, 326*a*, 326*b*, 329*a*, and 329*b* may be less than about 3 nm.

The material of the dielectric-base dummy gates 321*a*, 321*b*, 324*a*, 324*b*, 326*a*, 326*b*, 329*a*, and 329*b* are different from that of the gate electrodes 322*a*, 323*a*, 325*a*, 327*a*, 328*a*, 322*b*, 323*b*, 325*b*, 327*b*, and 328*b*. In some embodiments, the dielectric-base gates 321*a*, 321*b*, 324*a*, 324*b*, 326*a*, 326*b*, 329*a*, and 329*b* are made of silicon oxide ($SiO_x$), silicon nitride ($Si_xN_y$), silicon oxynitride (SiON), dielectric material(s), other suitable material, or a combination thereof. In some embodiments, one of the dielectric-base dummy gates 321*a*, 321*b*, 324*a*, 324*b*, 326*a*, 326*b*, 329*a*, and 329*b* can be interchangeably referred to dielectric-gates. In some embodiments, the dielectric-base gates 321*a*, 321*b*, 324*a*, 324*b*, 326*a*, 326*b*, 329*a*, and 329*b* are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In FIG. 3B, the semiconductor sheets 310*a* are formed to be stacked along the Z-direction over fins 372 on a substrate 350 and are surrounded by the gate structure including the gate electrodes 322*a*, 323*a*, 325*a*, 327*a*, and 328*a* and the gate dielectric layer 322. Corresponding two source/drain regions 318 are on opposite sides of the semiconductor sheet 310*a*. Source/drain silicide regions 319 are formed on the source/drain regions 318. The source/drain contacts 331*a*, 332*a*, 333*a*, 334*a*, 335*a*, 336*a*, 337*a*, and 338*a* are formed on the source/drain silicide regions 319. The ILD layers 360 are formed between the gate electrodes 322*a*, 323*a*, 325*a*, 327*a*, and 328*a* and the dielectric-base gates 321*a*, 321*b*, 324*a*, 324*b*, 326*a*, 326*b*, 329*a*, and 329*b* and over the source/drain regions 318. The ILD 362 and the IMD layer 364 are formed over the ILD layers 360 in sequence. The conductive lines 371 are formed in IMD layer 364. In some embodiments, material and manufacturing method of the substrate 350, the fins 372, the gate dielectric layers 322, the source/drain regions 318, the source/drain silicide regions 319, the ILD layers 360 and 362, and the IMD layer 364 are substantially the same as those of the substrate 250, the fins 272, the gate dielectric layers 222, the source/drain regions 218, the source/drain silicide regions 219, the ILD layers 360 and 262, and the IMD layer 264 as shown in FIGS. 2B to 2H, and the related detailed descriptions may refer to the foregoing paragraphs, and are not described again herein.

Figure 4A:
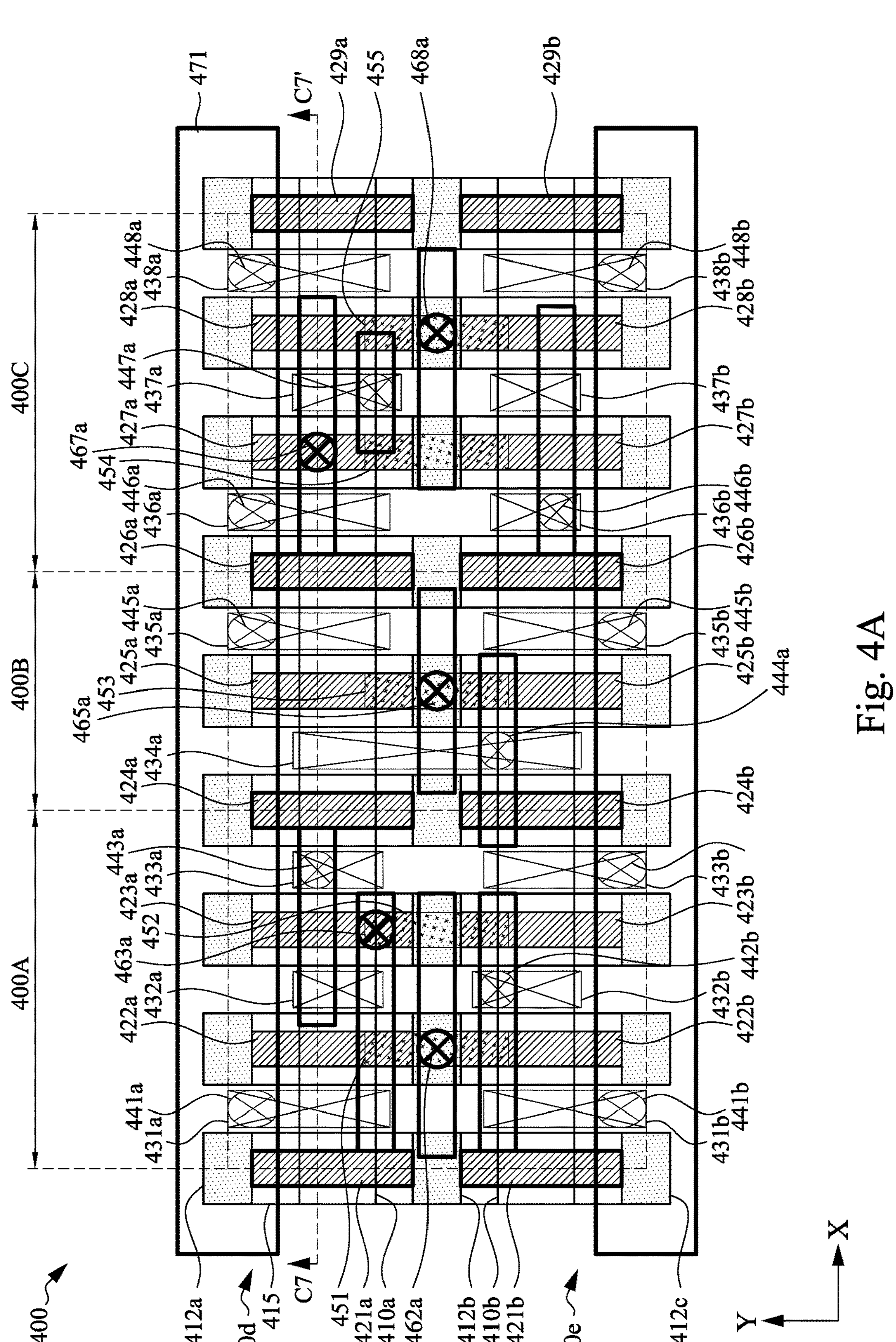
Figure 4B:
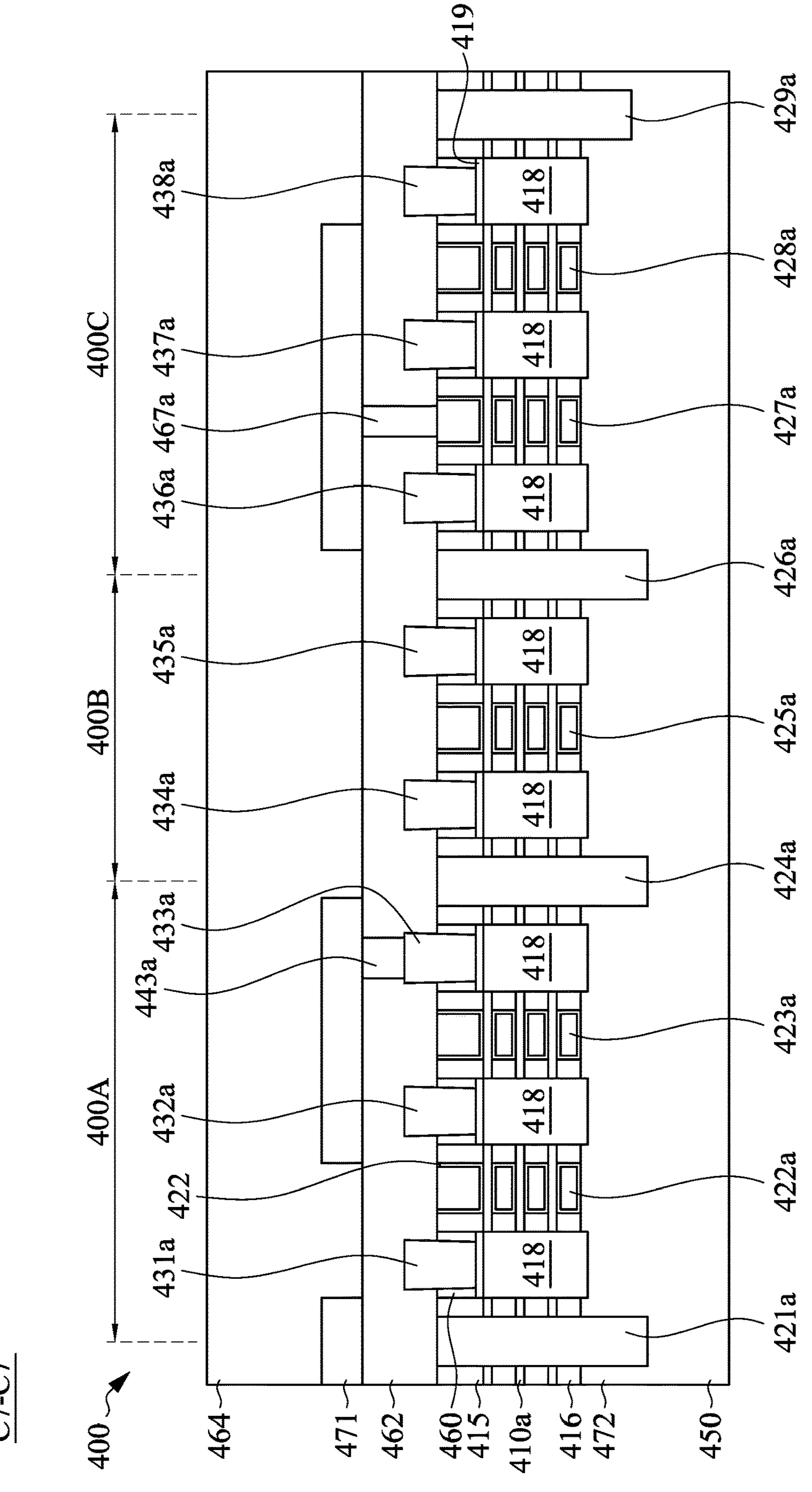

Reference is made to FIGS. 4A and 4B. FIG. 4A illustrates a cell array layout diagram of a logic circuit 400 of a semiconductor structures according to some embodiments of the present disclosure. FIG. 4B illustrates a cross-sectional view obtained from a reference cross-section C7-C7' in FIG. 4A. In some embodiments, material and manufacturing method of first, second, third logic cells 400A, 400B, and 400C, first and second conductivity type device regions 400*d* and 400*e*, semiconductor sheets 410*a* and 410*b*, isolation lines 412*a*, 412*b*, and 412*c*, gate electrodes 422*a*, 423*a*, 425*a*, 427*a*, 428*a*, 422*b*, 423*b*, 425*b*, 427*b*, and 428*b*, dielectric-base dummy gates 421*a*, 421 *b*, 424*a*, 424*b*, 426*a*, 426*b*, 429*a*, and 429*b*, gate spacers 415, gate contacts 451, 452, 453, 454, and 455, gate vias 462*a*, 463*a*, 465*a*, 467*a*, and 468*a*, source/drain contacts 431*a*, 431*b*, 432*a*, 432*b*, 433*a*, 433*b*, 434*a*, 435*a*, 435*b*, 436*a*, 436*b*, 437*a*, 437*b*, 438*a*, and 438*b*, source/drain vias 441*a*, 441*b*, 442*b*, 443*a*, 443*b*, 444*a*, 445*a*, 445*b*, 446*a*, 446*b*, 447*a*, 448*a*, and 448*b*, and the conductive lines 471 are substantially the same as those of the first, second, third logic cells 300A, 300B, and 300C, the first and second conductivity type device regions 300*d* and 300*e*, the semiconductor sheets 310*a* and 310*b*, the isolation lines 312*a*, 312*b*, and 312*c*, the gate electrodes 322*a*, 323*a*, 325*a*, 327*a*, 328*a*, 322*b*, 323*b*, 325*b*, 327*b*, and 328*b*, the dielectric-base dummy gates 321*a*, 321*b*, 324*a*, 324*b*, 326*a*, 326*b*, 329*a*, and 329*b*, the gate spacers 315, the gate contacts 351, 352, 353, 354, and 355, the gate vias 362*a*, 363*a*, 365*a*, 367*a*, and 368*a*, the source/drain contacts 331*a*, 331*b*, 332*a*, 332*b*, 333*a*, 333*b*, 334*a*, 335*a*, 335*b*, 336*a*, 336*b*, 337*a*, 337*b*, 338*a*, and 338*b*, the source/drain vias 341*a*, 341*b*, 342*b*, 343*a*, 343*b*, 344*a*, 345*a*, 345*b*, 346*a*, 346*b*, 347*a*, 348*a*, and 348*b*, and the conductive lines 371 as shown in FIGS. 3A and 3B, and the related detailed descriptions may refer to the foregoing paragraphs, and are not described again herein.

The difference between the embodiment in FIGS. 3A and 3B and the embodiment in FIGS. 4A and 4B is that the isolation lines 412*a*, 412*b*, and 412*c* in the logic circuit 400 do not continuously extend across the first, second, third logic cells 400A, 400B, and 400C. For example, a portion of the isolation lines 412*b* interposing the dielectric-base dummy gates 421*a* and 421*b* is spaced apart from another portion of the isolation line 412*b* interposing the gate electrodes 422*a* and 422*b*. With the same analogy, the corresponding arrangements of the isolation lines 412*a*, 412*b*, and 412*c* in can be understood with reference to FIG. 4A.

In FIG. 4B, the semiconductor sheets 410*a* are formed to be stacked along the Z-direction over fins 472 on a substrate 450 and are surrounded by the gate structure including the gate electrodes 422*a*, 423*a*, 425*a*, 427*a*, and 428*a* and the gate dielectric layer 422. Corresponding two source/drain regions 418 are on opposite sides of the semiconductor sheet 410*a*. Source/drain silicide regions 419 are formed on the source/drain regions 418. The source/drain contacts 431*a*, 432*a*, 433*a*, 434*a*, 435*a*, 436*a*, 437*a*, and 438*a* are formed on the source/drain silicide regions 419. The ILD layers 460 are formed between the gate electrodes 422*a*, 423*a*, 425*a*, 427*a*, and 428*a* and the dielectric-base gates 421*a*, 421 *b*, 424*a*, 424*b*, 426*a*, 426*b*, 429*a*, and 429*b* and over the source/drain regions 418. The ILD 462 and the IMD layer 464 are formed over the ILD layers 460 in sequence. The conductive lines 471 are formed in IMD layer 464. In some embodiments, material and manufacturing method of the substrate 450, the fins 472, the gate dielectric layers 422, the source/drain regions 418, the source/drain silicide regions 419, the ILD layers 460 and 462, and the IMD layer 464 are substantially the same as those of the a substrate 350, fins 372, gate dielectric layers 322, source/drain regions 318, source/drain silicide regions 319, ILD layers 360 and 362, and a IMD layer 364 as shown in FIGS. 3A and 3B, and the related detailed descriptions may refer to the foregoing paragraphs, and are not described again herein.

Figure 5A:
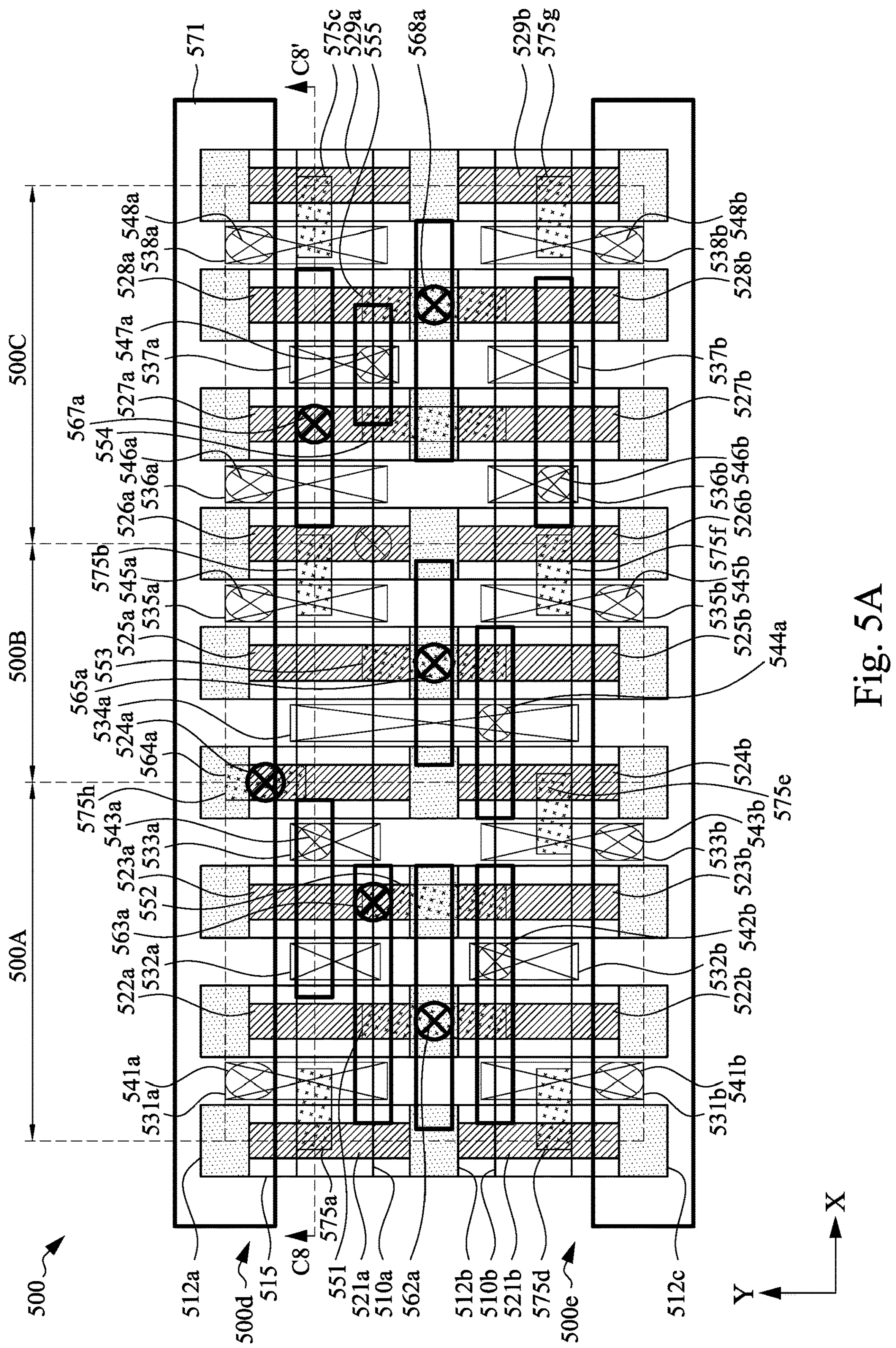
Figure 5B:
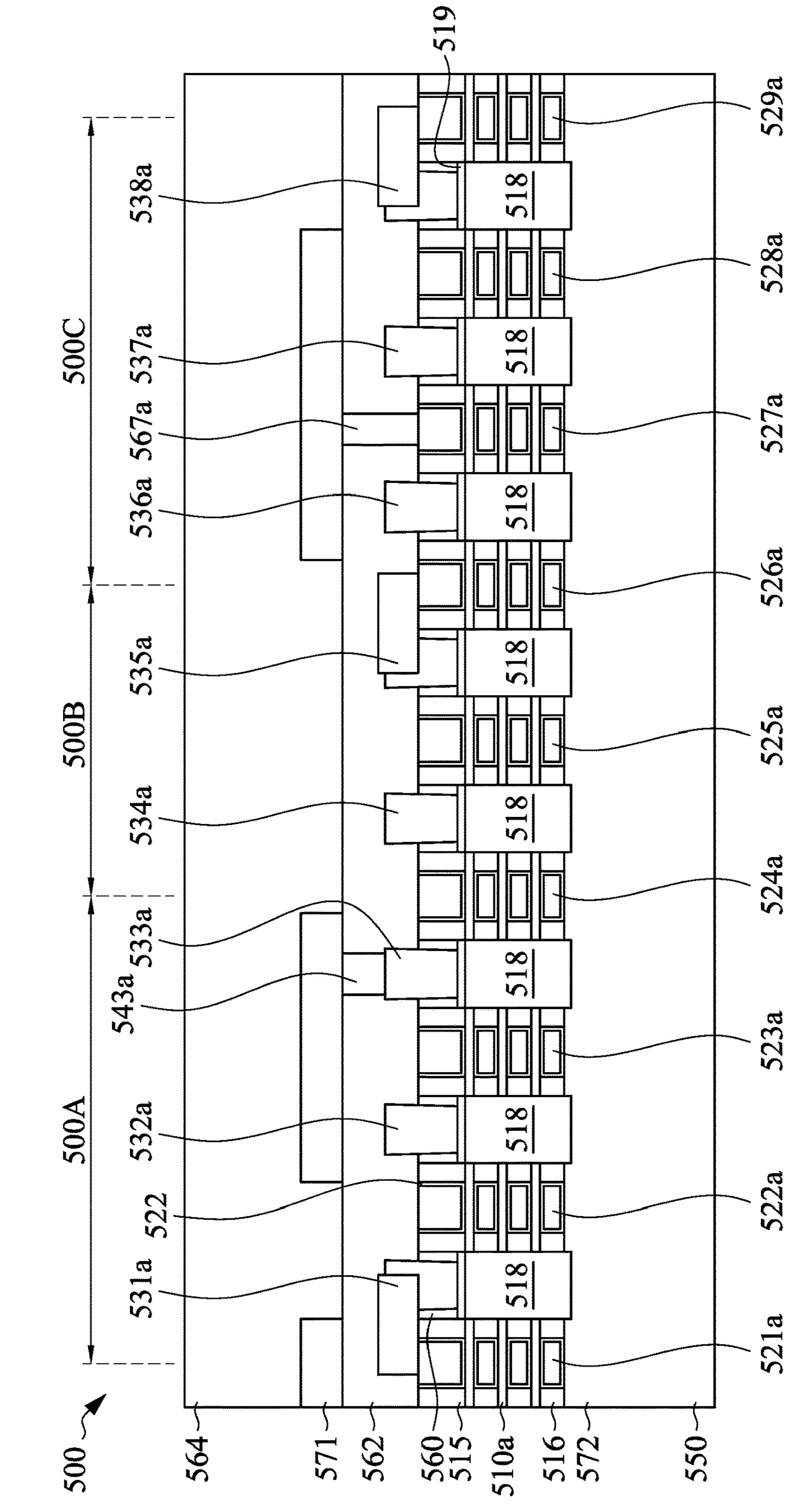

Reference is made to FIGS. 5A and 5B. FIG. 5A illustrates a cell array layout diagram of a logic circuit 500 of a semiconductor structures according to some embodiments of the present disclosure. FIG. 5B illustrates a cross-sectional view obtained from a reference cross-section C8-C8' in FIG. 5A. In some embodiments, material and manufacturing method of first, second, third logic cells 500A, 500B, and 500C, first and second conductivity type device regions 500*d* and 500*e*, semiconductor sheets 510*a* and 510*b*, isolation lines 512*a*, 512*b*, and 512*c*, gate electrodes 522*a*, 523*a*, 525*a*, 527*a*, 528*a*, 522*b*, 523*b*, 525*b*, 527*b*, and 528*b*, gate spacers 515, gate contacts 551, 552, 553, 554, and 555, gate vias 562*a*, 563*a*, 565*a*, 567*a*, and 568*a*, source/drain contacts 531*a*, 531*b*, 532*a*, 532*b*, 533*a*, 533*b*, 534*a*, 535*a*, 535*b*, 536*a*, 536*b*, 537*a*, 537*b*, 538*a*, and 538*b*, source/drain vias 541*a*, 541*b*, 542*b*, 543*a*, 543*b*, 544*a*, 545*a*, 545*b*, 546*a*, 546*b*, 547*a*, 548*a*, and 548*b*, and the conductive lines 571 are substantially the same as those of the first, second, third logic cells 100A, 100B, and 100C, the first and second conductivity type device regions 100*d* and 100*e*, the semiconductor sheets 110*a* and 110*b*, the isolation lines 112*a*, 112*b*, and 112*c*, the gate electrodes 122*a*, 123*a*, 125*a*, 127*a*, 128*a*, 122*b*, 123*b*, 125*b*, 127*b*, and 128*b*, the gate spacers 115, the gate contacts 151, 152, 153, 154, and 155, the gate vias 162*a*, 163*a*, 165*a*, 167*a*, and 168*a*, the source/drain contacts 131*a*, 131*b*, 132*a*, 132*b*, 133*a*, 133*b*, 134*a*, 135*a*, 135*b*, 136*a*, 136*b*, 137*a*, 137*b*, 138*a*, and 138*b*, the source/drain vias 141*a*, 141*b*, 142*b*, 143*a*, 143*b*, 144*a*, 145*a*, 145*b*, 146*a*, 146*b*, 147*a*, 148*a*, and 148*b*, and the conductive lines 171 as shown in FIG. 1, and the related detailed descriptions may refer to the foregoing paragraphs, and are not described again herein.

The difference between the embodiment in FIG. 1 and the embodiment in FIGS. 5A and 5B is that the isolation lines 512*a*, 512*b*, and 512*c* in the logic circuit 500 do not continuously extend across the first, second, third logic cells 500A, 500B, and 500C, the gate vias 161*a*, 161*b*, 164*a*, 164*b*, 166*a*, 166*b*, 169*a*, and 169*b* as shown in FIG. 1 are removed, and butt connections 575*a*, 575*b*, 575*c*, 575*d*, 575*e*, 575*f*, and 575*g* are formed. For example, a portion of the isolation lines 512*b* interposing the gate electrodes 521*a* and 521*b* is spaced apart from another portion of the isolation line 512*b* interposing the gate electrodes 522*a* and 522*b*. The butt connection 575*a* is formed on the gate electrodes 521*a* and the source/drain contacts 531*a*. With the same analogy, the corresponding arrangements of the isolation lines 412*a*, 412*b*, and 412*c* and the butt connections 575*b*, 575*c*, 575*d*, 575*e*, 575*f*, and 575*g* can be understood with reference to FIGS. 5A and 5B. In some embodiments, the butt connections 575*a* through 575*g* may include a metal-containing material such as titanium nitride, titanium oxide, tungsten, cobalt, ruthenium, aluminum, copper, combinations thereof, multi-layers thereof, or the like.

In FIG. 5B, the semiconductor sheets 510*a* are formed to be stacked along the Z-direction over fins 572 on a substrate 550 and are surrounded by the gate structure including the gate electrodes 522*a*, 523*a*, 525*a*, 527*a*, and 528*a* and the gate dielectric layer 522. Corresponding two source/drain regions 518 are on opposite sides of the semiconductor sheet 510*a*. Source/drain silicide regions 519 are formed on the source/drain regions 518. The source/drain contacts 531*a*, 532*a*, 533*a*, 534*a*, 535*a*, 536*a*, 537*a*, and 538*a* are formed on the source/drain silicide regions 519. The ILD layers 560 are formed between the gate electrodes 522*a*, 523*a*, 525*a*, 527*a*, and 528*a* and over the source/drain regions 518. The ILD 562 and the IMD layer 364 are formed over the ILD layers 560 in sequence. The conductive lines 571 are formed in IMD layer 564. In some embodiments, material and manufacturing method of the substrate 550, the fins 572, the gate dielectric layers 522, the source/drain regions 518, the source/drain silicide regions 519, the ILD layers 560 and 562, and the IMD layer 564 are substantially the same as those of the substrate 250, the fins 272, the gate dielectric layers 222, the source/drain regions 218, the source/drain silicide regions 219, the ILD layers 360 and 262, and the IMD layer 264 as shown in FIGS. 2B to 2H, and the related detailed descriptions may refer to the foregoing paragraphs, and are not described again herein.

Reference is made to FIGS. 6A-16C. FIGS. 6A, 7A, 8A, 9A, 10A, 11A, 12A, 13A, 14A, 15A, and 16A illustrate cross-sectional views obtained from the reference cross-section C1-C1' in FIG. 2A of intermediate stages in the formation of a semiconductor structure in accordance with some embodiments. FIGS. 6B, 7B, 8B, 9B, 10B, 11B, 12B, 13B, 14B, 15B, and 16B illustrate cross-sectional views obtained from the reference cross-section C3-C3' in FIG. 2A of intermediate stages in the formation of a semiconductor structure in accordance with some embodiments. FIGS. 6C, 7C, 8C, 9C, 10C, 11C, 12C, 13C, 14C, 15C, and 16C illustrate cross-sectional views obtained from the reference cross-section C5-C5' in FIG. 2A of intermediate stages in the formation of a semiconductor structure in accordance with some embodiments.

Figure 6A:
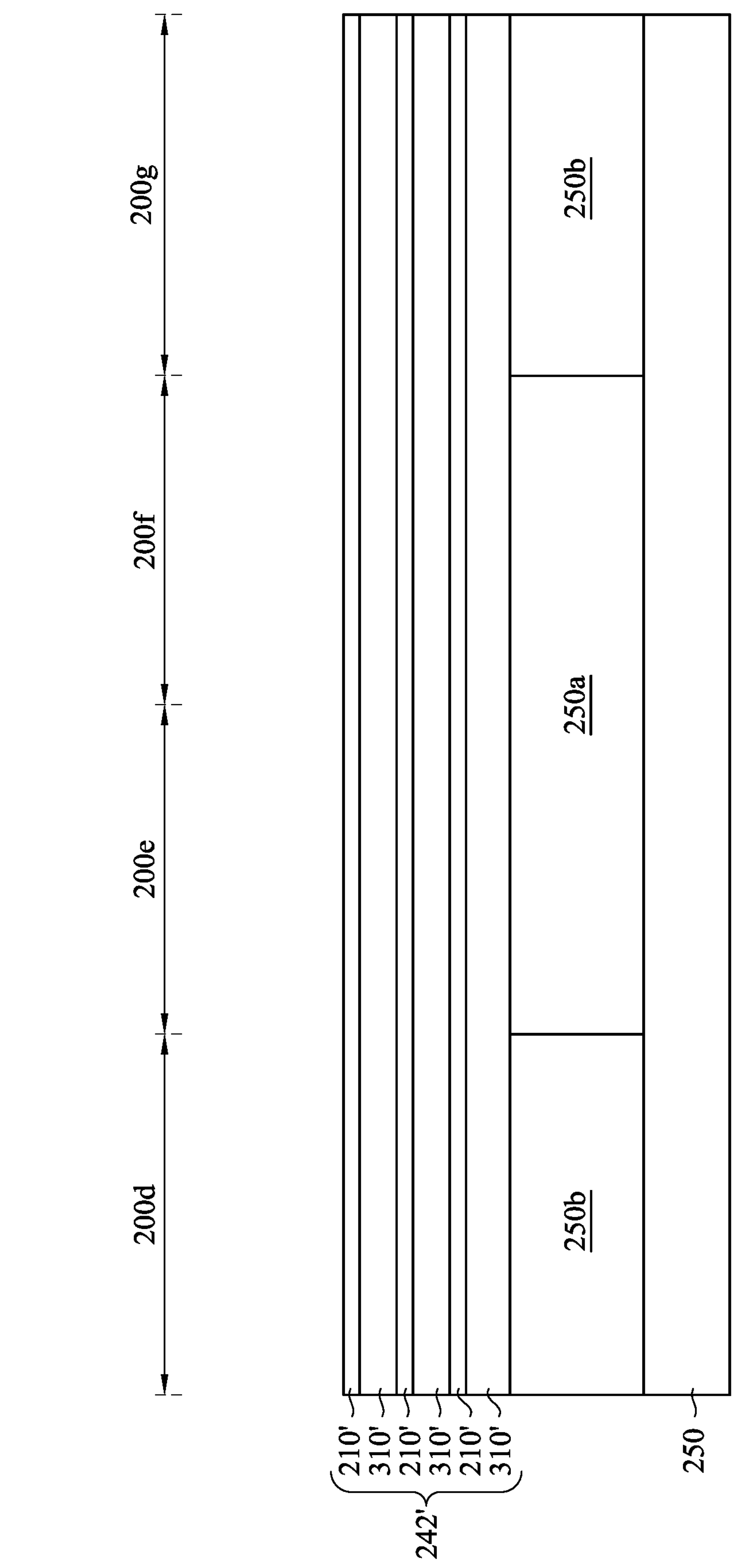
FIGS. 6A-16C illustrate cross-sectional views of intermediate stages in the formation of a semiconductor structure in accordance with some embodiments.
Figure 6B:
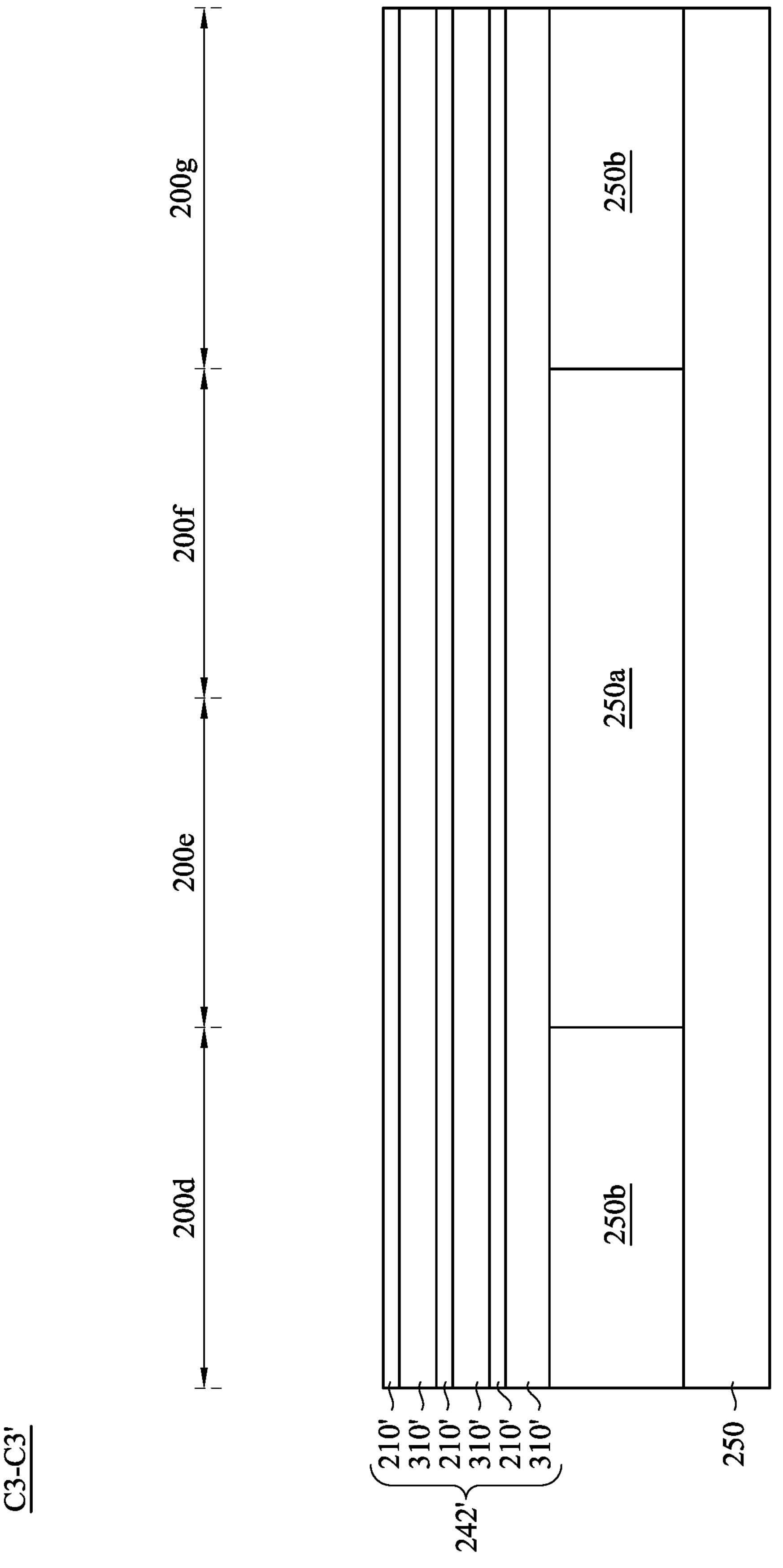
Figure 6C:
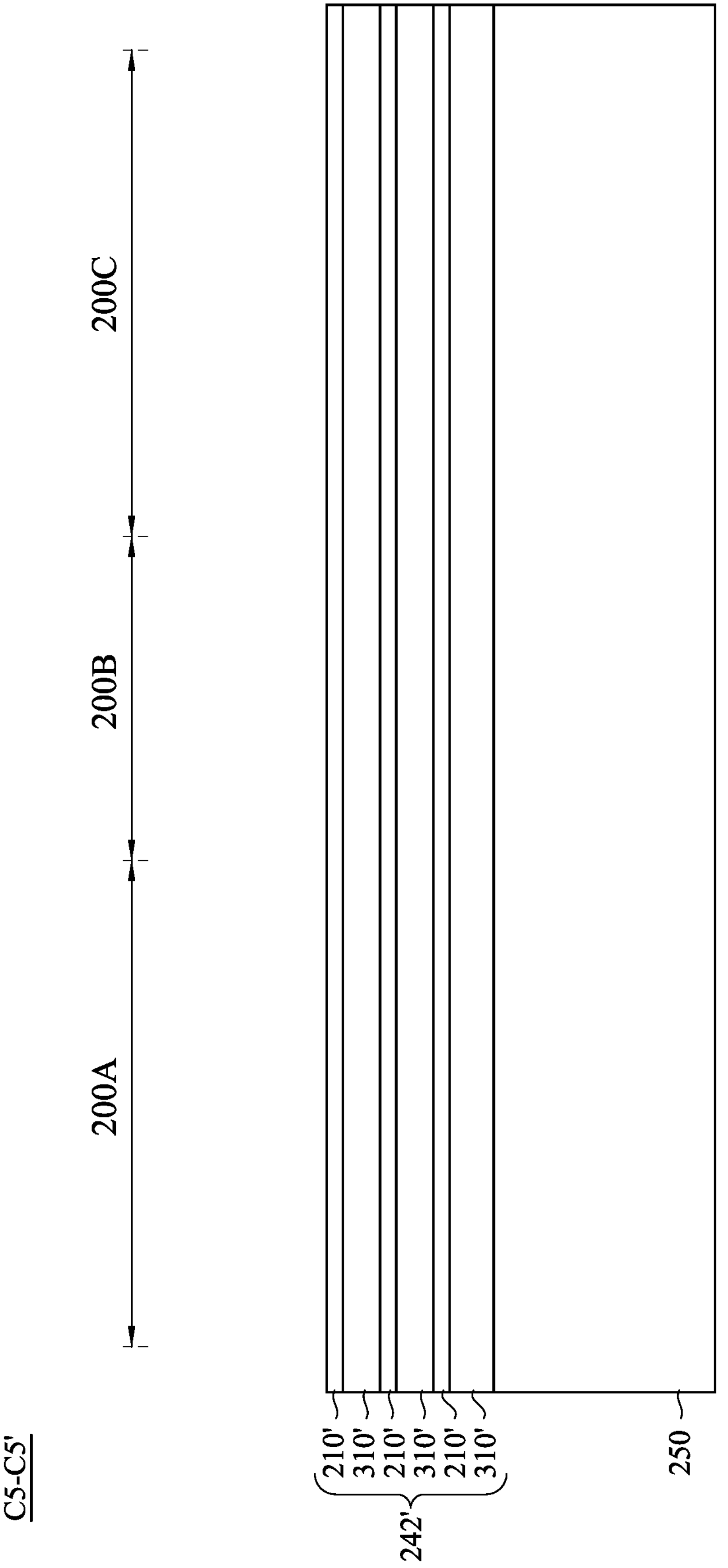

Reference is made to FIGS. 6A, 6B, and 6C. A substrate 250 is provided for forming nano-FETs. The substrate 250 may be a semiconductor substrate, such as a bulk semiconductor, a semiconductor-on-insulator (SOI) substrate, or the like, which may be doped (e.g., with a p-type or an n-type impurity) or undoped. The substrate 250 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 250 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like. The substrate 250 may have different conductivity type regions 250*a* and 250*b*. In some embodiments, the first conductivity type region 250*a* is an n-type region, and the second conductivity type region 250*b* is a p-type region. The n-type region can be for forming p-type devices, such as PMOS transistors, e.g., p-type nano-FETs, and the n-type region can be for forming n-type devices, such as NMOS transistors, e.g., n-type nano-FETs.

Subsequently, a multi-layer stack 242' is formed over the substrate 250. The multi-layer stack 242' includes alternating first semiconductor layers 310' and second semiconductor layers 210'. The first semiconductor layers 310' formed of a first semiconductor material, and the second semiconductor layers 210' are formed of a second semiconductor material. The semiconductor materials may each be selected from the candidate semiconductor materials of the substrate 250. In some embodiments, the multi-layer stack 242' includes two layers of each of the first semiconductor layers 310 and the second semiconductor layers 210'. It should be appreciated that the multi-layer stack 242' may include any number of the first semiconductor layers 310' and the second semiconductor layers 210'.

In some embodiments, and as will be subsequently described in greater detail, the first semiconductor layers 310' will be removed and the second semiconductor layers 210' will patterned to form channel regions for the nano- FETs in the device regions 200_d_, 200_e_, 200_f_, 200_g_ as shown in FIG. 2A. The first semiconductor layers 310' are sacrificial layers (or dummy layers), which will be removed in subsequent processing to expose the top surfaces and the bottom surfaces of the second semiconductor layers 210'. The first semiconductor material of the first semiconductor layers 310' is a material that has a high etching selectivity from the etching of the second semiconductor layers 210', such as silicon germanium. The second semiconductor material of the second semiconductor layers 210' is a material suitable for both n-type and p-type devices, such as silicon.

In some embodiments, the first semiconductor material of the first semiconductor layers 310' may be made of a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. The first semiconductor material and the second semiconductor material may have a high etching selectivity from the etching of one another. Each of the layers of the multi-layer stack 242' may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 242' may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 210') are formed to be thinner than other layers (e.g., the first semiconductor layers 310'). For example, in embodiments in which the first semiconductor layers 310' are sacrificial layers (or dummy layers) and the second semiconductor layers 210' are patterned to form channel regions for the nano-FETs in the device regions 200_d_, 200_e_, 200_f_, 200_g_ as shown in FIG. 2A.

Figure 7A:
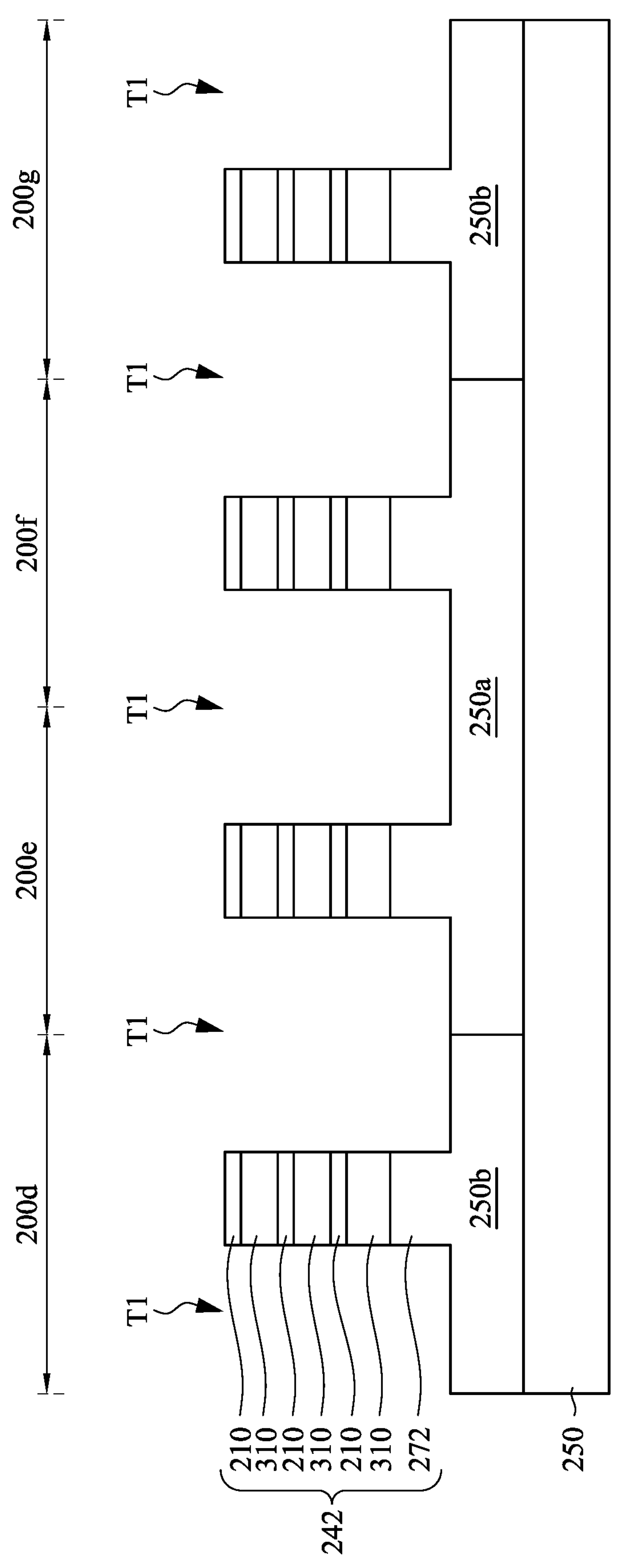
Figure 7B:
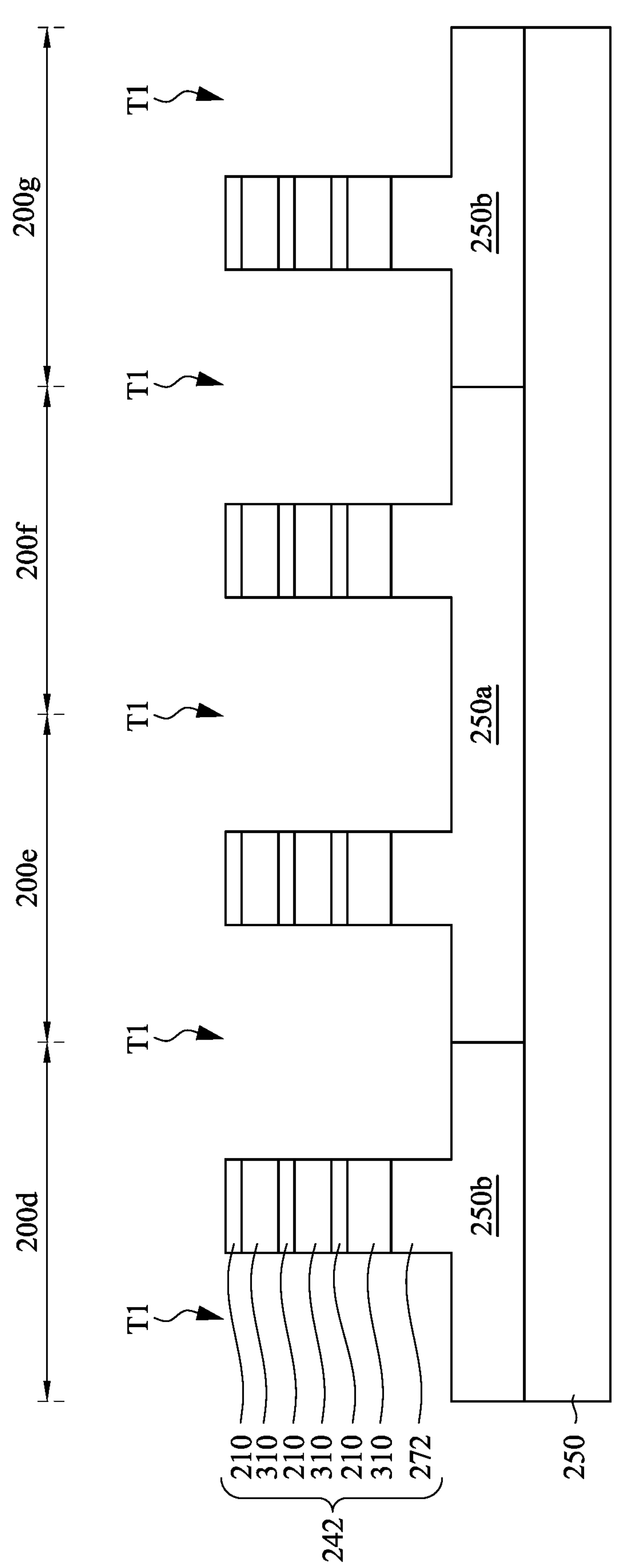
Figure 7C:
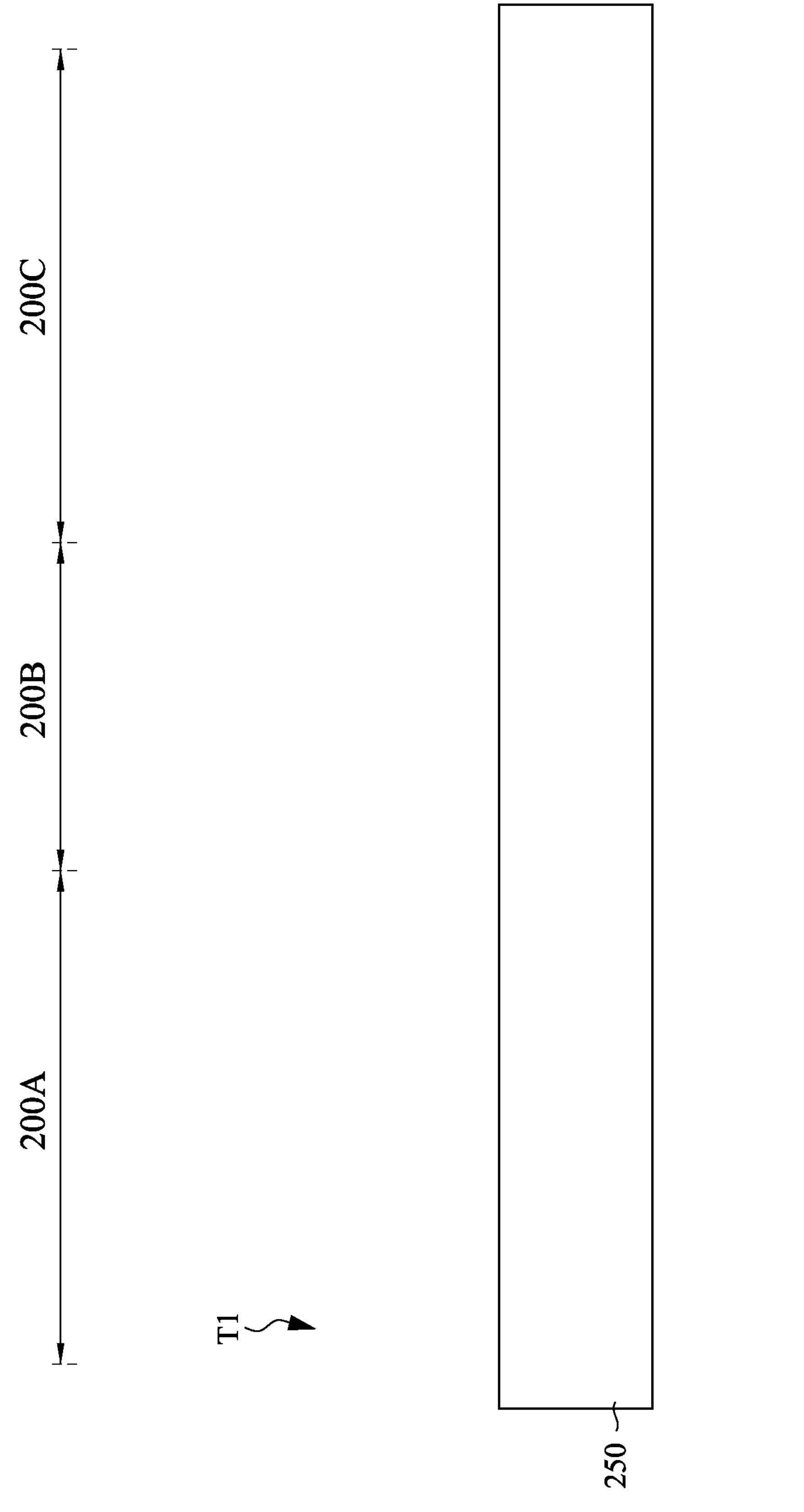

Reference is made to FIGS. 7A, 7B, and 7C. Trenches T1 are patterned in the substrate 250 and the multi-layer stack 242' to form fin structure 242 including fins 272 and first semiconductor sheets 310 and second semiconductor sheets 210 on the fins 272. The fins 272 are semiconductor strips patterned in the substrate 250. The first semiconductor sheets 310 and the second semiconductor sheets 210 include the remaining portions of the first semiconductor layers 310' and the second semiconductor layers 210', respectively. The trenches Ti may be patterned by any acceptable etch process, such as a reactive ion etch (RIE), neutral beam etch (NBE), the like, or a combination thereof. The etching may be anisotropic.

The fins 272 and the first and second semiconductor sheets 310, 210 may be patterned by any suitable method. For example, the fins 272 and the first and second semiconductor sheets 310, 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 272 and the first and second semiconductor sheets 310, 210. In some embodiments, the mask (or other layer) may remain on the first and second semiconductor sheets 310, 210. In some embodiments, the fins 272 and the first and second semiconductor sheets 310, 210 may each have widths in a range of about 8 nm to about 40 nm. In some embodiments, the fins 272 and the first and second semiconductor sheets 310, 210 have substantially equal widths in the device regions 200_d_, 200_e_, 200_f_, and 200_g_ as shown in FIG. 2A.

Figure 8A:
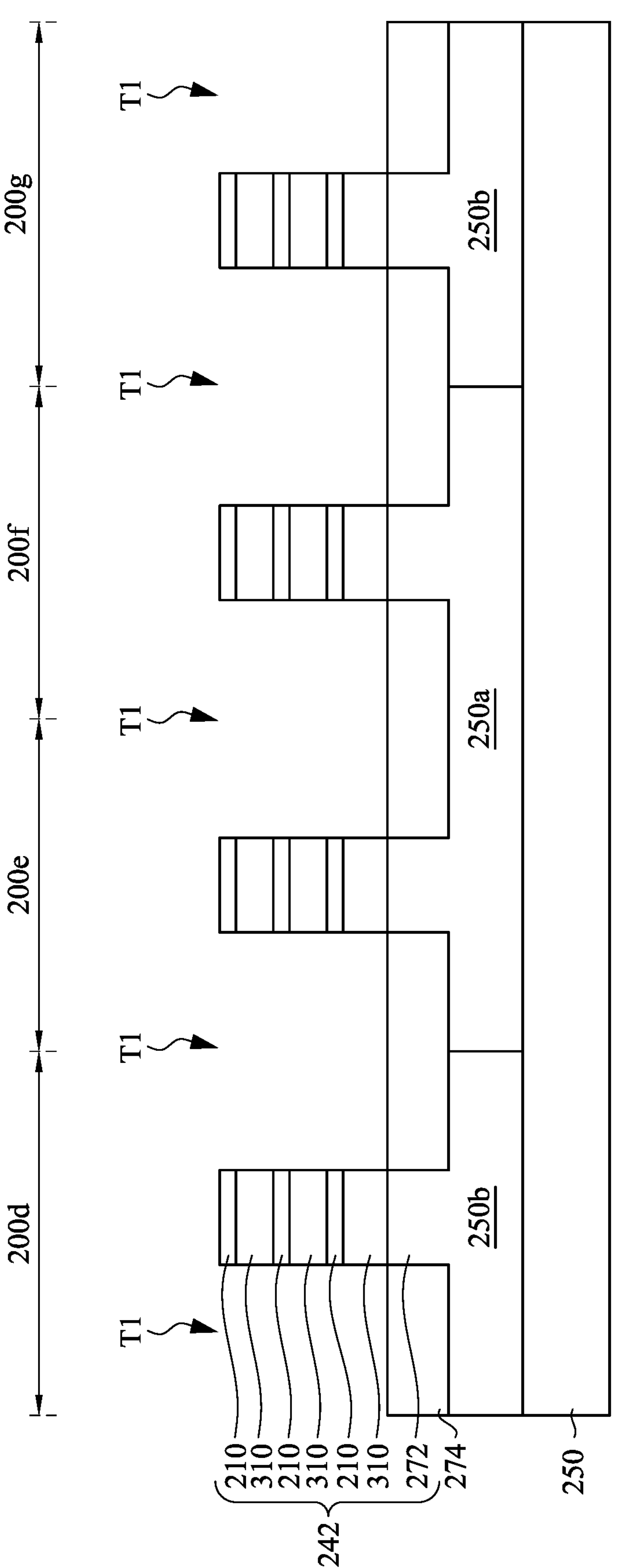
Figure 8B:
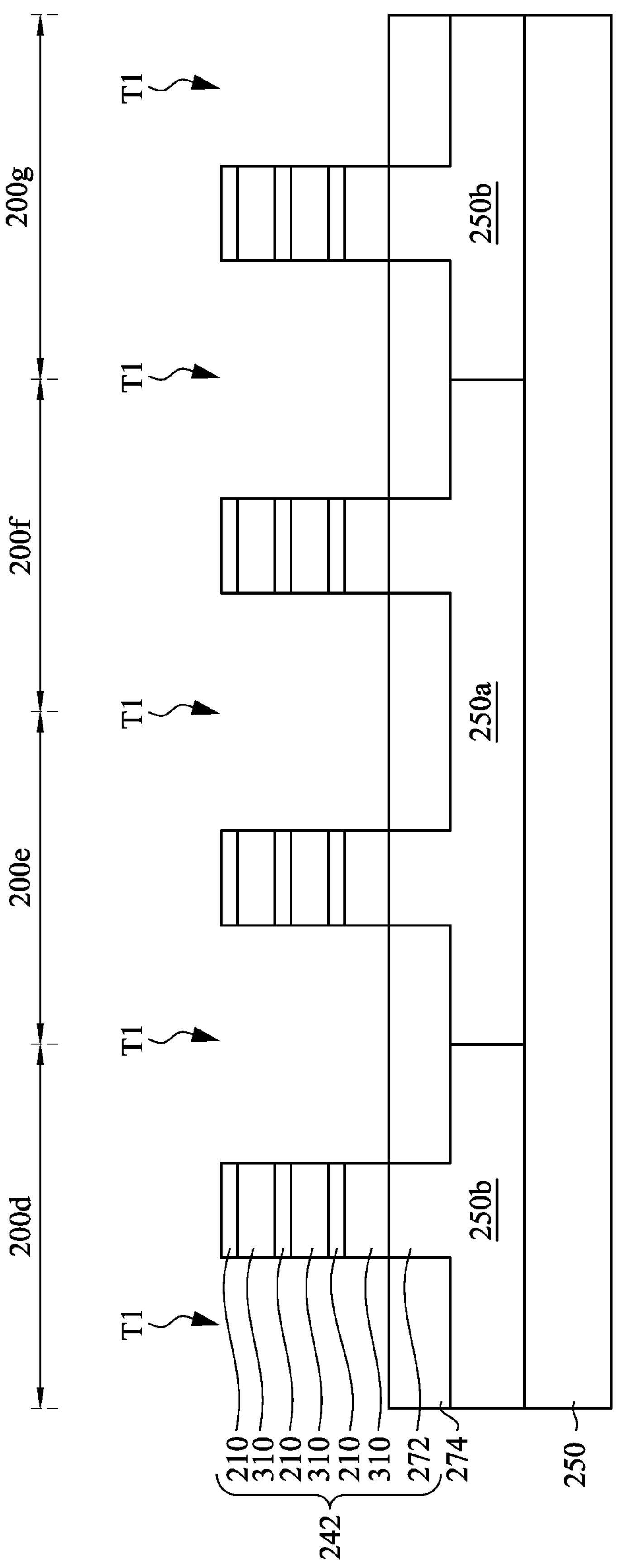
Figure 8C:
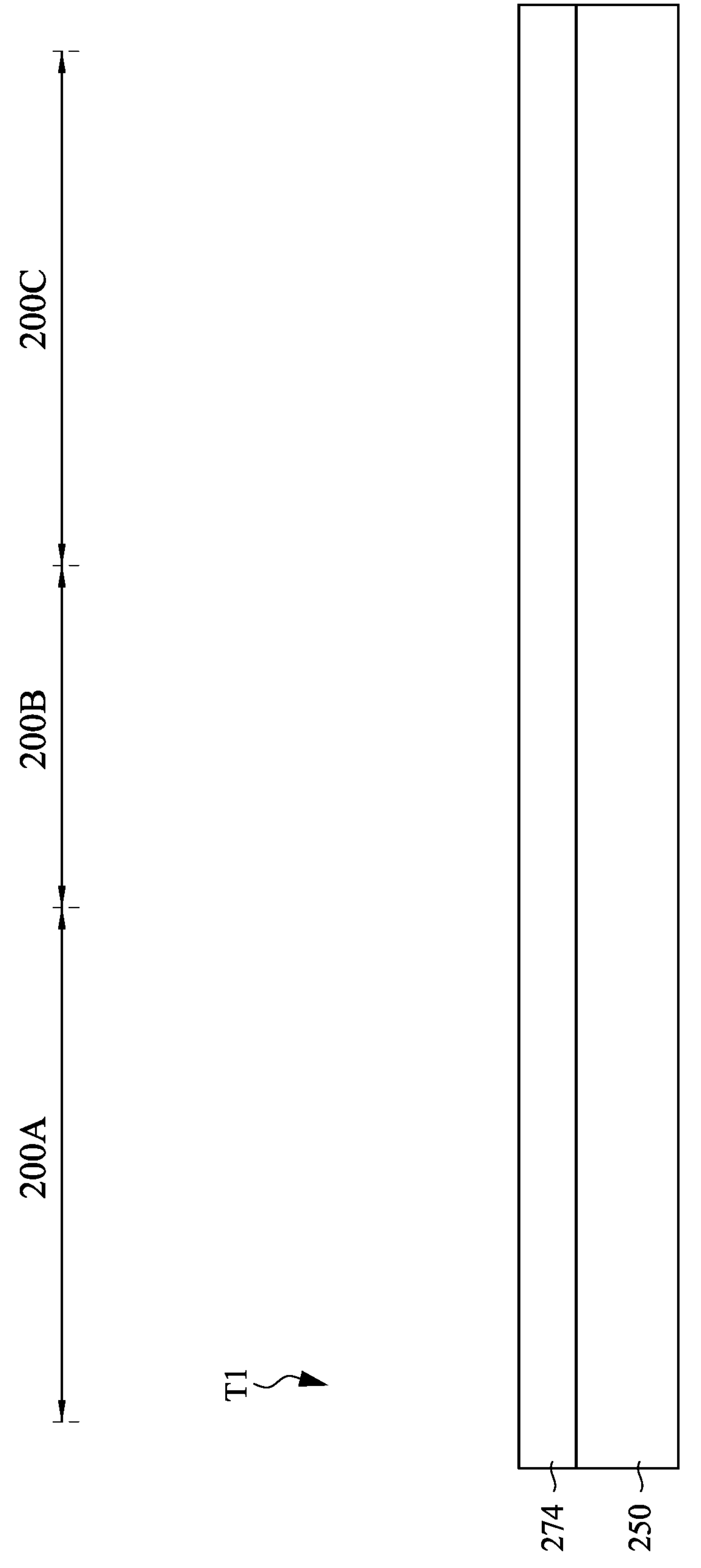

Reference is made to FIGS. 8A, 8B, and 8C. Isolation regions 274, such as shallow trench isolation (STI) regions, are formed over the substrate 250 and between adjacent fins 272. The isolation regions 274 are disposed around at least a portion of the fins 272 such that at least a portion of the first and second semiconductor sheets 310, 210 protrude from between adjacent isolation regions 274. In some embodiments, the top surfaces of the isolation regions 274 are coplanar (within process variations) with the top surfaces of the fins 272. In some embodiments, the top surfaces of the isolation regions 274 are above or below the top surfaces of the fins 272. The isolation regions 274 separate the features of adjacent devices.

The isolation regions 274 may be formed by any suitable method. For example, an insulation material can be formed over the substrate 250 and the first and second semiconductor sheets 310, 210, and between adjacent fins 272. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the first and second semiconductor sheets 310, 210. Although the isolation regions 274 are each illustrated as a single layer, some embodiments may utilize multiple layers. For example, in some embodiments a liner (not separately illustrated) may first be formed along surfaces of the substrate 250, the fins 272, and the first and second semiconductor sheets 310, 210. Thereafter, a fill material, such as those previously described may be formed over the liner.

A removal process is then applied to the insulation material to remove excess insulation material over the first and second semiconductor sheets 310, 210. In some embodiments, a planarization process such as a chemical mechanical polish (CMP), an etch-back process, combinations thereof, or the like may be utilized. In embodiments in which a mask remains on the first and second semiconductor sheets 310, 210, the planarization process may expose the mask or remove the mask. After the planarization process, the top surfaces of the insulation material and the mask (if present) or the first and second semiconductor sheets 310, 210 are coplanar (within process variations). Accordingly, the top surfaces of the mask (if present) or the first and second semiconductor sheets 310, 210 are exposed through the insulation material. In some embodiments, no mask remains on the first and second semiconductor sheets 310, 210. The insulation material is then recessed to form the isolation regions 274. The insulation material is recessed, such as in a range from about 30 nm to about 80 nm, such that at least a portion of the first and second semiconductor sheets 310, 210 protrude from between adjacent portions of the insulation material. Further, the top surfaces of the isolation regions 274 may have a flat surface as illustrated, a convex surface, a concave surface (such as dishing), or a combination thereof. The top surfaces of the isolation regions 274 may be formed flat, convex, and/or concave by an appropriate etch. The insulation material may be recessed using any acceptable etching process, such as one that is selective to the material of the insulation material (e.g., selectively etches the insulation material of the isolation regions 274 at a faster rate than the materials of the fins 272 and the first and second semiconductor sheets 310, 210). For example, an oxide removal may be performed using dilute hydrofluoric (dHF) acid.

The process previously described is just one example of how the fins 272 and the first and second semiconductor sheets 310, 210 may be formed. In some embodiments, the fins 272 and/or the first and second semiconductor sheets 310, 210 may be formed using a mask and an epitaxial growth process. For example, a dielectric layer can be formed over a top surface of the substrate 250, and trenches can be etched through the dielectric layer to expose the underlying substrate 250. Epitaxial structures can be epitaxially grown in the trenches, and the dielectric layer can be recessed such that the epitaxial structures protrude from the dielectric layer to form the fins 272 and/or the first and second semiconductor sheets 310, 210. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Figure 9A:
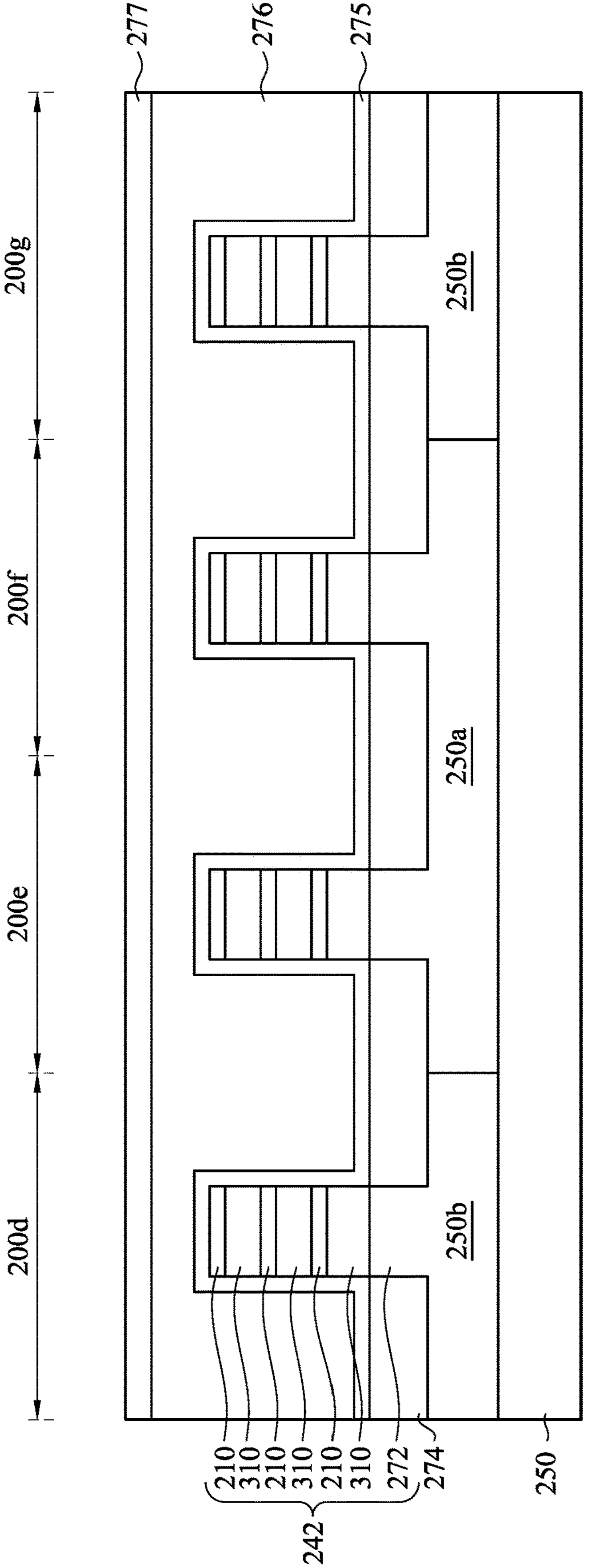
Figure 9B:
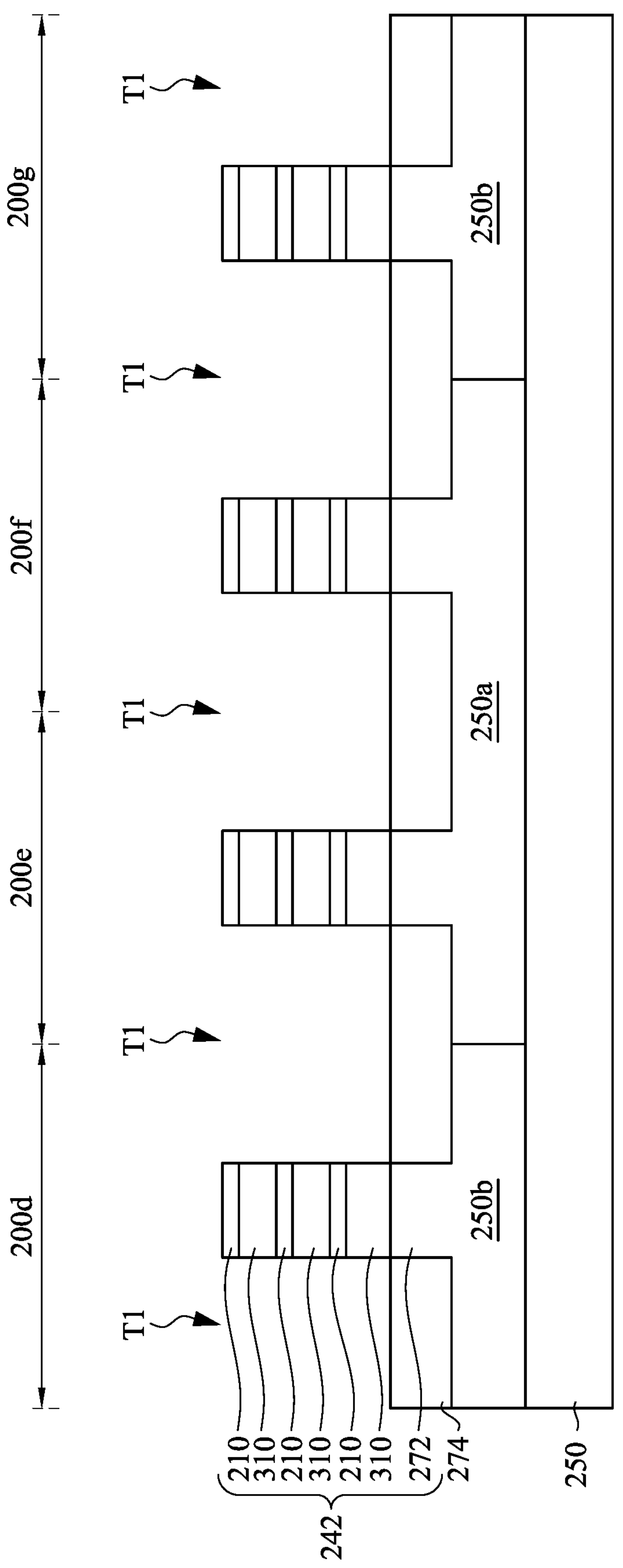
Figure 9C:
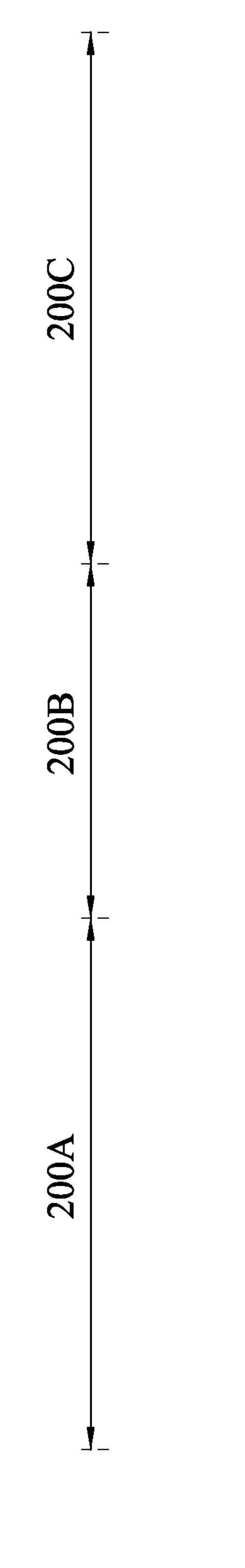
Figure 9C:
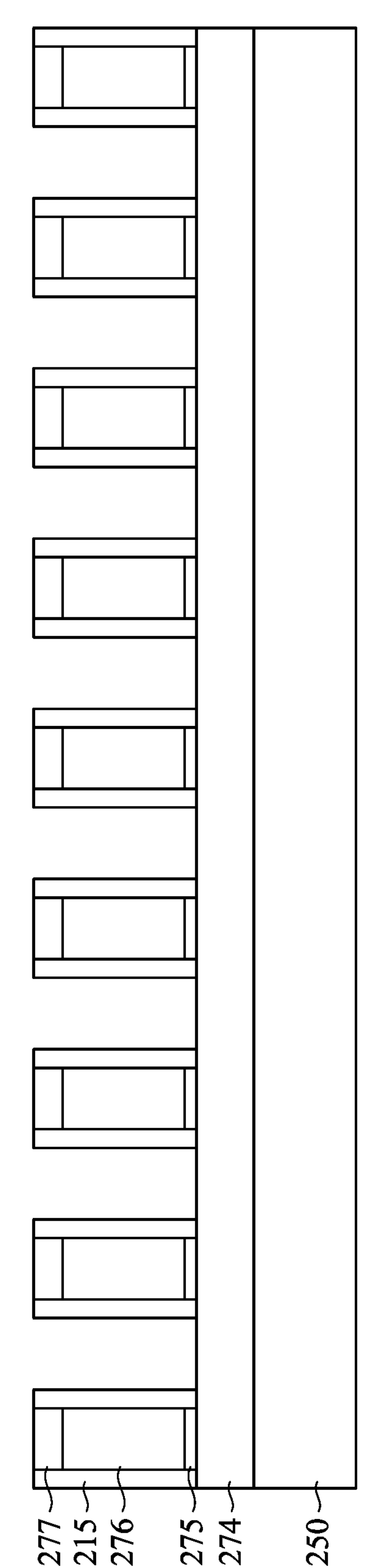

Reference is made to FIGS. 9A, 9B, and 9C. A dummy dielectric layer, a dummy gate layer, and a mask layer are sequentially formed on the fins 272 and the first and second semiconductor sheets 310, 210. The dummy dielectric layer is formed on the fins 272 and the first and second semiconductor sheets 310, 210. The dummy dielectric layer may be formed of a dielectric material such as silicon oxide, silicon nitride, a combination thereof, or the like, which may be deposited or thermally grown according to acceptable techniques. Subsequently, a dummy gate layer is formed over the dummy dielectric layer. Subsequently, a mask layer is formed over the dummy gate layer. The dummy gate layer may be deposited over the dummy dielectric layer and then planarized, such as by a CMP. The mask layer may be deposited over the dummy gate layer. The dummy gate layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer may be formed of material(s) that have a high etching selectivity from the etching of insulation materials, e.g., the isolation regions 274 and/or the dummy dielectric layer. The mask layer may be formed of a dielectric material such as silicon nitride, silicon oxynitride, or the like. In this example, the dummy gate layer and mask layer are formed across the device regions 200*d*, 200*e*, 200*f*, and 200*g* as shown in FIG. 2A. In some embodiments, the dummy dielectric layer covers the fins 272, the first and second semiconductor sheets 310, 210, and the isolation regions 274, such that the dummy dielectric layer extends over the isolation regions 274 and between the dummy gate layer and the isolation regions 274. In another embodiment, the dummy dielectric layer covers only the fins 272 and the first and second semiconductor sheets 310, 210.

The mask layer is patterned using acceptable photolithography and etching techniques to form masks 277. The pattern of the masks 277 is then transferred to the dummy gate layer by any acceptable etching technique to form dummy gates 276. The pattern of the masks 277 may optionally be further transferred to the dummy dielectric layer by any acceptable etching technique to form dummy dielectrics 275. The dummy gates 276 cover portions of the first and second semiconductor sheets 310, 210 that will be exposed in subsequent processing to form channel regions. Specifically, the dummy gates 276 extend along the portions of the second semiconductor sheets 210 that will be patterned to form channel regions. The pattern of the masks 277 may be used to physically separate adjacent dummy gates 276. The dummy gates 276 may also have lengthwise directions substantially perpendicular (within process variations) to the lengthwise directions of the fins 272. The masks 277 can optionally be removed after patterning, such as by any acceptable etching technique.

Gate spacers 215 are formed over the first and second semiconductor sheets 310, 210, on exposed sidewalls of the masks 277, the dummy gates 276, and the dummy dielectrics 275. In some embodiments, the gate spacers 215 can be interchangeably referred to top spacers or upper gate spacers. In some embodiments, the gate spacers 215 may have a lateral dimension in a range from about 4 nm to about 12 nm. In some embodiments, the gate spacer 215 may include multiple dielectric material and selected from a group consist of $SiO_2$, $Si_3N_4$, SiON, SiOC, SiOCN base dielectric material, carbon doped oxide, nitrogen doped oxide, porous oxide, air gap, or combinations thereof. The gate spacers 215 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 276 (thus forming the gate spacers 215).

Figure 10A:
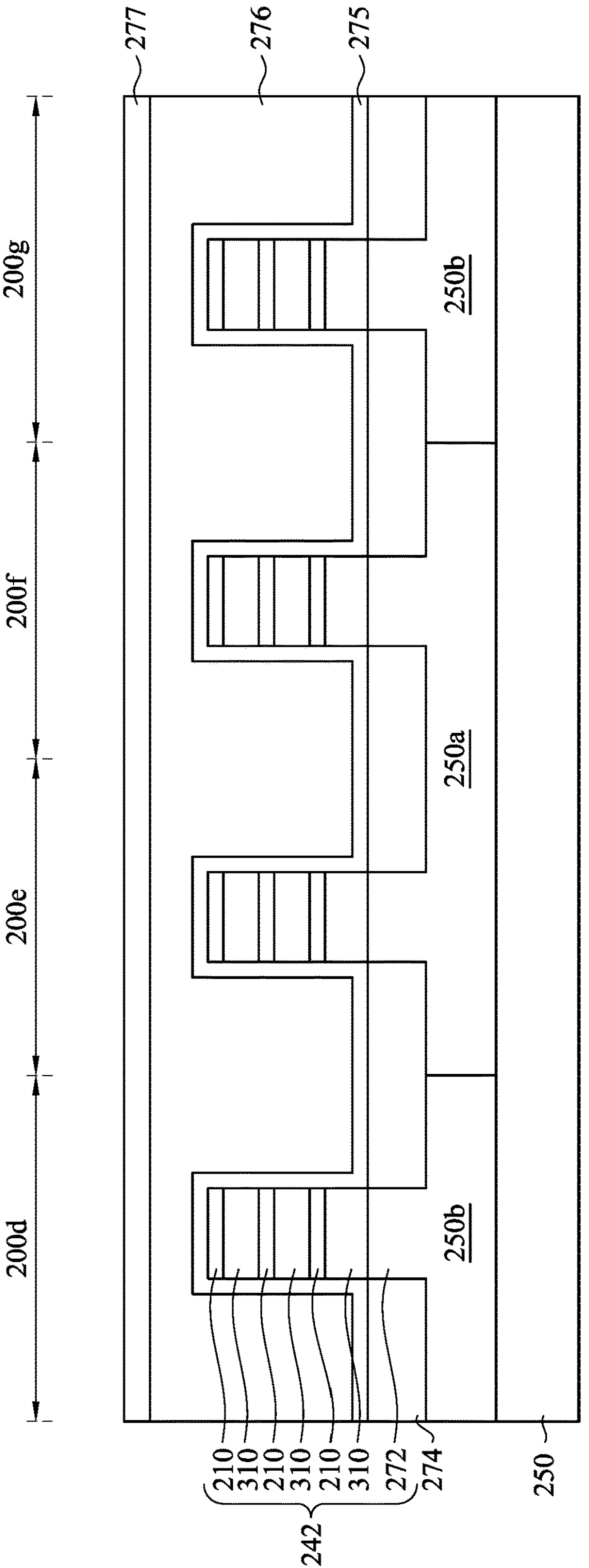
Figure 10B:
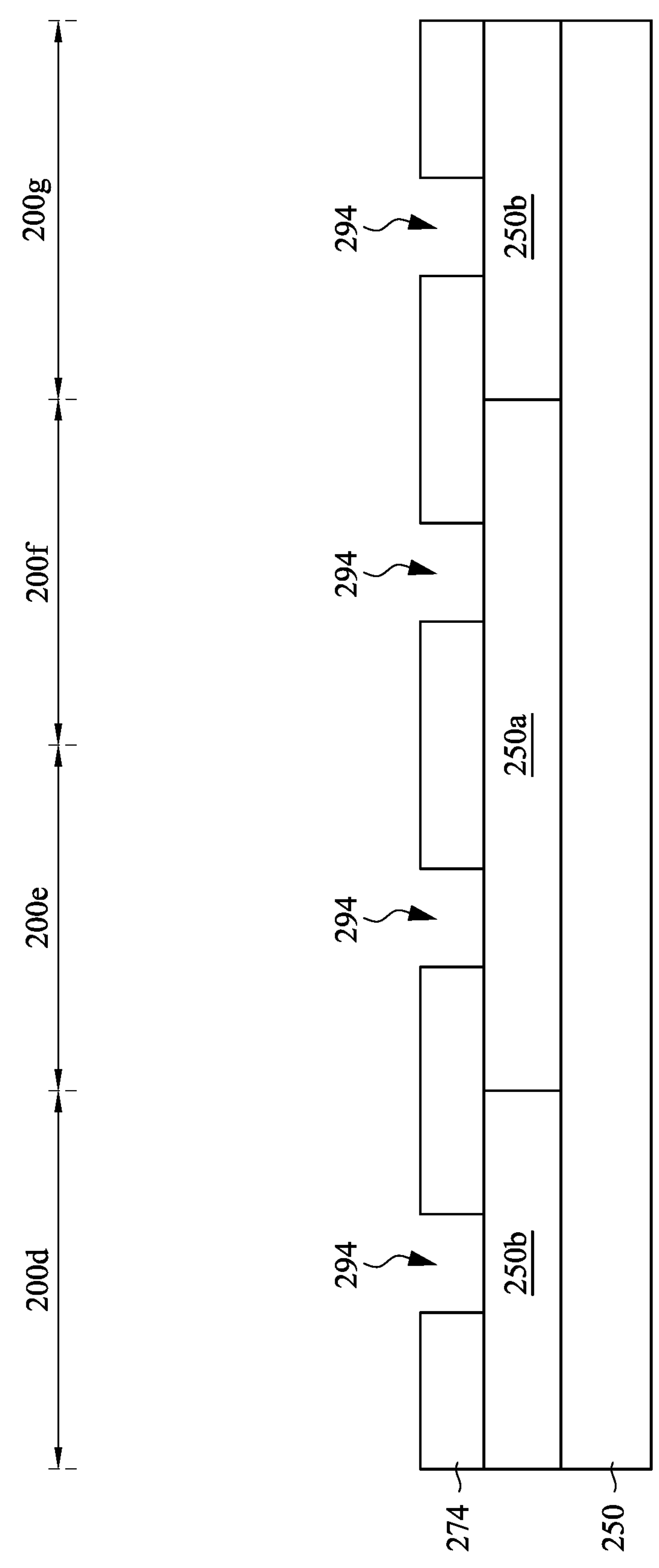
Figure 10C:
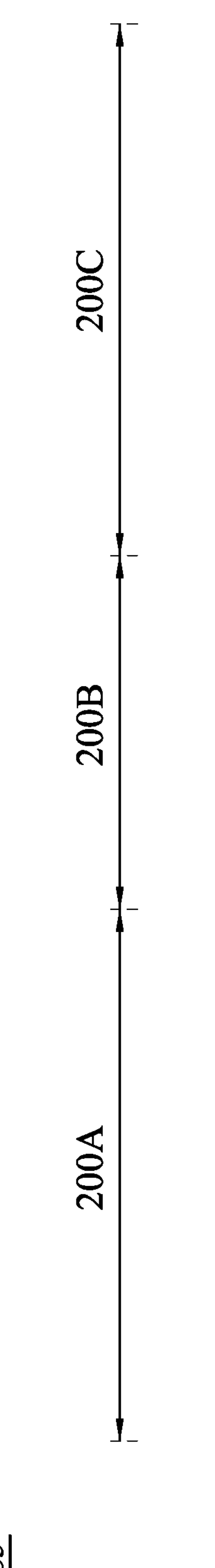
Figure 10C:
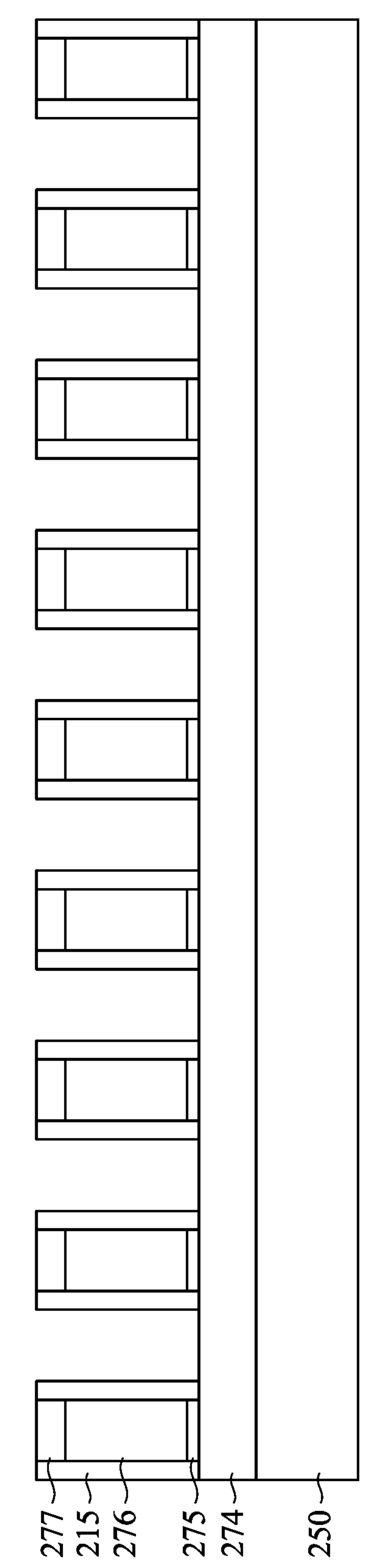

Reference is made to FIGS. 10A, 10B, and 10C. Source/drain recesses 294 (see FIG. 10B) are formed in the first and second semiconductor sheets 310, 210. In some embodiments, the source/drain recesses 294 extend through the first and second semiconductor sheets 310, 210 and into the fins 272. In some embodiments, the fins 272 may be etched such that bottom surfaces of the source/drain recesses 294 are disposed below the top surfaces of the isolation regions 274. The source/drain recesses 294 may be formed by etching the first and second semiconductor sheets 310, 210 using an anisotropic etching process, such as a RIE, a NBE, or the like. The gate spacers 215 and the dummy gates 276 collectively mask portions of the fins 272 and/or the first and second semiconductor sheets 310, 210 during the etching processes used to form the source/drain recesses 294. A single etch process may be used to etch each of the first and second semiconductor sheets 310, 210, or multiple etch processes may be used to etch the first and second semiconductor sheets 310, 210. Timed etch processes may be used to stop the etching of the source/drain recesses 294 after the source/drain recesses 294 reach a desired depth. Subsequently, as shown in FIG. 2E, inner spacers 216 are formed on sidewalls of the remaining portions of the first semiconductor sheets 310, e.g., those sidewalls exposed by the source/drain recesses 294. As will be subsequently described in greater detail, source/drain regions will be subsequently formed in the source/drain recesses 294, and the first semiconductor sheets 310 will be subsequently replaced with corresponding gate structures. The inner spacers 216 act as isolation features between the subsequently formed source/drain regions and the subsequently formed gate structures. Further, the inner spacers 216 may be used to substantially prevent damage to the subsequently formed source/drain regions by subsequent etching processes, such as etching processes used to subsequently remove the first semiconductor sheets 310. In some embodiments, the inner spacers 216 can be interchangeably referred to lower gate spacers. In some embodiments, the inner spacers 216 may have a lateral dimension in a range from about 4 nm to about 12 nm.

As an example to form the inner spacers 216 as shown in FIG. 2E, the source/drain recesses 294 (see FIG. 10B) can be laterally expanded. Specifically, portions of the sidewalls of the first semiconductor sheets 310 exposed by the source/drain recesses 294 may be recessed. Although sidewalls of the first semiconductor sheets 310 are illustrated as being straight, the sidewalls may be concave or convex. The sidewalls may be recessed by any acceptable etching process, such as one that is selective to the material of the first semiconductor sheets 310 (e.g., selectively etches the material of the first semiconductor sheets 310 at a faster rate than the material of the second semiconductor sheets 210). The etching may be isotropic. For example, when the second semiconductor sheets 210 are formed of silicon and the first semiconductor sheets 310 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 294 and recess the sidewalls of the first semiconductor sheets 310. The inner spacers 216 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. In some embodiments, the inner spacer 216 may have a higher K (dielectric constant) value than the gate spacer 215. In some embodiments, the material of inner spacer 216 is selected from a group including $SiO_2$, $Si_3N_4$, SiON, SiOC, SiOCN base dielectric material, air gap, carbon doped oxide, nitrogen doped oxide, porous oxide or combinations thereof. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 216 are illustrated as being flush with respect to the sidewalls of the gate spacers 215, the outer sidewalls of the inner spacers 216 may extend beyond or be recessed from the sidewalls of the gate spacers 215. In other words, the inner spacers 216 may partially fill, completely fill, or overfill the sidewall recesses. Moreover, although the sidewalls of the inner spacers 216 are illustrated as being straight, the sidewalls of the inner spacers 216 may be concave or convex.

Figure 11A:
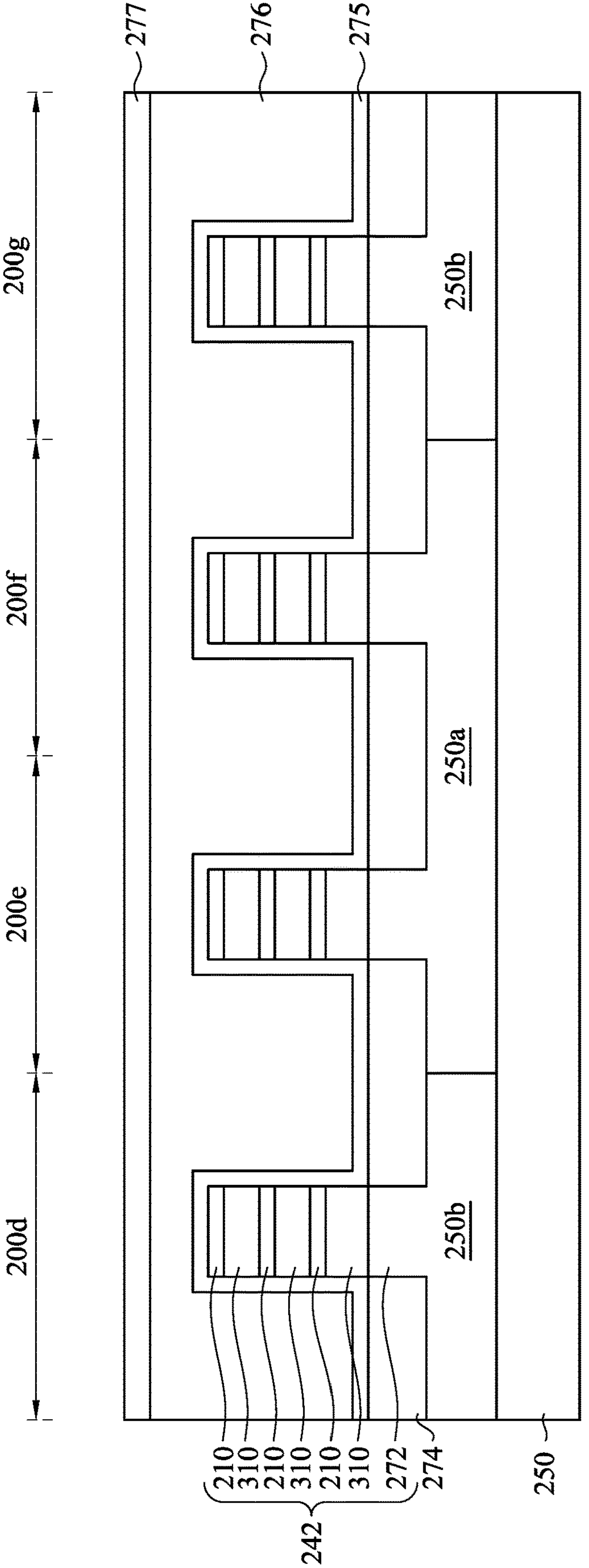
Figure 11B:
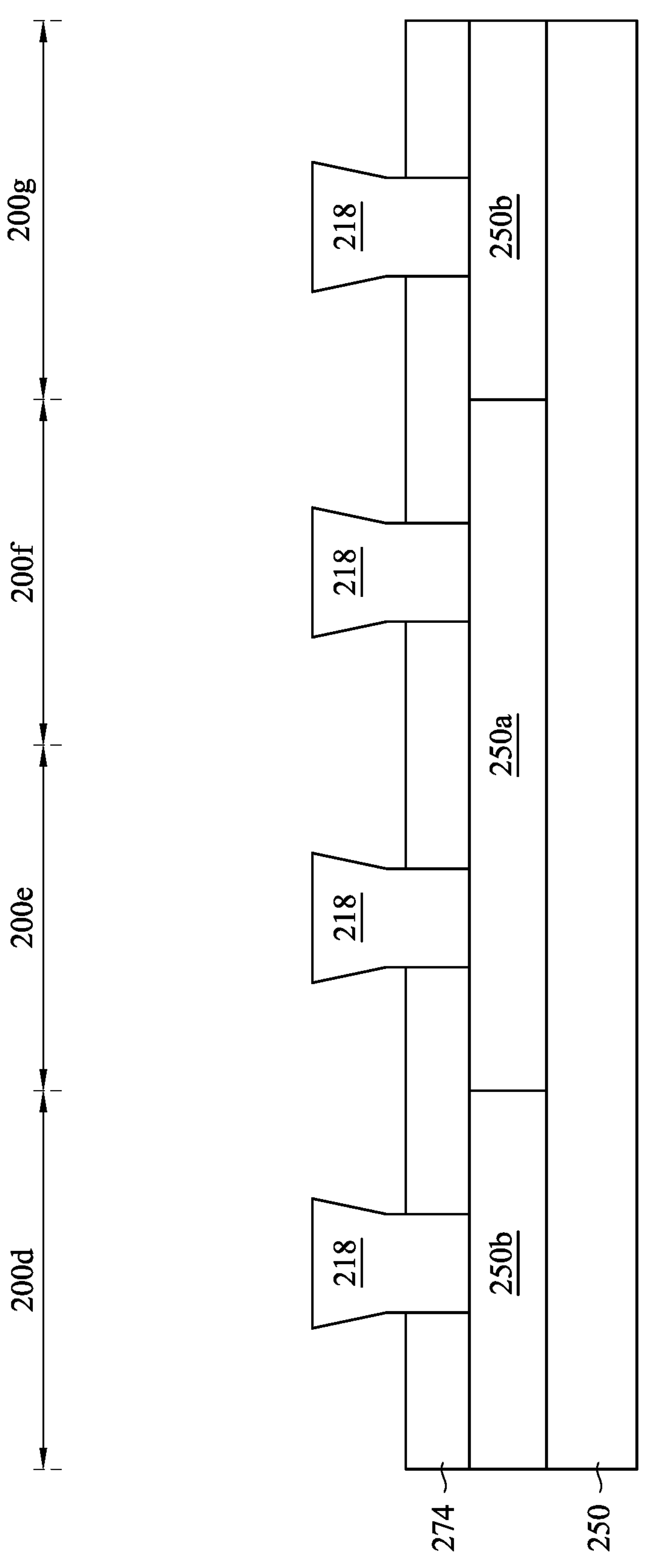
Figure 11C:
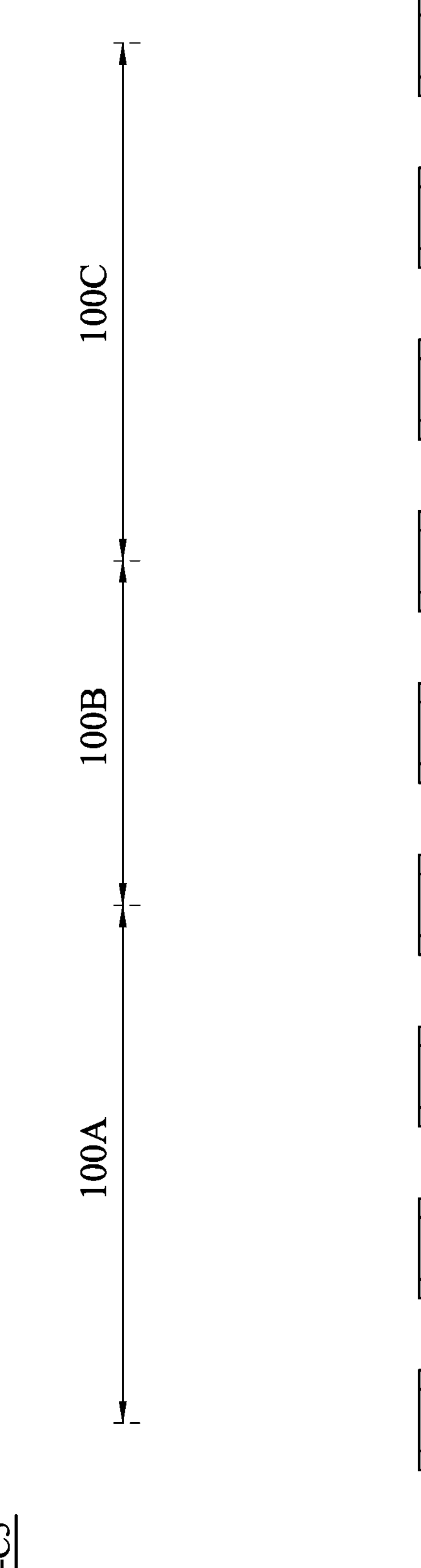
Figure 11C:
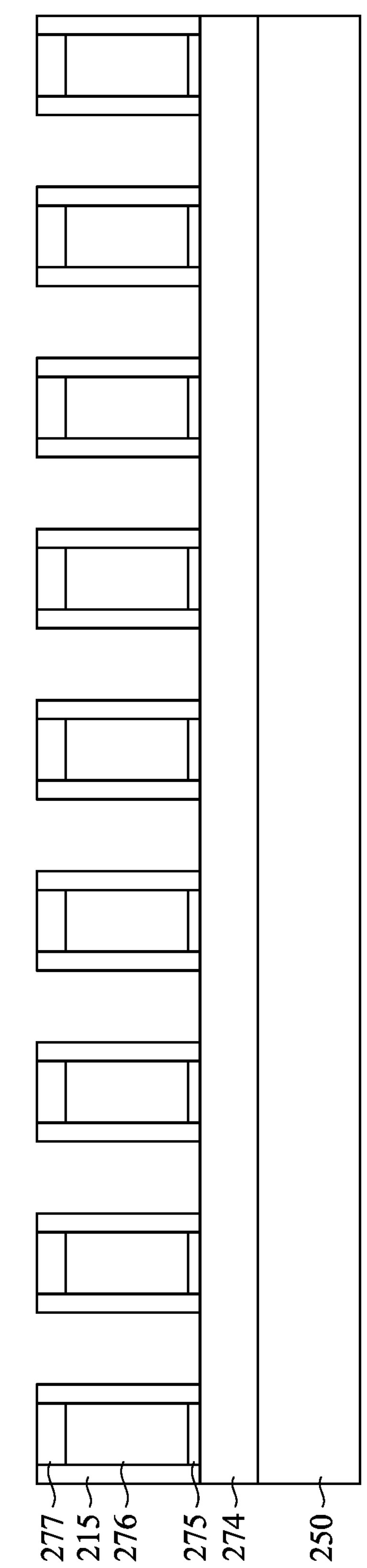

Reference is made to FIGS. 11A, 11B, and 11C. Epitaxial source/drain regions 218 (see FIG. 11B) are formed in the source/drain recesses 294, such that each dummy gate 276 (and corresponding channel regions) is disposed between respective adjacent pairs of the epitaxial source/drain regions 218. In some embodiments, the gate spacers 215 (see FIGS. 2A and 2E) and the inner spacers 216 (see FIG. 2E) are used to separate the epitaxial source/drain regions 218 from, respectively, The dummy gates 276 and the first semiconductor sheets 310 by an appropriate lateral distance so that the epitaxial source/drain regions 218 do not short out with subsequently formed gates of the resulting nano-FETs. A material of the epitaxial source/drain regions 218 may be selected to exert stress in the respective channel regions, thereby improving performance.

The epitaxial source/drain regions 218 in the device regions 200*d* and 200*g* may be formed by masking the device regions 200*e* and 200*f*. Then, the epitaxial source/drain regions 218 in the device regions 200*d* and 200*g* are epitaxially grown in the source/drain recesses 294 in the device regions 200*d* and 200*g*. The epitaxial source/drain regions 218 may include any acceptable material appropriate for n-type devices. For example, the epitaxial source/drain regions 218 in the device regions 200*d* and 200*g* may include materials exerting a tensile strain on the channel regions, such as silicon, silicon carbide, phosphorous doped silicon carbide, silicon phosphide, or the like. The epitaxial source/drain regions 218 in the device regions 200*d* and 200*g* may be referred to as "n-type source/drain regions." The epitaxial source/drain regions 218 in the device regions 200*d* and 200*g* may have surfaces raised from respective surfaces of the fins 272 and the first and second semiconductor sheets 310, 210, and may have facets.

The epitaxial source/drain regions 218 in the device regions 200*e* and 200*f* may be formed by masking the device regions 200*d* and 200*g*. Then, the epitaxial source/drain regions 218 in the device regions 200*e* and 200*f* are epitaxially grown in the source/drain recesses 294 in the device regions 200*e* and 200*f*. The epitaxial source/drain regions 218 may include any acceptable material appropriate for p-type devices. For example, the epitaxial source/drain regions 218 in the device regions 200*e* and 200*f* may include materials exerting a compressive strain on the channel regions, such as silicon germanium, boron doped silicon germanium, germanium, germanium tin, or the like. The epitaxial source/drain regions 218 in the device regions 200*e* and 200*f* may be referred to as "p-type source/drain regions." The epitaxial source/drain regions 218 in the device regions 200*e* and 200*f* may have surfaces raised from respective surfaces of the fins 272 and the first and second semiconductor sheets 310, 210, and may have facets.

Figure 12A:
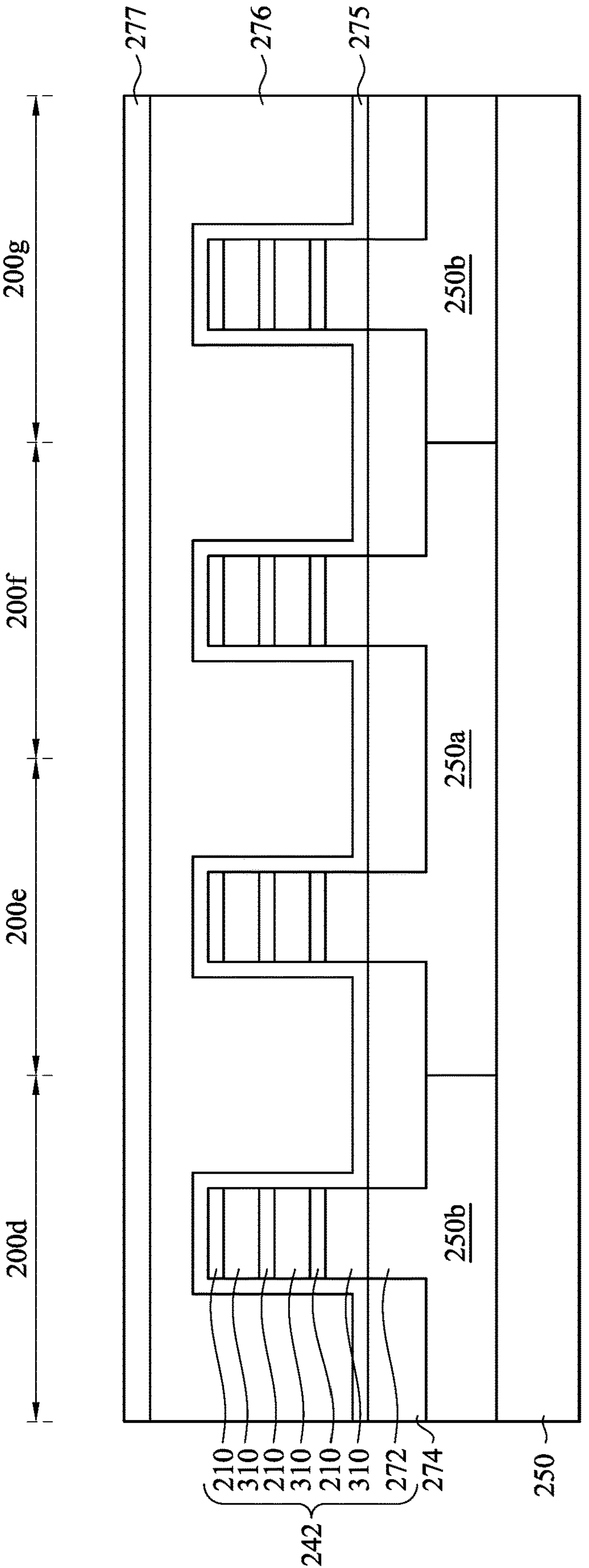
Figure 12B:
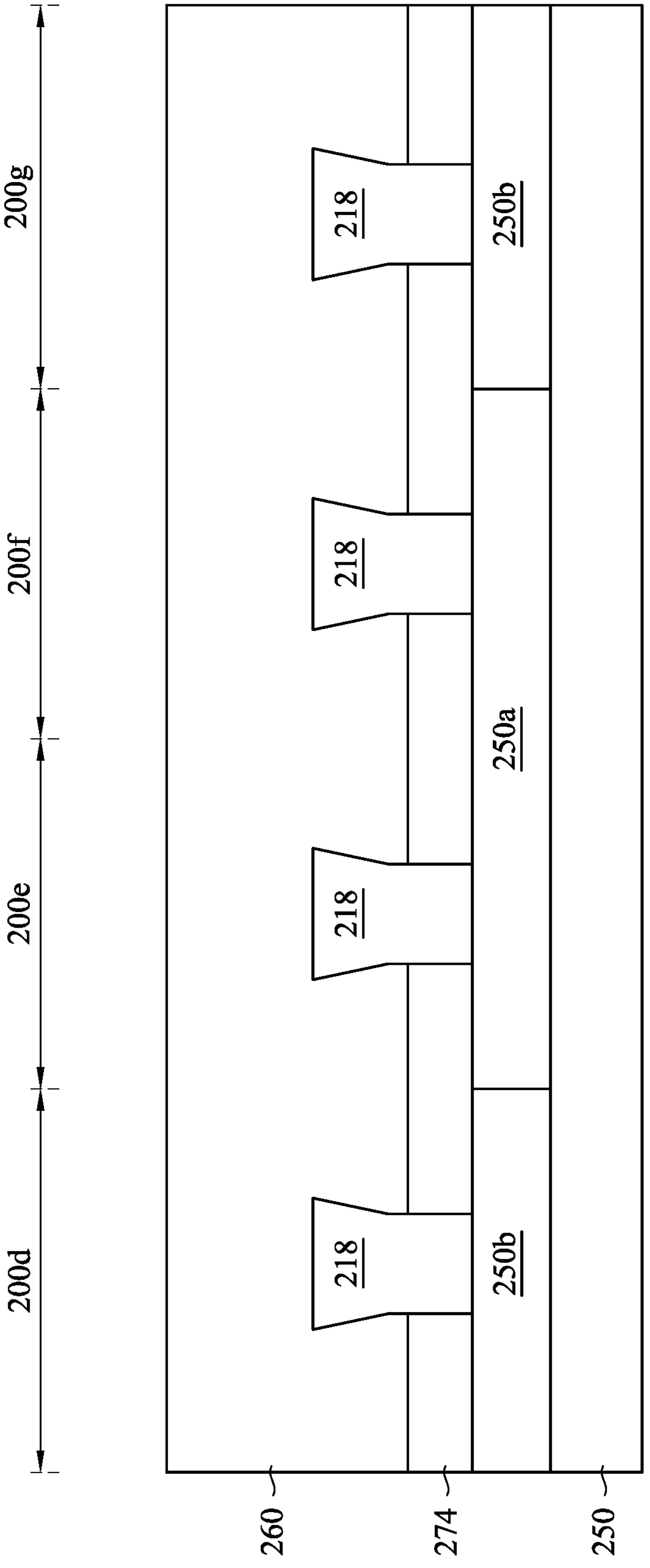
Figure 12C:
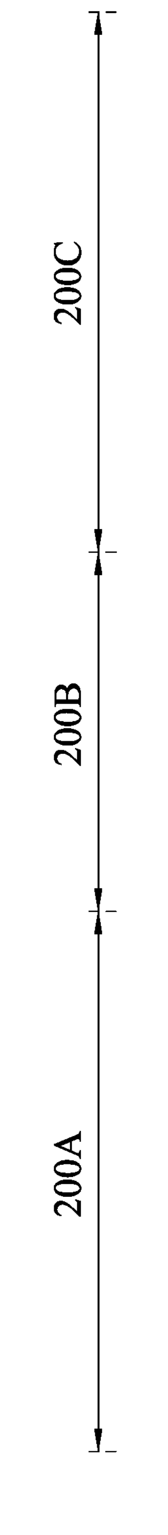
Figure 12C:
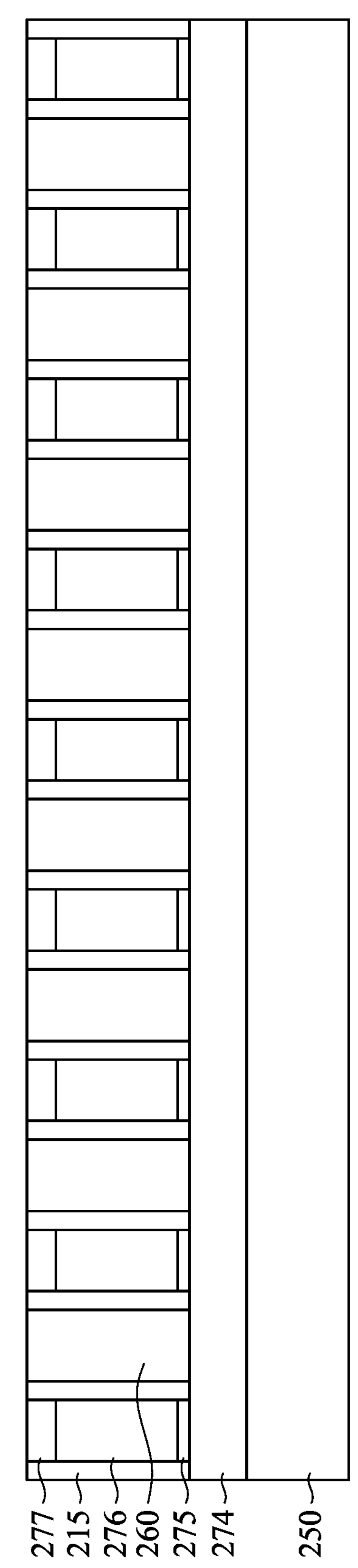

Reference is made to FIGS. 12A, 12B, and 12C. An inter-layer dielectric (ILD) layer 260 is deposited over the epitaxial source/drain regions 218, the gate spacers 215, the masks 277 (if present) or the dummy gates 276. The ILD layer 260 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the ILD layer 260 and the epitaxial source/drain regions 218, the gate spacers 215, and the masks 277 (if present) or the dummy gates 276. The CESL may be formed of a dielectric material, such as silicon nitride, silicon oxide, silicon oxynitride, or the like, having a high etching selectivity from the etching of the ILD layer 260. The CESL may be formed by any suitable method, such as CVD, ALD, or the like.

Subsequently, a removal process is performed to level the top surfaces of the ILD layer 260 with the top surfaces of the masks 277 (if present) or the dummy gates 276. In some embodiments, a planarization process such as a chemical mechanical polish (CMP), an etch-back process, combinations thereof, or the like may be utilized. The planarization process may also remove the masks 277 on the dummy gates 276, and portions of the gate spacers 215 along sidewalls of the masks 277. After the planarization process, the top surfaces of the gate spacers 215, the ILD layer 260, the CESL, and the masks 277 (if present) or the dummy gates 276 are coplanar (within process variations). Accordingly, the top surfaces of the masks 277 (if present) or the dummy gates 276 are exposed through the ILD layer 260. In some embodiments, the masks 277 remain, and the planarization process levels the top surfaces of the ILD layer 260 with the top surfaces of the masks 277.

Figure 13A:
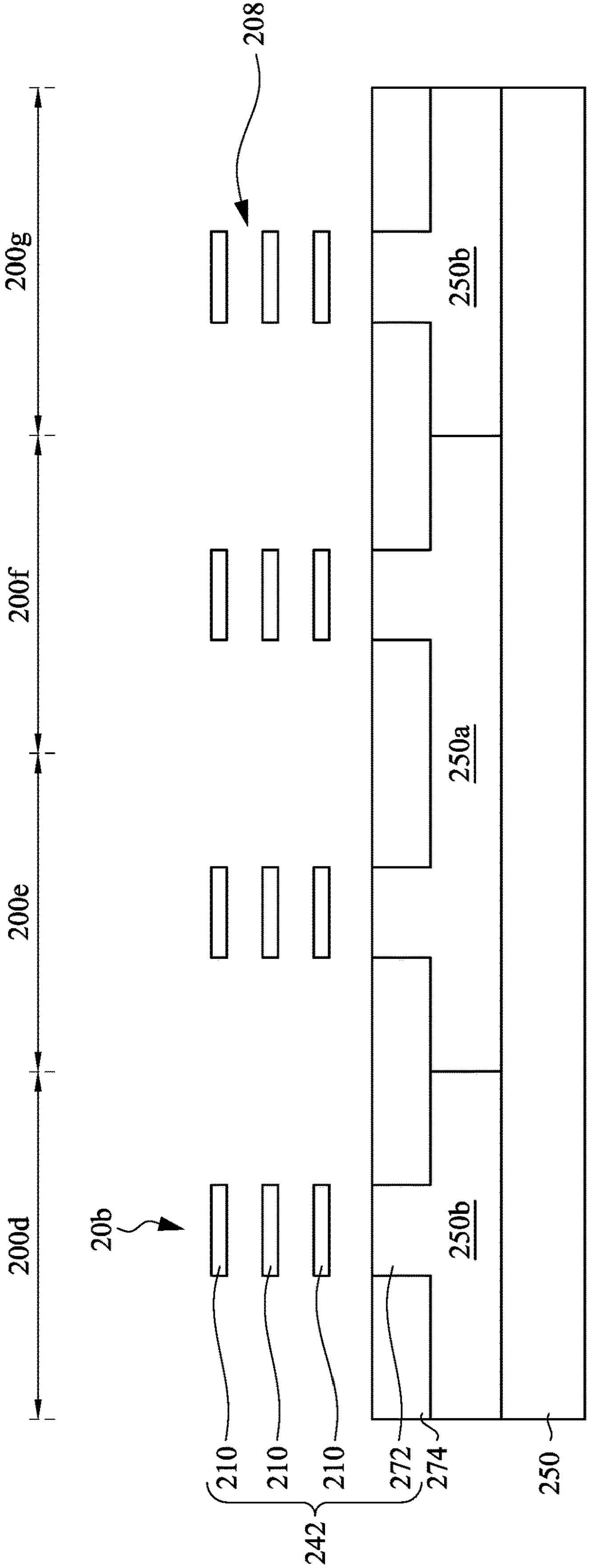
Figure 13B:
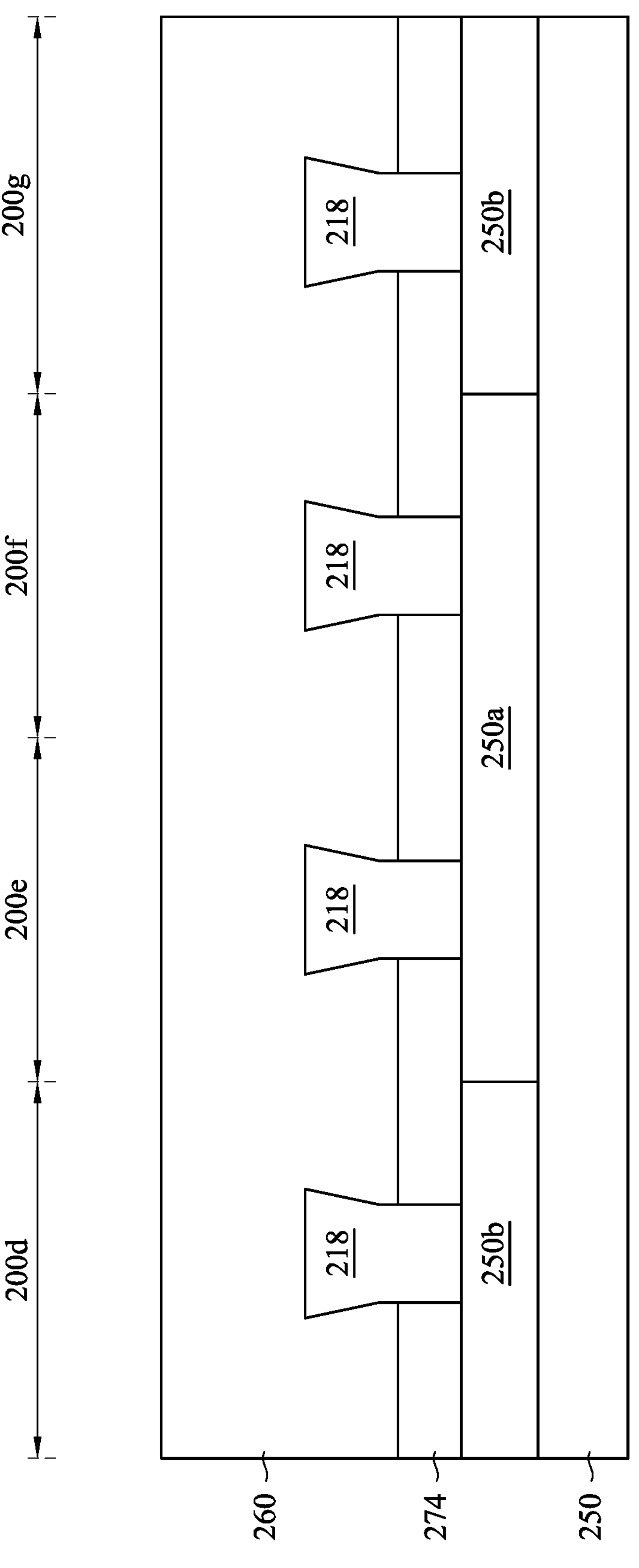
Figure 13C:
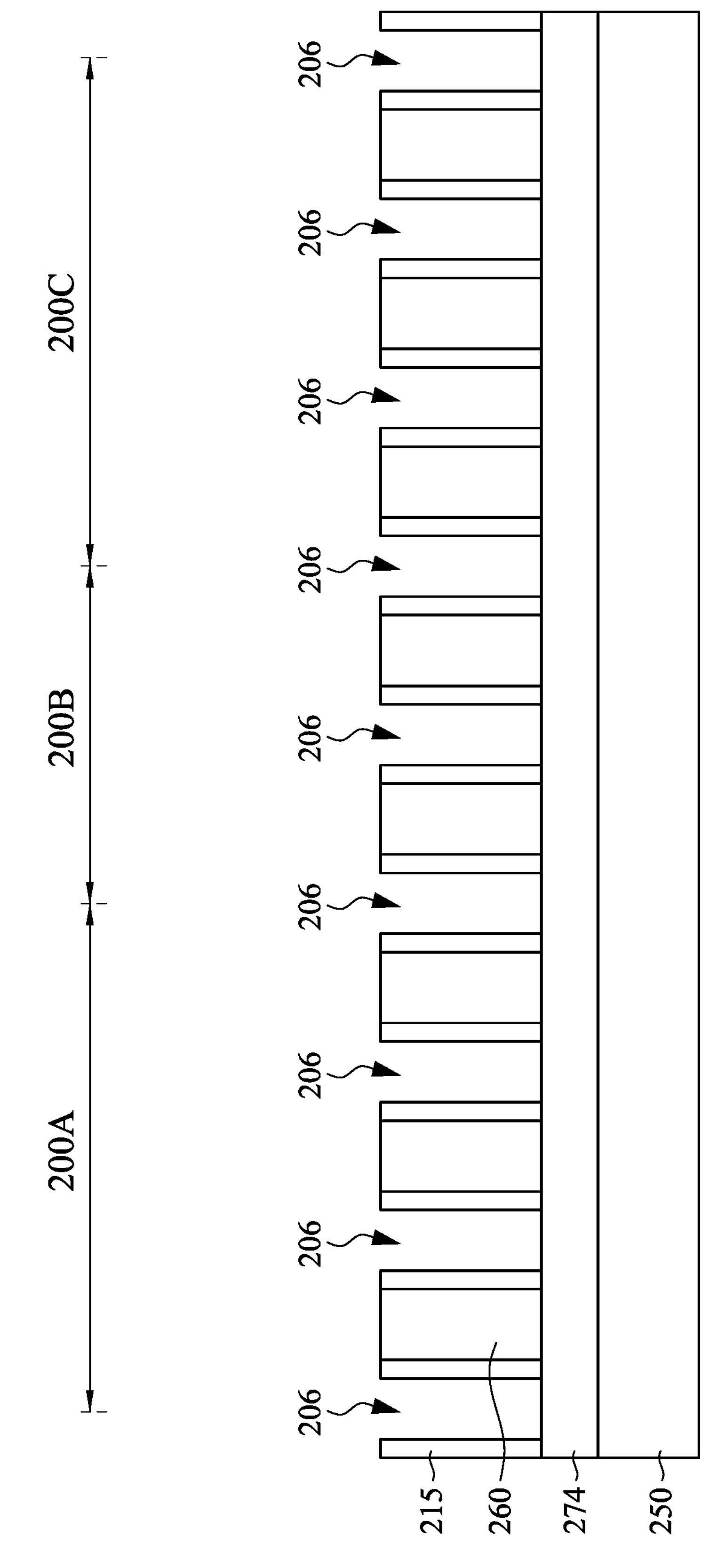

Reference is made to FIGS. 13A, 13B, and 13C. The masks 277 (if present) and the dummy gates 276 are removed in an etching process, so that recesses 206 are formed. Portions of the dummy dielectrics 275 in the recesses 206 are also removed. In some embodiments, the dummy gates 276 are removed by an anisotropic dry etch process. For example, the etching process may include a dry etch process using reaction gas(es) that selectively etch the dummy gates 276 at a faster rate than the ILD layer 260 or the gate spacers 215. During the removal, the dummy dielectrics 275 may be used as etch stop layers when the dummy gates 276 are etched. The dummy dielectrics 275 are then removed. Each recess 206 exposes and/or overlies portions of the channel regions. Portions of the second semiconductor sheets 210 which act as the channel regions are disposed between adjacent pairs of the epitaxial source/drain regions 218.

The remaining portions of the first semiconductor sheets 310 are then removed to expand the recesses 206 (see FIGS. 13A and 13C), such that openings 208 (see FIG. 13A) are formed in regions between the second semiconductor sheets 210. The remaining portions of the first semiconductor sheets 310 can be removed by any acceptable etching process that selectively etches the material of the first semiconductor sheets 310 at a faster rate than the material of the second semiconductor sheets 210. The etching may be isotropic. For example, when the first semiconductor sheets 310 are formed of silicon germanium and the second semiconductor sheets 210 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second semiconductor sheets 210. In some embodiments, the removing of the remaining portions of the first semiconductor sheets 310 can be interchangeably referred to as a channel releasing process. The second semiconductor sheets 210 can be interchangeably referred to as a vertically stacked multiple channels (sheets) and may have a vertically sheet pitch within a range of from about 10 nm to about 30 nm. In some embodiments, the second semiconductor sheets 210 may have a thickness within a range from about 4 nm to about 10 nm. In some embodiments, the vertically sheet pitch of the between adjacent two of the second semiconductor sheets 210 may be within a range from about 6 to about 20 nm.

Figure 14A:
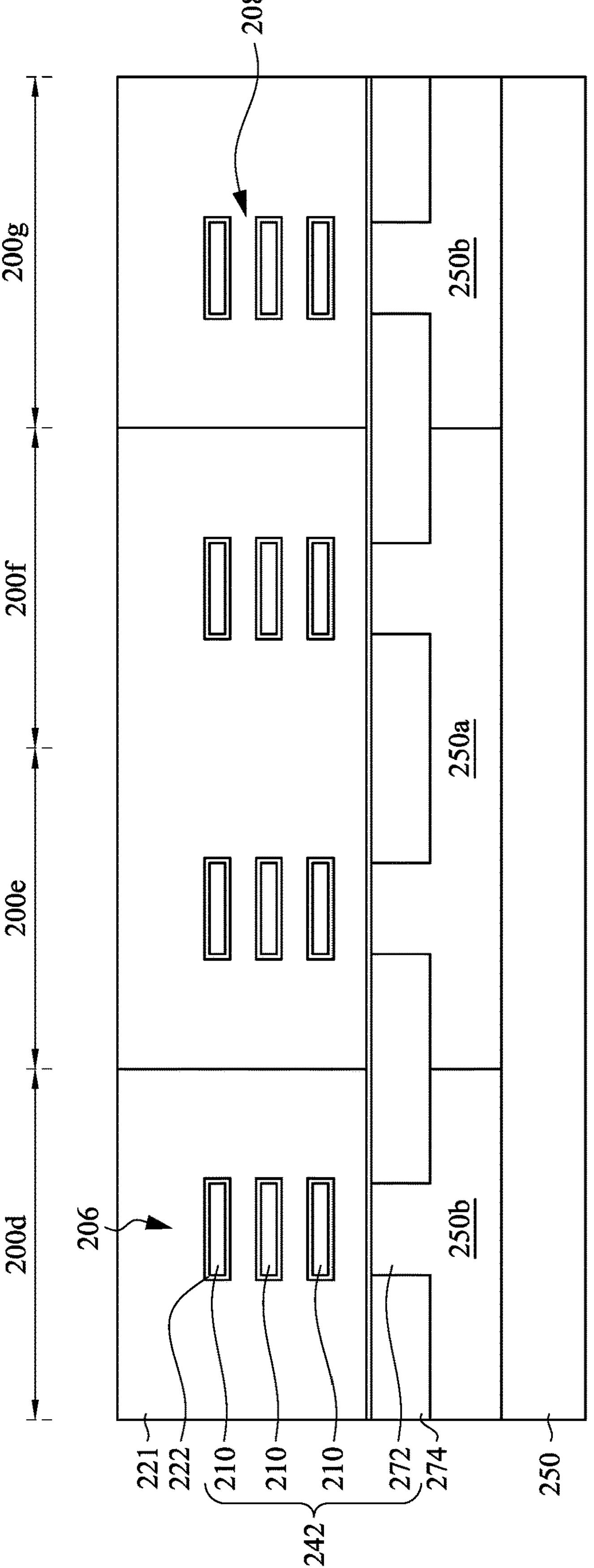
Figure 14B:
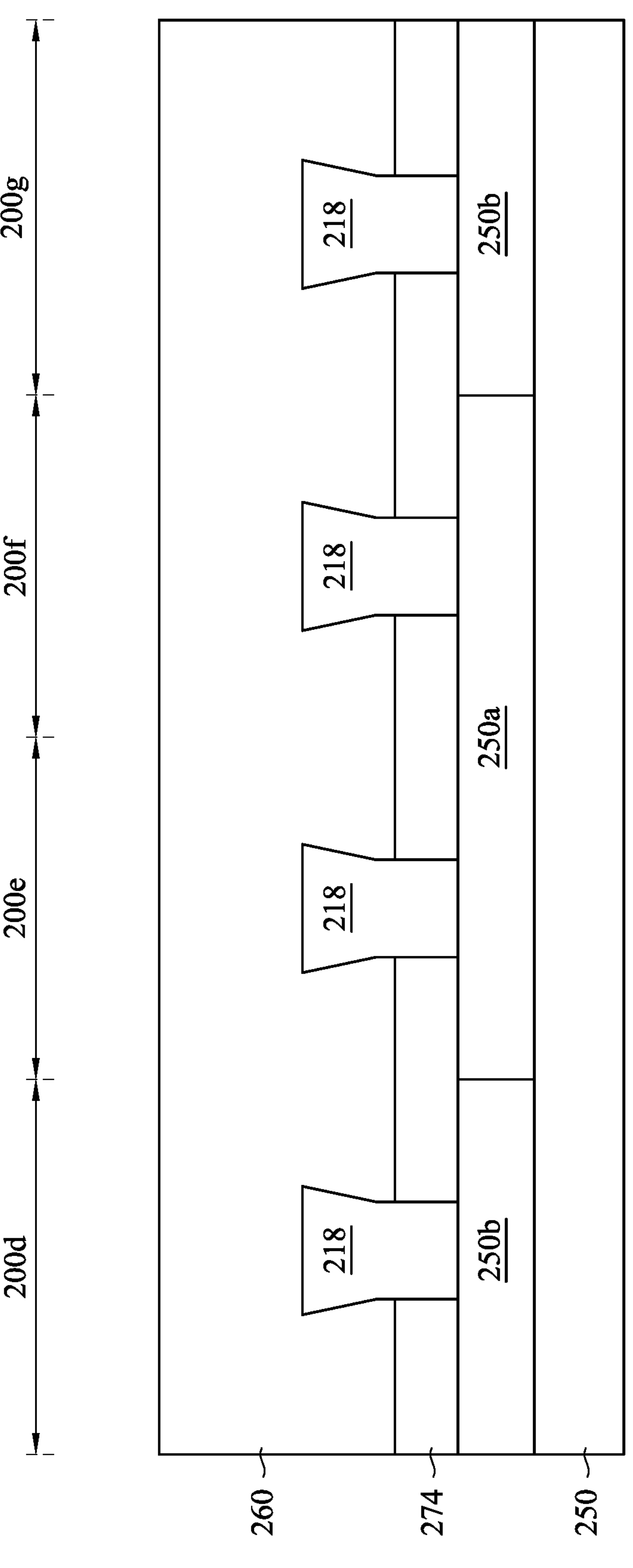
Figure 14C:
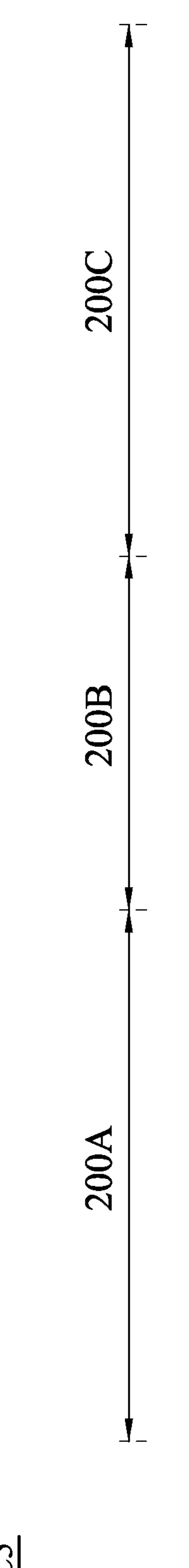
Figure 14C:
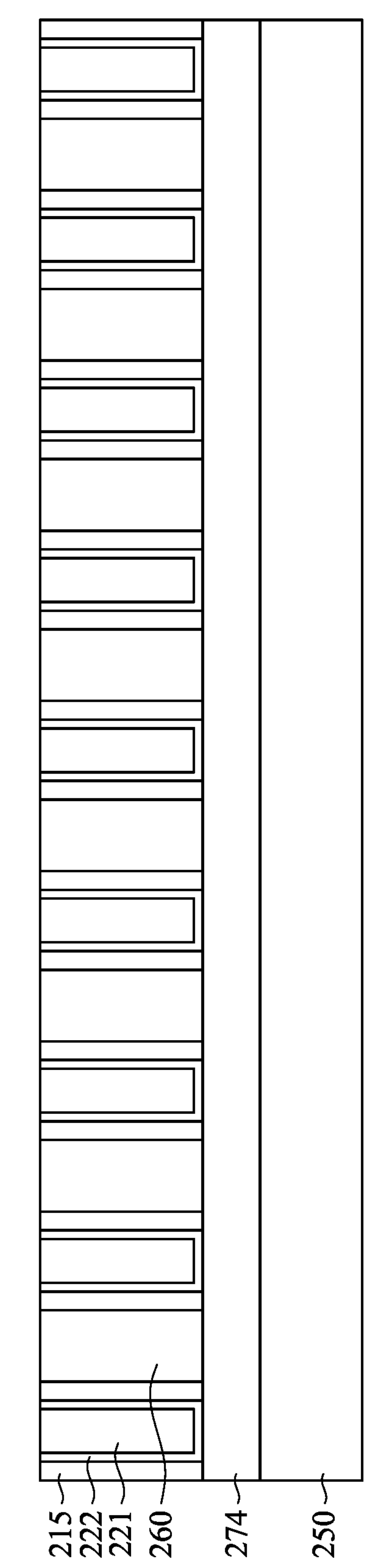

Reference is made to FIGS. 14A, 14B, and 14C. Gate structures are formed to wrap around the second semiconductor sheets 210 (see FIG. 14C). A gate dielectric layer 222 (see FIGS. 14A and 14C) is formed in the recesses 206. Gate electrode layers 221 (see FIGS. 14A and 14C) are formed on the gate dielectric layer 222. The gate dielectric layer 222 and the gate electrode layers 221 are layers for replacement gates, and each wrap around all (e.g., four) sides of the second semiconductor sheet 210. In some embodiments, the gate structure can be interchangeably referred to as a gate strip or a gate pattern.

The gate dielectric layer 222 is disposed on the sidewalls and/or the top surfaces of the fins 272 (see FIG. 14A); on the top surfaces, the sidewalls, and the bottom surfaces of the second semiconductor sheets 210 (see FIG. 14A); and on the sidewalls of the gate spacers 215 (see FIG. 14C). The gate dielectric layer 222 may include an oxide such as silicon oxide or a metal oxide, a silicate such as a metal silicate, combinations thereof, multi-layers thereof, or the like. The gate dielectric layer 222 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 222 is illustrated in FIGS. 14A and 14C, as will be subsequently described in greater detail, the gate dielectric layer 222 may include any number of interfacial layers and any number of main layers.

The gate electrode layers 221 may include a metal-containing material such as titanium nitride, titanium oxide, tungsten, cobalt, ruthenium, aluminum, combinations thereof, multi-layers thereof; or the like. Although a single-layered gate electrode layer 221 is illustrated in FIGS. 14A and 14C, as will be subsequently described in greater detail, the gate electrode layer 222 may include any number of work function tuning layers, any number of barrier layers, any number of glue layers, and a fill material. In some embodiments, the gate electrode layers 221 may be made of a material selected from a group including TIN, TaN, TiAl, TiAlN, TaAl, TaAlN, TaAlC, TaCN, WNC, Co, Ni, Pt, W, or combinations thereof.

The formation of the gate dielectric layers 222 in the device regions 200*d* and 200*g* and the device regions 200*e* and 200*f* (see FIG. 14A) may occur simultaneously such that the gate dielectric layers 112 in each region are formed of the same materials, and the formation of the gate electrode layers 221 may occur simultaneously such that the gate electrode layers 221 in each region are formed of the same materials. In some embodiments, the gate dielectric layers 231 in each region may be formed by distinct processes, such that the gate dielectric layers 231 may be different materials and/or have a different number of layers, and/or the gate electrode layers 221 in each region may be formed by distinct processes, such that the gate electrode layers 221 may be different materials and/or have a different number of layers. Various masking steps may be used to mask and expose appropriate regions when using distinct processes. In the following description, at least portions of the gate electrode layers 221 (see FIG. 14A) in the device regions 200*d* and 200*g* and the gate electrode layers 221 in the device regions 200*e* and 200*f* are formed separately to have different conductivity type. By way of example but not limiting the present disclosure, the gate electrode layers 221 formed in the device regions **200*d* and 200*g* may be an N-type gate electrode, and the gate electrode layers 221 formed in the device regions 200*e* and 200*f*** may be a P-type gate electrode.

Subsequently, a removal process is performed to remove the excess portions of the materials of the gate dielectric layer 222 and the gate electrode layers 221, which excess portions are over the top surfaces of the ILD layer 260 and the gate spacers 215, thereby forming gate dielectric layer 222 and gate electrode layers 221. In some embodiments, a planarization process such as a chemical mechanical polish (CMP), an etch-back process, combinations thereof, or the like may be utilized. The gate dielectric layer 222, when planarized, has portions left in the recesses 206 (thus forming the gate dielectric layer 222). The gate electrode layers 221, when planarized, has portions left in the recesses 206 (thus forming the gate electrode layers **220*a* through 220*c*). The top surfaces of the gate spacers 215; the CESL (not shown); the ILD layer 260; the gate dielectric layer 222, and the gate electrodes are coplanar (within process variations). The gate dielectric layer 222 and the gate electrode layers 221 form replacement gates of the resulting nano-FETs. Each respective pair of a gate dielectric layer 222 and a gate electrode layers 220*a*, 220*b*, 220*c*, 220*d*, 220*e*, or 220*f* may be collectively referred to as a "gate structure." The gate structures each extend along top surfaces, sidewalls, and bottom surfaces of a channel region of the second semiconductor sheet 210. In some embodiments, the gate electrode layers 221** each have a gate length in a range from about 6 nm to about 20 nm.

Figure 15A:
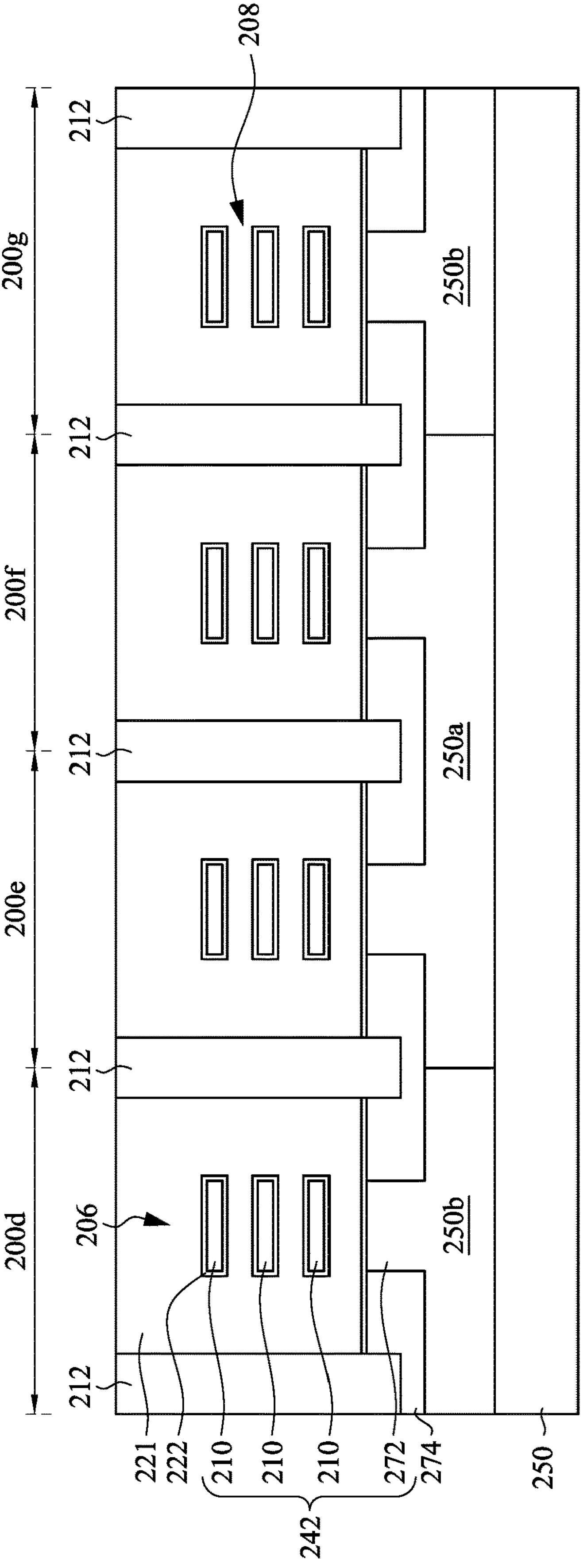
Figure 15B:
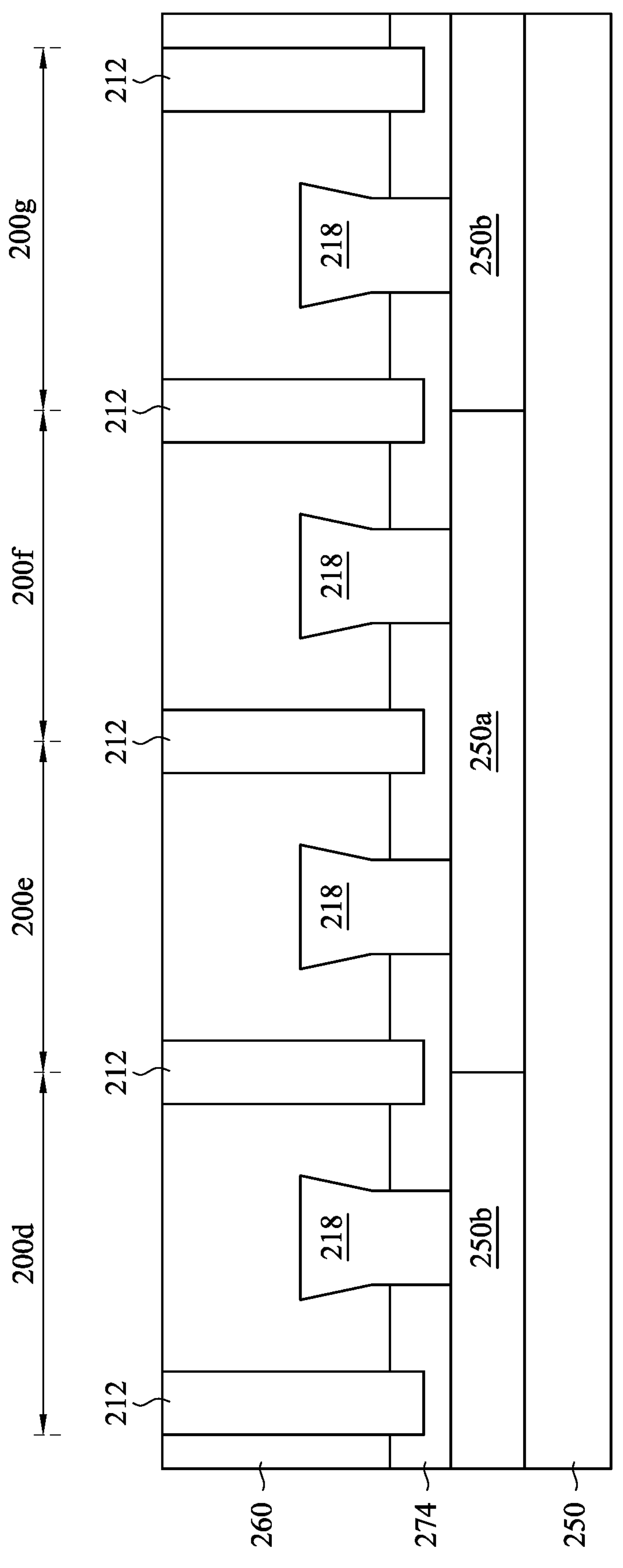
Figure 15C:
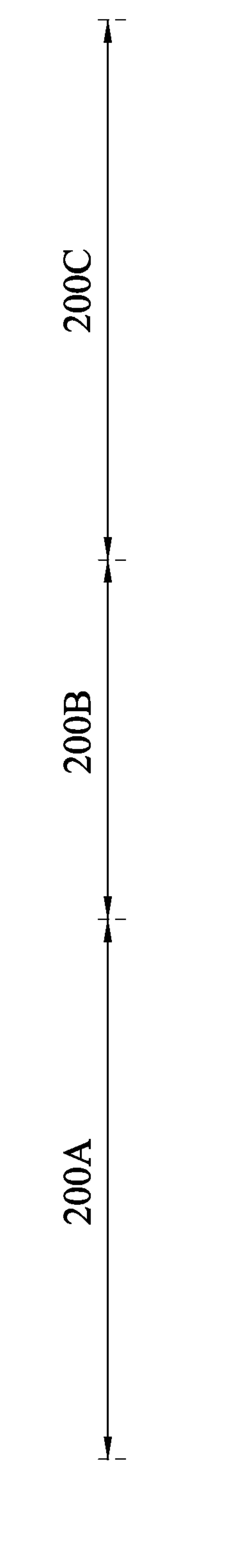
Figure 15C:
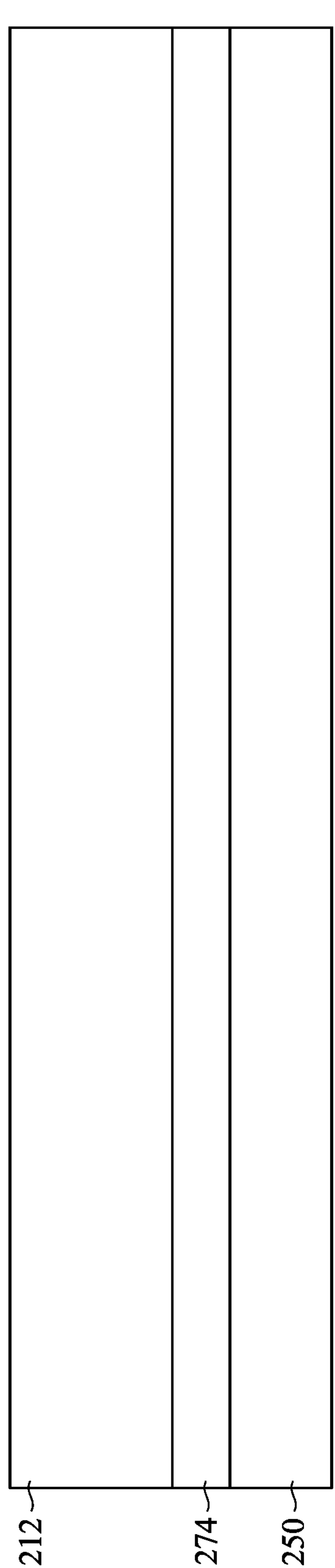

Reference is made to FIGS. 15A, 15B, and 15C. The isolation lines 212 are formed on boundaries of the device regions **200*d*, 200*e*, 200*f*, 200*g* and having longitudinal axes perpendicular to lengthwise directions of the gate electrodes 221. In some embodiments, each isolation line 212 is a gate-cut structure for the gate structure, and the gate-cut structure is formed by a cut metal gate (CMG) process. In some embodiments, the isolation line 212 can be interchangeably referred to gate end dielectrics, isolation structure or isolation strip, or dielectric regions in the logic circuit 200. Specifically, Portions of the gate electrodes 221 and the gate dielectric layer 222 on the boundaries of the device regions 200*d*, 200*e*, 200*f*, 200*g* are removed to form gate trenches with the gate spacers 215 as their sidewalls. The portions of the gate electrodes 221 and the gate dielectric layer 222 on the boundaries of the device regions 200*d*, 200*e*, 200*f*, 200*g* may be removed by dry etching, wet etching, or a combination of dry and wet etching. For example, a wet etching process may include exposure to a hydroxide containing solution (e.g., ammonium hydroxide), deionized water, and/or other suitable etchant solutions. Subsequently, a dielectric material is deposited into the gate trenches, followed by a planarization process to remove excess portions of the dielectric material. The remaining dielectric material forms the isolation lines 212**.

In some embodiments, the deposition of the dielectric material of the isolation lines 212 is performed using a conformal deposition process such as ALD, which may be PEALD, thermal ALD, or the like. The dielectric material may be formed of or comprise $SiO_2$, SiOC, SiOCN, or the like, or combinations thereof. In some embodiments, the isolation line 212 may be made of a nitride-based material, such as $Si_3N_4$, or a carbon-based material, such as SiOCN, or combinations thereof. In some embodiments, the isolation line 212 may be made of a material having a dielectric constant greater than about 9 (e.g., high dielectric constant (high-k) material). For example, the isolation line 212 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The isolation lines 212 may be formed of a homogenous material, or may have a composite structure including more than one layer. The isolation lines 212 may include dielectric liners, which may be formed of, for example, silicon oxide. In some embodiments, the dielectric material of the isolation lines 212 comprises SiN, and the deposition is performed using process gases including dichlorosilane and ammonia. Hydrogen (H2) may or may not be added.

Figure 16A:
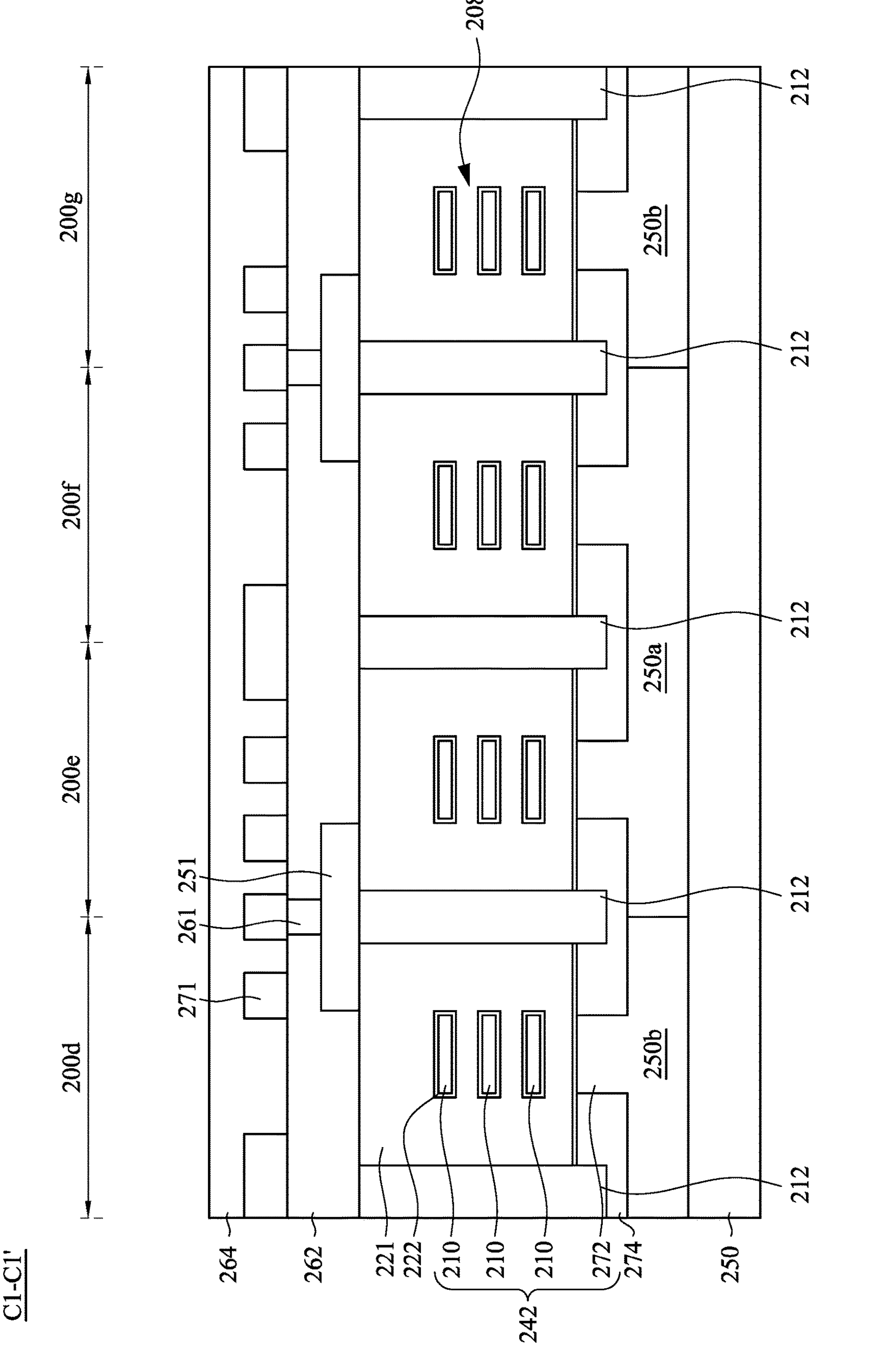
Figure 16B:
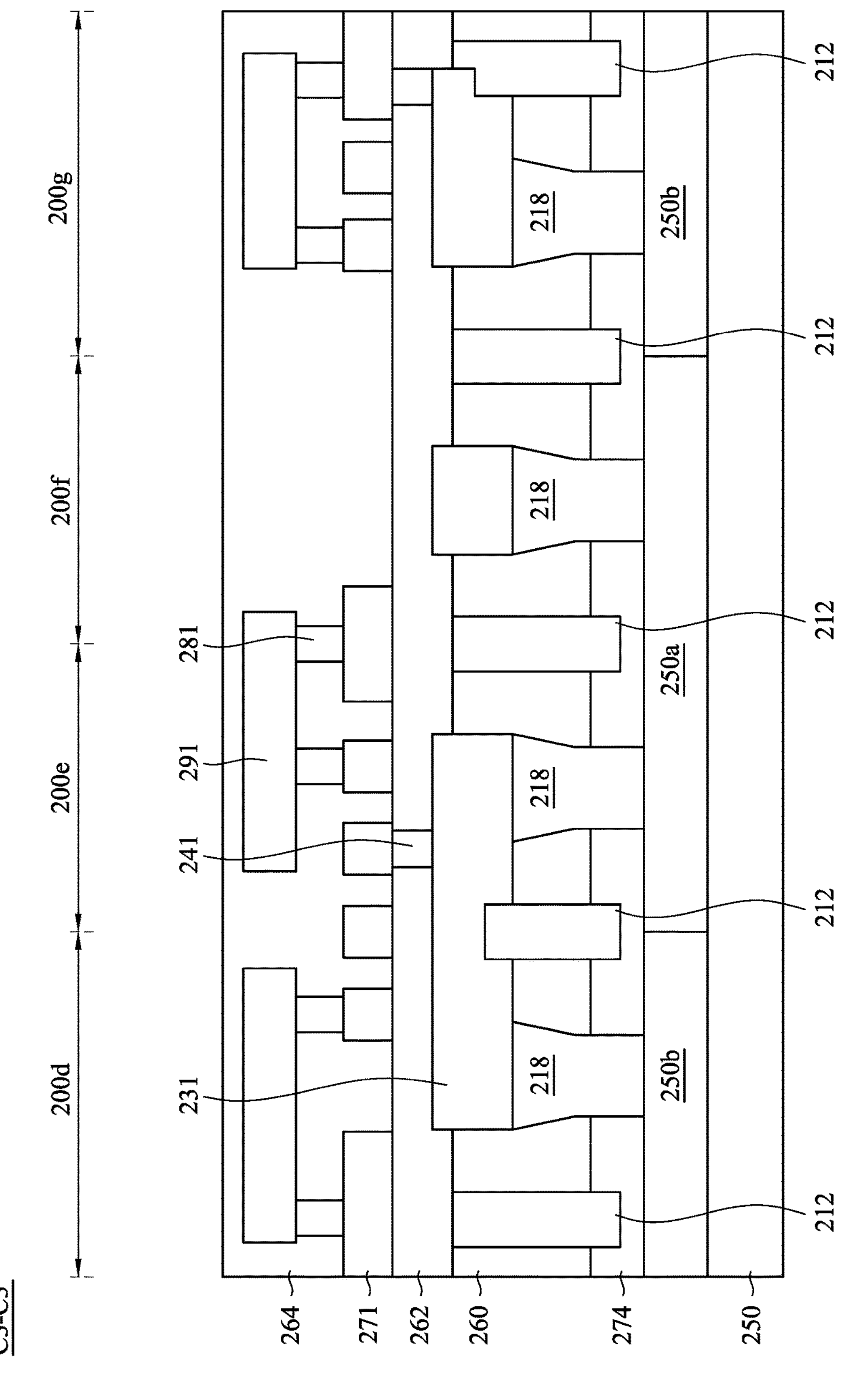
Figure 16C:
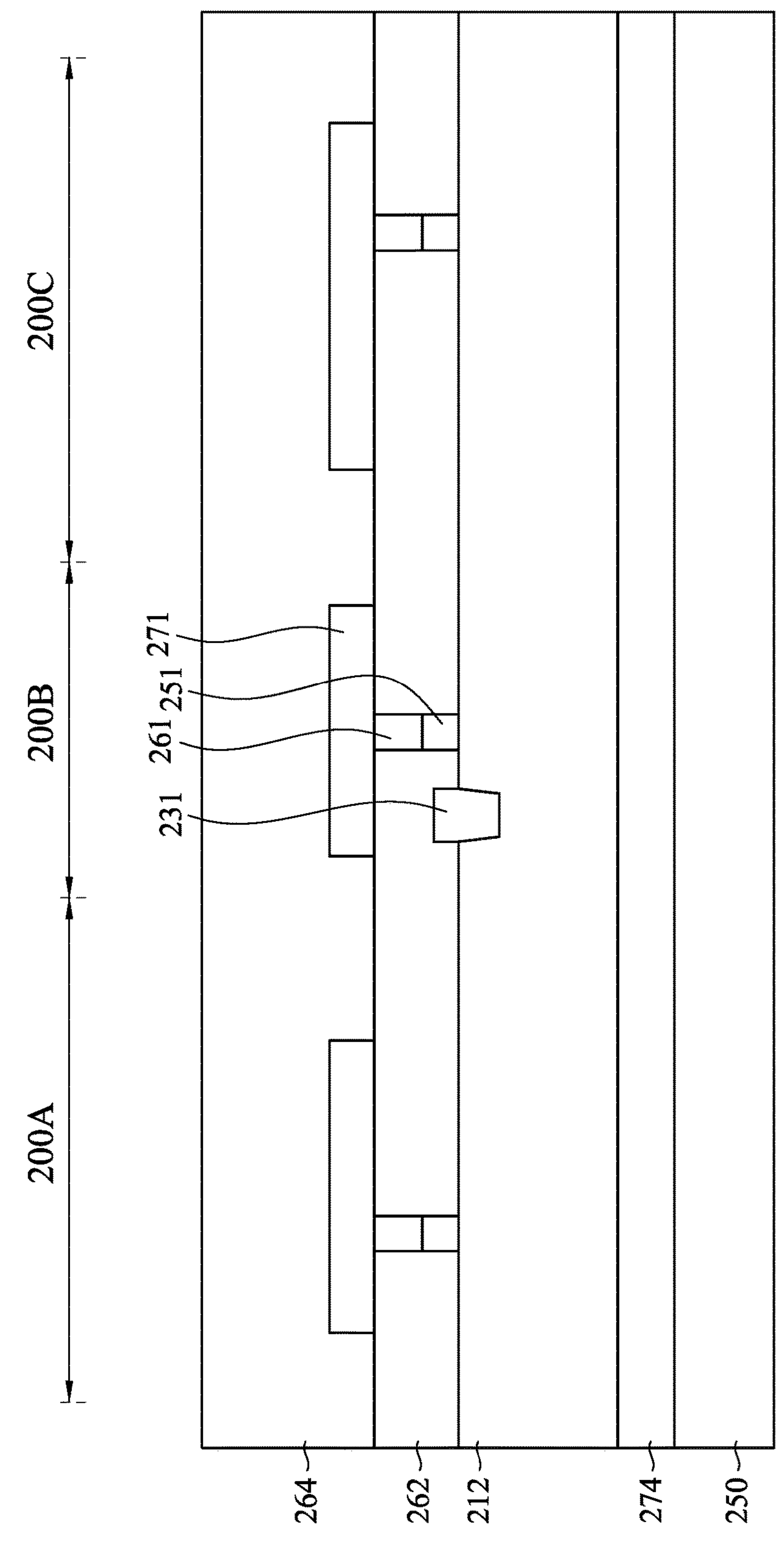

Reference is made to FIGS. 16A, 16B, and 16C. An ILD layer 262 is deposited over the gate electrode 221, the gate dielectric layer 222, the isolation lines 212, and the ILD layer 260 in sequence. In FIGS. 16A and 16C, the gate contacts 251 and the gate vias 261 are formed in the ILD layer 262. As shown in FIG. 16A, the gate contact 251 extends across the isolation line 212. The gate via 261 is formed on the gate contact 251 and overlaps the isolation line 212. In FIGS. 16B and 16C, the source/drain contact 231 is formed in the ILD layers 260 and 262 to land on the source/drain regions 218 and further inlaid in the isolation line 212 (see FIG. 16C). The source/drain vias 241 is formed in an ILD layer 262 to land on the source/drain contact 231. In some embodiments, the source/drain contact 231, the source/drain via 241, and/or the gate contact 251, and the gate via 261 may include a metal-containing material such as titanium, titanium nitride, titanium oxide, tungsten, cobalt, ruthenium, rhodium, aluminum, copper, platinum combinations thereof, multi-layers thereof, or the like. The ILD layer 260 and/or the ILD layer 262 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Subsequently, an interconnect structure is formed over the gate via 261 and the source/drain via 241. The interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The interconnect structure may include conductive lines 271 in a first metallization layer that is in an IMD layer 264 formed over the ILD layer 262. In FIG. 16A, a corresponding one of the conductive lines 271 is electrically connected to the gate electrodes 221 through the gate vias 261 and the gate contact 251. In FIG. 16B, a corresponding one of the conductive lines 271 overlaps and are electrically connected to the source/drain contacts 231 through the source/drain vias 241. The interconnect structure further includes conductive vias 281 (see FIG. 16B). In some embodiments, the conductive vias 281 are connected between the first metallization layer and a second metallization layer over the first metallization layer. The interconnect structure may further include conductive lines 291 in a second metallization that is in the IMD layer 264. The conductive lines 291 overlap and are electrically connected to the underlying conductive lines 271 through the conductive vias 281. In some embodiments, the IMD layer 264 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. In some embodiments, materials of the conductive lines 271 and 291 and conductive vias 281 may include Cu, Co, Ru, Pt, Al, W, Ti, TaN, TiN, or any combinations thereof.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a layout with all the adjacent gate electrodes are spaced apart by an isolation line. In some embodiments, the isolation line is able to be formed based on a layout pattern having a rectangle shape. Accordingly, the non-regular patterns are able to be omitted. As a result, the uniformity and/or the matching of the gate electrodes are improved.

In some embodiments, a method includes doping a substrate to form a first well region and a second well region having a different conductivity type than the first well region; forming a first fin structure upwardly extending above the first well region and a second fin structure upwardly extending above the second well region; forming a first gate electrode surrounding the first fin structure and a second gate electrode surrounding the second fin structure; forming first source/drain regions adjoining the first fin structure and on opposite sides of the first gate electrode and second source/drain regions adjoining the second fin structure on opposite sides of the second gate electrode; forming an isolation line interposing the first and second gate electrodes and laterally between a first one of the first source/drain regions and a first one of the second source/drain regions. In some embodiments, the isolation line is further laterally between a second one of the first source/drain regions and a second one of the second source/drain regions. In some embodiments, the method further includes forming a third gate electrode surrounding the first fin structure and a fourth gate electrode surrounding the second fin structure, the isolation line further interposing the third and fourth gate electrodes. In some embodiments, the method further includes forming a first dielectric-base dummy gate on the first well region and a second dielectric-base dummy gate on the second well region, the isolation line further interposing the first and second dielectric-base dummy gates. In some embodiments, the isolation line has a top surface level with top surfaces of the first and second gate electrodes. In some embodiments, the method further includes forming a gate contact extending from the first gate electrode across the isolation line to the second gate electrode. In some embodiments, the method further includes forming a gate via on the gate contact and overlapping the isolation line. In some embodiments, the method further includes forming a source/drain contact extending from the first one of the first source/drain regions across the isolation line to the first one of the second source/drain regions. In some embodiments, the method further includes forming a shallow trench isolation (STI) structure laterally surrounding lower portions of the first and second fin structures, the isolation line having a bottom end inlaid in the STI structure. In some embodiments, the method further includes forming a shallow trench isolation (STI) structure laterally surrounding lower portions of the first and second fin structures, the isolation line having a bottom end downwardly extending through the STI structure and in contact with the first and second well regions.

In some embodiments, a method includes forming a first fin structure of a first circuit and a second fin structure of a second circuit upwardly extending above a substrate; forming a first gate electrode surrounding the first fin structure and a second gate electrode surrounding the second fin structure; forming first source/drain regions adjoining the first fin structure and on opposite sides of the first gate electrode and second source/drain regions adjoining the second fin structure on opposite sides of the second gate electrode from a cross sectional view; forming a dielectric line extending past and contacting longitudinal ends of the first and second gate electrodes from a top view. In some embodiments, the first circuit is one of an NAND circuit, an inverter circuit, and an NOR circuit, and the second circuit is another one of the NAND circuit, the inverter circuit, and the NOR circuit. In some embodiments, the method further includes forming a third fin structure of the first circuit upwardly extending above the substrate; forming a third gate electrode surrounding the third fin structure, wherein the dielectric line interposes the longitudinal end of the first electrode and a longitudinal end of the third gate electrode from the top view. In some embodiments, the method further includes forming a third fin structure of a third circuit upwardly extending above the substrate; forming a third gate electrode surrounding the third fin structure; forming third source/drain regions adjoining the third fin structure and on opposite sides of the third gate electrode from the cross sectional view, wherein the dielectric line extends past and contacts a longitudinal end of the third gate electrode from the top view. In some embodiments, the method further includes forming a dielectric-base dummy gate on the substrate and in parallel with the first gate electrode, wherein the dielectric line extends past and contacts a longitudinal end of the dielectric-base dummy gate from the top view. In some embodiments, the dielectric-base dummy gate is laterally between the first and second gate electrodes. In some embodiments, the first gate electrode is laterally between the second gate electrode and the dielectric-base dummy gate.

In some embodiments, a semiconductor structure includes a substrate, a p-type transistor, an n-type transistor, a dielectric strip, and a gate contact. The p-type transistor is on the substrate and includes first source/drain regions above the substrate, a plurality of first channel layers extending in a first direction between the first source/drain regions and arranged in a second direction substantially perpendicular to a top surface of the substrate, and a first gate electrode extending along a third direction and surrounding each of the first channel layers. The n-type transistor is on the substrate and includes second source/drain regions above the substrate, a plurality of second channel layers extending in the first direction between the second source/drain regions and arranged in the second direction substantially perpendicular to the top surface of the substrate, and a second gate electrode extending along the third direction and surrounding each of the second channel layers. The dielectric strip extends between the p-type and n-type transistors from a top view. The gate contact extends from the first gate electrode across the dielectric strip to the second gate electrode from the top view. In some embodiments, the gate contact is in contact with the dielectric strip. In some embodiments, the semiconductor structure further includes a gate via on the gate contact and overlapping the dielectric strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   doping a substrate to form a first well region and a second well region having a different conductivity type than the first well region;
   forming a first fin structure upwardly extending above the first well region and a second fin structure upwardly extending above the second well region;
   forming an isolation region between the first fin structure and the second fin structure;
   forming a first gate electrode surrounding the first fin structure and a second gate electrode surrounding the second fin structure;
   forming first source/drain regions adjoining the first fin structure and on opposite sides of the first gate electrode and second source/drain regions adjoining the second fin structure on opposite sides of the second gate electrode; and
   forming an isolation line interposing the first gate electrode and the second gate electrode and laterally between a first one of the first source/drain regions and a first one of the second source/drain regions, the isolation line extending toward the substrate to a depth at least as deep as a depth of a bottommost surface of the isolation region, a bottommost surface of the isolation line overlying an interface between the first well region and the second well region, wherein forming the isolation line comprises, in a same deposition operation, depositing a dielectric material of the isolation line between the first gate electrode and the second gate electrode and between the first one of the first source/drain regions and the first one of the second source/drain regions.

2. The method of claim 1, wherein the isolation line is further laterally between a second one of the first source/drain regions and a second one of the second source/drain regions.

3. The method of claim 1, further comprising:
   forming a third gate electrode surrounding the first fin structure and a fourth gate electrode surrounding the second fin structure, the isolation line further interposing the third gate electrode and the fourth gate electrode.

4. The method of claim 1, further comprising:
   forming a first dielectric-base dummy gate on the first well region and a second dielectric-base dummy gate on the second well region, the isolation line further interposing the first dielectric-base dummy gate and the second dielectric-base dummy gate.

5. The method of claim 1, wherein the isolation line has a top surface level with top surfaces of the first gate electrode and the second gate electrode.

6. The method of claim 1, further comprising:
   forming a gate contact extending from the first gate electrode across the isolation line to the second gate electrode.

7. The method of claim 6, further comprising:
   forming a gate via on the gate contact and overlapping the isolation line.

8. The method of claim 1, further comprising:
   forming a source/drain contact extending from the first one of the first source/drain regions across the isolation line to the first one of the second source/drain regions.

9. The method of claim 1, wherein forming the isolation region comprises:
   forming a shallow trench isolation (STI) structure laterally surrounding lower portions of the first fin structure and the second fin structure.

10. The method of claim 1, wherein forming the isolation region comprises:
   forming a shallow trench isolation (STI) structure laterally surrounding lower portions of the first fin structure and the second fin structure, the isolation line having a bottom end downwardly extending through the STI structure and having the bottommost surface contiguous with an upper surface of the first well region and an upper surface of the second well region.

11. A method, comprising:
   forming a first fin structure of a first circuit and a second fin structure of a second circuit upwardly extending above a substrate, the first fin structure positioned adjacent the second fin structure along a first direction;
   forming a first gate electrode surrounding the first fin structure and a second gate electrode surrounding the second fin structure, the first gate electrode positioned adjacent the second gate electrode along the first direction;
   forming first source/drain regions adjoining the first fin structure and on opposite sides of the first gate electrode along a second direction different than the first direction and second source/drain regions adjoining the second fin structure and on opposite sides of the second gate electrode along the second direction from a cross sectional view;
   forming a first dielectric line isolating the first gate electrode from the second gate electrode along the first direction, the first dielectric line extending lengthwise along the second direction, the first dielectric line overlying a cell boundary between the first circuit and the second circuit, the first dielectric line having:
      a first portion extending between the first gate electrode and the second gate electrode along the first direction, the first portion contacting a first longitudinal end of the first gate electrode and a second longitudinal end of the second gate electrode from a top view; and
      a second portion extending between one of the first source/drain regions and one of the second source/drain regions along the first direction, the second portion adjacent the first portion along the second direction;
      wherein the first portion has a first upper surface at a first elevation relative to an upper surface of the first gate electrode, and a first lower surface at a second elevation relative to an upper surface of a first well region in the substrate under the first fin structure;
      wherein the second portion has a second upper surface at a third elevation different than the first elevation, and a second lower surface at a fourth elevation; and
   forming a second dielectric line in the first circuit and offset from the first dielectric line along the first direction, the second dielectric line extending lengthwise along the second direction, an upper surface of the second dielectric line being at the first elevation.

12. The method of claim 11, wherein the first circuit is one of an NAND circuit, an inverter circuit, and an NOR circuit, and the second circuit is another one of the NAND circuit, the inverter circuit, and the NOR circuit.

13. The method of claim 11, further comprising:

forming a third fin structure of the first circuit upwardly extending above the substrate; and forming a third gate electrode surrounding the third fin structure, wherein the dielectric line interposes the longitudinal end of the first gate electrode and a longitudinal end of the third gate electrode from the top view.

14. The method of claim 11, further comprising:

forming a third fin structure of a third circuit upwardly extending above the substrate;

forming a third gate electrode surrounding the third fin structure; and forming third source/drain regions adjoining the third fin structure and on opposite sides of the third gate electrode from the cross sectional view, wherein the dielectric line extends past and contacts a longitudinal end of the third gate electrode from the top view.

15. The method of claim 11, further comprising:

forming a dielectric-base dummy gate on the substrate and in parallel with the first gate electrode, wherein the dielectric line extends past and contacts a longitudinal end of the dielectric-base dummy gate from the top view.

16. The method of claim 15, wherein the dielectric-base dummy gate is laterally between the first gate electrode and the second gate electrode.

17. The method of claim 15, wherein the first gate electrode is laterally between the second gate electrode and the dielectric-base dummy gate.

18. A method, comprising:

forming a p-type transistor on a substrate, comprising:

forming a first stack comprising a first channel layer and a second channel layer arranged over a first fin in a first direction substantially perpendicular to a top surface of the substrate;

forming a first gate electrode extending along a second direction and wrapping around the first channel layer; and forming first source/drain regions above the substrate, wherein the first channel layer and the second channel layer extend in a third direction between the first source/drain regions;

forming an n-type transistor on the substrate, comprising:

forming a second stack comprising a third channel layer and a fourth channel layer arranged over a second fin in the first direction substantially perpendicular to the top surface of the substrate;

forming a second gate electrode extending along the second direction and wrapping around the third channel layer; and forming second source/drain regions above the substrate, wherein the third channel layer and the fourth channel layer extend in the third direction between the second source/drain regions;

forming an isolation region extending along the second direction between the first fin and the second fin;

forming a dielectric strip extending between the p-type transistor and the n-type transistor from a top view, the dielectric strip extending toward the substrate to a depth at least as deep as depth of a bottommost surface of the isolation region; and forming a gate contact extending from the first gate electrode across the dielectric strip to the second gate electrode from the top view.

19. The method of claim 18, wherein forming the gate contact comprises forming the gate contact to contact with the dielectric strip.

20. The method of claim 18, further comprising:

forming a gate via on the gate contact and overlapping the dielectric strip.

* * * * *